United States Patent
Hidaka

(10) Patent No.: US 6,449,199 B2
(45) Date of Patent: Sep. 10, 2002

(54) SEMICONDUCTOR MEMORY DEVICE WITH IMPROVED FLEXIBLE REDUNDANCY SCHEME

(75) Inventor: Hideto Hidaka, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/798,944

(22) Filed: Mar. 6, 2001

Related U.S. Application Data

(62) Division of application No. 09/251,352, filed on Feb. 17, 1999, now Pat. No. 6,233,181.

(30) Foreign Application Priority Data

Jun. 9, 1998 (JP) ............................................. 10-160466
Oct. 15, 1998 (JP) ............................................. 10-293421

(51) Int. Cl.$^7$ ................................................ G11C 7/00
(52) U.S. Cl. .................. 365/200; 365/201; 365/230.03
(58) Field of Search ................................ 365/200, 201, 365/222, 230.03, 230.04

(56) References Cited

U.S. PATENT DOCUMENTS

| | | | | |
|---|---|---|---|---|
| 5,661,689 A | * | 8/1997 | Shinkai | 365/200 |
| 5,671,185 A | * | 9/1997 | Chen et al. | 365/200 |
| 5,712,821 A | * | 1/1998 | Ryu et al. | 365/200 |
| 5,761,138 A | | 6/1998 | Lee et al. | 365/200 |
| 5,892,718 A | | 4/1999 | Yamada | 365/200 |

FOREIGN PATENT DOCUMENTS

| | | | |
|---|---|---|---|
| JP | 6-232348 | 8/1994 | H01L/27/04 |
| JP | 6-237164 | 8/1994 | H03K/19/0948 |

OTHER PUBLICATIONS

"A Flexible Redundancy Technique for High–Density DRAM's," by Horiguchi et al., IEEE Journal of Solid State Circuits, vol. 26, No. 1 (Jan. 1991), pp. 12–17.

"Ultra LSI Memory," by Kiyoo Ito, Advanced Electronics Series I–9, published by BAIFUKAN (Nov. 5, 1994), pp. 350–371.

* cited by examiner

*Primary Examiner*—Andrew Q. Tran
(74) *Attorney, Agent, or Firm*—McDermott, Will & Emery

(57) ABSTRACT

A spare memory array having spare memory cells common to a plurality of normal sub-arrays having a plurality of normal memory cells is provided. A spare line in the spare array can replace a defective line in the plurality of normal sub-array. The defective line is efficiently repaired by replacement in an array divided into blocks or sub-arrays.

3 Claims, 31 Drawing Sheets

F I G. 2A
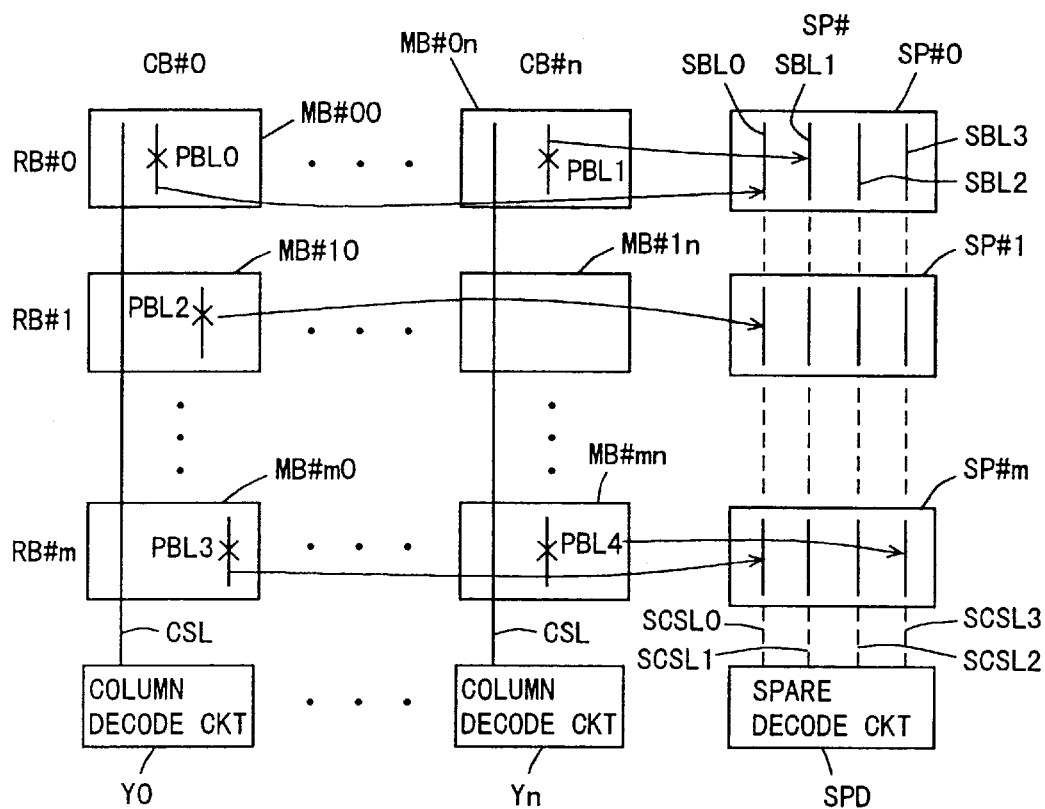
F I G. 2B
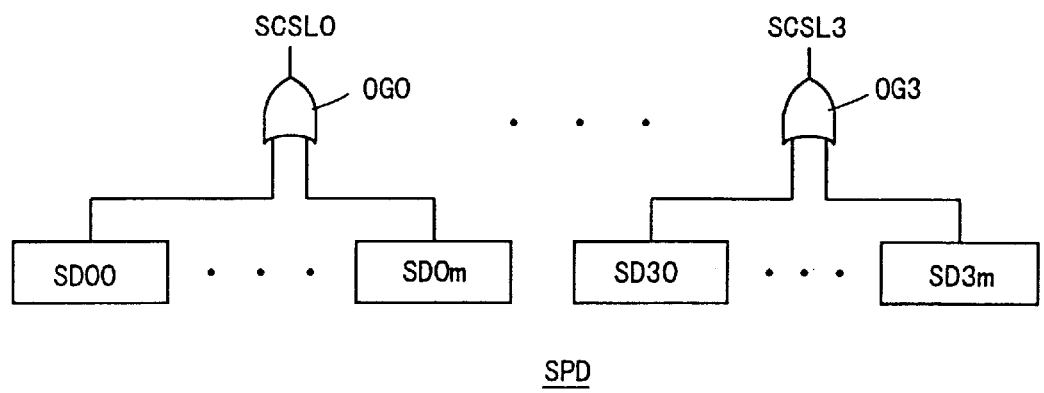

| X0 | NORMAL MEMORY SUB-ARRAY | MA#0 } RBX#0 |
| SPDX | SPARE ARRAY | SPX# |
| X1 | NORMAL MEMORY SUB-ARRAY | MA#1 ; RBX#1 |
| X2 | NORMAL MEMORY SUB-ARRAY | MA#2 ; RBX#2 |
| ⋮ | ⋮ | |
| Xm | NORMAL MEMORY SUB-ARRAY | MA#m ; RBX#m |

IN NORMAL MODE;

IN TEST MODE;

FIG. 20

FIG. 22
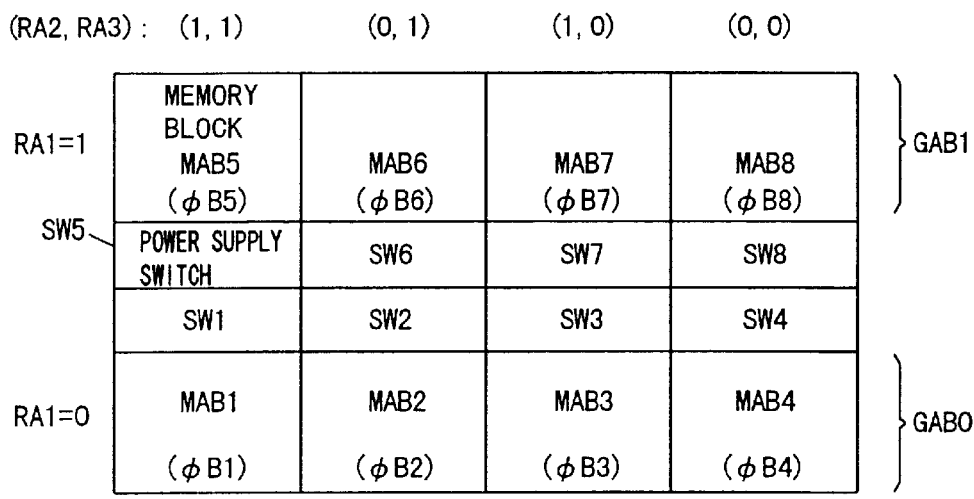
FIG. 23A
FIG. 23B
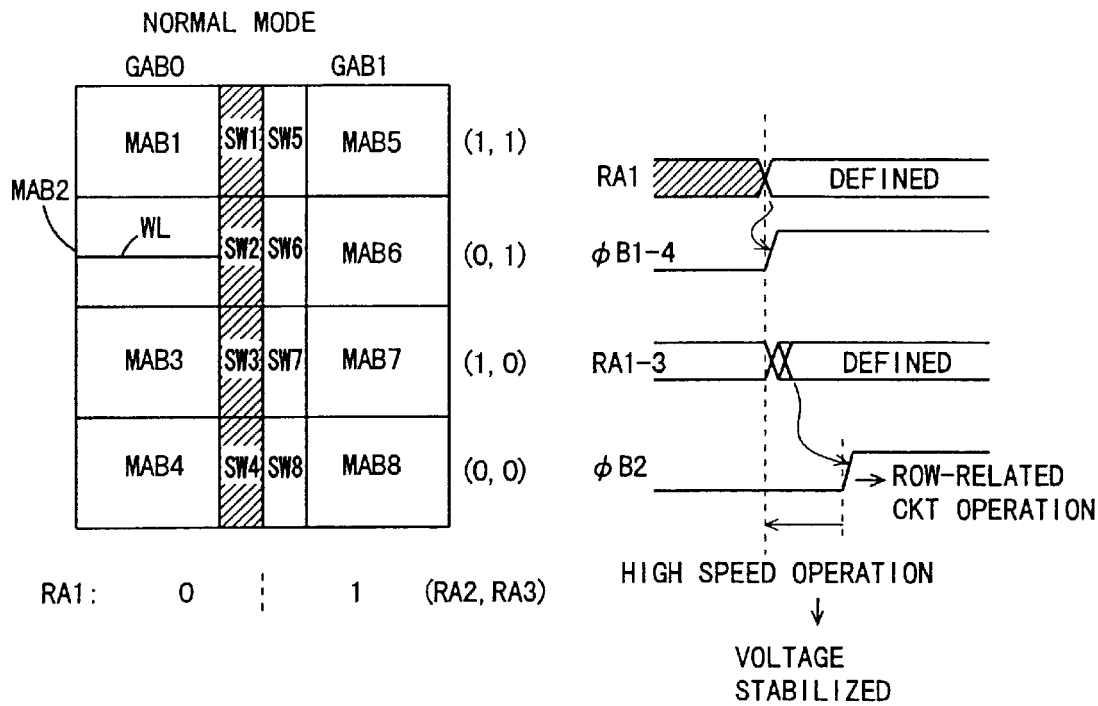

: NORMAL MODE

: REFRESH MODE

: REFRESH MODE
SPARE DETERMINATION → SW SELECTION

: BEFORE SPARE DETERMINATION DEFINED
  NORMAL MODE

: AFTER SPARE DETERMINATION DEFINED
  NORMAL MODE (PRESENT CYCLE OR PREVIOUS CYCLE)
"L" IN STAND-BY STATE (PRESENT CYCLE OR PREVIOUS CYCLE)

SEMICONDUCTOR MEMORY DEVICE WITH IMPROVED FLEXIBLE REDUNDANCY SCHEME

This application is a Divisional of application Ser. No. 09/251,352, filed Feb. 17, 1999, now U.S. Pat. No. 6,233,181.

BACKGROUND OF THE INVENTION

1. Field of the Invention

The present invention relates generally to semiconductor memory devices, and more particularly, to a semiconductor memory device having a memory array divided into a plurality of memory blocks. More specifically, the present invention relates to a redundancy circuit for repairing a defective memory cell in a semiconductor memory device having such an array-divided arrangement and a power supply circuit provided corresponding to each block.

2. Description of the Background Art

In the semiconductor memory device, a defective memory cell is replaced with a spare memory cell in order to equivalently repair the defective memory cell to raise the yield of the products. A flexible redundancy scheme has been proposed in order to improve the use efficiencies of spare lines (word lines or bit lines) and spare decoders for selecting spare lines in a redundancy circuit configuration including spare memory cells (spare word lines and bit lines) for repairing such defective memory cells (see, for example, "A Flexible Redundancy Technique for High-Density DRAM's", Horiguchi et al., IEEE Journal of Solid-State Circuits, Vol. 26, No. 1, January 1991, pp. 12 to 17).

FIG. 53 is a schematic diagram of the general configuration of a semiconductor memory device having a conventional flexible redundancy scheme. In FIG. 53, the semiconductor memory device includes four memory arrays MA0 to MA3. In each of memory arrays MA0 to MA3, a spare word line to repair a defective memory cell row is provided. In memory array MA0, spare word lines SW00 and SW01 are provided, and in memory array MA1, spare word lines SW10 and SW11 are provided. In memory array MA2, spare word line SW20 and SW21 are provided, and in memory array MA3, spare word lines SW30 and SW31 are provided.

Row decoders X0 to X3 each for decoding an address signal to drive a normal word line provided corresponding to an addressed row into a selected state are provided corresponding to memory arrays MA0 to MA3. A column decoder Y0 is provided between memory arrays MA0 and MA1 to decode a column address signal to select an addressed column, and also a column decoder Y1 is provided between memory arrays MA2 and MA3.

The semiconductor memory device further includes spare decoders SD0 to SD3 to store a row address at which a defective memory cell is present, maintain a word line (defective normal word line) corresponding to this defective row address in a non-selected state when the defective row is addressed and drive a corresponding spare word line into a selected state, an OR circuit G0 to receive output signals from spare decoders SD0 and SD1, and an OR circuit G1 to receive output signals from spare decoders SD2 and SD3.

The output signals of OR circuits G0 and G1 are provided in common to spare word line driving circuits included in row decoders X0 to X3. Spare decoders SD0 to SD3 are commonly provided with array address signal bits an-2 and an-1 to address one of memory arrays MA0 to MA3 and with intra-array address signals bits a0 to an-3 to address a row in the memory array. Row decoders X0 to X3 are provided with array address signal bits an-2 and an-1, and a row decoder is activated when a corresponding memory array is addressed. OR circuits G0 and G1 each correspond to two spare word lines provided for each of memory arrays MA0 to MA3.

Let us assume that normal word lines W0 and W1 are defective in memory array MA0, that a normal word line W2 in memory array MA1 is defective, and that a normal word line W3 in memory array MA2 is defective. In this state, the address of word line W0 is programmed in spare decoder SD0, while the address of word line W1 is programmed in spare decoder SD2. The address of normal word line W2 is programmed in spare decoder SD3, and the address of normal word line W3 is programmed in spare decoder SD1.

OR circuit G0 selects one of spare word lines SW00, SW10, SW20 and SW30, and the output signal of OR circuit G1 selects one of spare word lines SW1, SW11, SW21 and SW31.

When normal word line W0 is addressed, the output signal of spare decoder SD0 is driven into a selected state, and the output of OR circuit G0 is activated. In this state, array address signal bits an-2 and an-1 activate row decoder X0, and the remaining row decoders X1 to X3 are maintained in a non-active state. Thus, a word line driving circuit included in row decoder X0 drives spare word line SW00 into a selected state in response to the output signal of OR circuit G0. At this time, in row decoder X0, a decode circuit provided corresponding to normal word line W0 is maintained in a non-active state. As a result, defective normal word line W0 is replaced with spare word line SW00.

If defective normal word line W1 is addressed, the output signal of spare decoder SD2 attains an H level in a selected state, the output signal of OR circuit G1 attains an H level, and spare word line SW01 is selected. If defective normal word line W2 is addressed, the output signal of spare decoder SD3 attains an H level in a selected state, the output signal of OR circuit G1 attains an H level, and spare word line SW11 is selected. If defective normal word line W3 is addressed, the output signal of spare decoder SD1 attains an H level in a selected state, and spare word line SW20 is selected by OR circuit G0 accordingly. More specifically, defective normal word lines W0, W1, W2 and W3 are replaced with spare word lines SW00, SW01, SW11 and SW20, respectively.

In this flexible redundancy scheme shown in FIG. 53, a single spare word line can be activated by any of a plurality of spare decoders. For example, spare word line SW20 can be driven into a selected state by spare decoder SD0 or SD1. A single spare decoder can drive any of a plurality of spare word line into a selected state. For example, spare decoder SD0 can drive any of spare word lines SW00, SW10, SW20 and SW30 into a selected state. Thus, the spare word line and spare decoders do not correspond in one-to-one relation, and therefore the spare word lines and spare decoders can be more efficiently utilized. The number of spare word lines and the number of spare row decoders in a single memory array may be selected independently from each other as long as the numbers satisfy the following relation:

$$L \leq R \leq M \cdot L/m$$

wherein M is the number of physical memory arrays, m the number of memory arrays whose defective normal word lines are replaced with spare word lines simultaneously, R the number of spare row decoders, and L the number of spare word lines in a single memory array. More specifically, M/m is the number of memory arrays which are logically independent from one another. As a result, M·L/m represents the number of spare word lines which are logically independent from one another for the entire memory. Herein, the logically independent spare word lines are spare word lines selected by different row addresses. For example, in FIG. 53, if a normal word line is simultaneously selected in memory arrays MA0 and MA2, memory arrays MA0 and MA2 are not logically independent from each other. In the arrangement shown in FIG. 53, L=2, R=4, M=4 and m=1.

By providing a spare row decoder common to memory arrays, a spare decoder does not have to be provided for each of spare word lines, which can restrain the chip area from increasing.

The flexible redundancy scheme shown in FIG. 53 may be employed for repairing a defective column as well. In repairing a defective column, the previously mentioned prior art document describes a method of repairing a defective column where a memory array is divided into a plurality of sub-arrays. The document particularly describes the way of repairing a defective column in multi-divided bit lines in a shared-sense amplifier arrangement and in a shared I/O scheme.

FIG. 54 is a schematic diagram of the configuration of an array portion in a semiconductor memory device according to a conventional flexible redundancy scheme. In FIG. 54, two memory blocks MBi and MBi+1 are shown. Memory blocks MBi and MBi+1 each include a normal bit line pair BL and /BL provided corresponding to each memory cell column and a spare bit line (spare column) for repairing a defective column. In FIG. 54, the spare bit line included in the spare column is not clearly shown.

Normal bit lines BL and /BL at the same column address in memory blocks MBi and MBi+1 share a sense amplifier SA. A bit line isolation gate ILG is provided between sense amplifier SA and memory blocks MBi and MBi+1 Sense amplifier SA is connected to an internal data line pair I/O through an IO gate IOG which conducts in response to a column selecting signal YS from column decoder Y. A memory block including a selected memory cell (MBi, for example) is connected to sense amplifier SA and data is read out therefrom. In this case, a non-selected memory block (MBi+1) is disconnected from sense amplifier SA.

In the above-described shared-sense amplifier arrangement, a defective column address must be programmed for each of defects in normal bit lines, in a single memory block column selecting lines (YS lines) and sense amplifiers SA. For a normal bit line defect, the defective column address is programmed on a memory block basis. For a sense amplifier defect, the defective column address is so programmed as to use a spare column for each of memory blocks MBi and MBi+1 which share this defective sense amplifier. For a column selecting line (YS line) defect, the defective column address is programmed for each of the memory blocks connected to this column selecting line (YS line).

At the time of programming, in order to use a single spare column decoder for a normal bit line defect, a sense amplifier defect and a column selecting line (YS line) defect, "Don't care" is programmed at the time of programming a defective column address, an address to specify a memory block is invalidated, and spare columns are replaced simultaneously in a plurality of memory blocks.

In the previously mentioned document, a defective row is repaired by replacing the defective row with a spare word line provided within a memory array including that defective row. Thus, a spare word line must be provided for each of memory arrays, and the spare word lines are not efficiently utilized. If a defective normal word line in one memory array is replaced with a spare word line in another memory array, the control of the memory array related circuits will be complicated, and therefore such arrangement must be avoided and is not considered at all.

In repairing a defective column, a spare column is provided for each of memory blocks, and spare columns are similarly not efficiently used. Although the shared I/O scheme has been considered for internal data line arrangement, the way to repair a defective column in a memory array having a local/global hierarchical data line arrangement used in a recent block-divided arrangement has never been considered.

Meanwhile, in a conventional CMOS (Complimentary MOS) type semiconductor device, the size of components (MOS transistor: insulated gate type field effect transistor) is reduced to increase the integration density. In order to secure the reliability of the components thus miniaturized and to reduce the current consumed by the entire device, the power supply voltage is reduced. In order to allow the components to operate at a high speed, the threshold voltage of the MOS transistor must be lowered depending upon the power supply voltage. This is because if the ratio of the threshold voltage to the power supply voltage is large, the transition timing of the MOS transistor to the on state is delayed. If, however, the absolute value of the threshold voltage is lowered, sub-threshold leakage current to flow through the source-drain region when the MOS transistor is turned off increases. This is for the following reason. The threshold voltage is defined as the gate-source voltage to allow a prescribed drain current to flow. In an n-channel MOS transistor, if the threshold voltage is lowered, the drain current-gate voltage characteristic curve shifts toward the negative direction. The sub-threshold current is represented by the current value when gate voltage Vgs in the characteristic curve is 0V, and therefore the sub-threshold current increases as the threshold voltage is lowered.

When the semiconductor device operates, the ambient temperature increases, and the absolute value of the threshold voltage of the MOS transistor is lowered, resulting in more serious sub-threshold current leakage. When this sub-threshold leakage current increases, the DC current of the entire large scale integrated circuit increases, and particularly in a dynamic type semiconductor memory device, the stand-by current (current consumed in a stand-by state) increases.

In order to reduce the sub-threshold leakage current, a multi-threshold-voltage CMOS arrangement is employed.

FIG. 55 is a diagram showing a conventional multi-threshold-voltage CMOS arrangement by way of illustration. In FIG. 55, there are provided a main power supply line 902 transmitting a power supply voltage Vcc, a sub-power supply line 904 coupled to main power supply line 902 through a p-channel MOS transistor 903, a main ground line 906 transmitting a ground voltage Vss, and a sub-ground line 908 coupled to main ground line 906 through an n-channel MOS transistor 907. MOS transistor 903 conducts when an activation signal /φACT is at an L level, while MOS transistor 907 conducts when an activation signal φACT is at an H level. MOS transistors 903 and 907 each have a relatively high threshold voltage (high-Vth). The internal circuit operates, with a voltage from one of power supply lines 902 and 904 and a voltage from one of ground lines 906 and 908 used as both operation power supply voltages. In FIG. 55, as the internal circuit, three-stage, cascaded inverter circuits 914a, 914b and 914c are shown. Inverter circuit 914a includes a p-channel MOS transistor PQ having a source coupled to main power supply line 902, and an n-channel MOS transistor NQ having a source coupled to ground line 908. An input signal IN is provided in common to the gates of MOS transistors PQ and NQ. Input signal IN is set to an L level in a stand-by cycle.

Inverter circuit 914b operates using voltages on sub-power supply line 904 and main ground line 906 as both operation power supply voltages. Inverter circuit 914c operates with voltages on main power supply line 902 and sub-ground line 908 as both operation power supply voltages. MOS transistors PQ and NQ in each of these inverter circuits 914a to 914c have the absolute values of the threshold voltages set sufficiently small (low-Vth). The operation of the circuit shown in FIG. 55 will be now described with reference to FIG. 56.

In a stand-by cycle, input signal IN is set to an L level. Control signal φACT is at an L level, and control signal /φACT is at an H level (Vcc level). In inverter circuit 914b, MOS transistor PQ turns on, the source and drain thereof are at the same voltage level, and therefore no current is allowed to flow. Meanwhile, MOS transistor NQ is provided with input signal IN at the ground voltage level at its gate and is in an off state. However, the sub threshold leakage current allowed to flow through MOS transistor 907 in an off state is sufficiently reduced, because the threshold voltage of the transistor 907 is high. As a result, the sub-threshold current is reduced even if the threshold voltage of MOS transistor NQ is small. The sub-threshold current allowed to flow through MOS transistor 907 causes the voltage level on sub-ground line 908 to be higher than the ground voltage level, so that the gate-source region of MOS transistor NQ in inverter circuit 914a is set to a reverse bias state, and its sub-threshold current is further reduced.

In inverter circuit 914b, the input signal is at an H level, and MOS transistor NQ is turned on, the source and drain thereof are at the same voltage level and therefore no sub threshold leakage current is generated. Meanwhile, p-channel MOS transistor PQ is provided with a signal at power supply voltage Vcc level at its gate to allow sub-threshold leakage current to flow. However, since MOS transistor 903 is in an off state and MOS transistor 903 is a high-Vth transistor, the sub-threshold leakage current is sufficiently restrained. Thus, the sub-threshold leakage current in inverter circuit 914b is restrained. The sub-threshold leakage current of MOS transistor 903 causes the voltage level of sub-power supply line 904 to be lower than power supply voltage Vcc, and the gate-source region of MOS transistor PQ is reversedly biased in inverter circuit 914b, the sub-threshold leakage current of which is further restrained. Similarly to inverter circuit 914a, the sub-threshold leakage current is restrained in inverter circuit 914c.

When an active cycle is started, control signal φACT attains an H level, control signal /φACT attains an L level, MOS transistors 903 and 907 are turned on, sub-power supply line 904 is coupled to main power supply line 902, and sub-ground line 908 is coupled to main ground line 906. Thus, these inverter circuits 914a to 914c are supplied with a current from a corresponding power supply line/ground line, their low-Vth transistors operate at a high speed, and their output signals are changed according to change in input signal IN.

In the power supply circuit arrangement as shown in FIG. 55, since the logical level of an input signal in a stand-by cycle is previously known, a connection path to a power source line is determined accordingly. If the logical state of input signal IN in a stand-by cycle is not predetermined, the logic gate is coupled to sub-power supply line 904 and sub-ground line 908.

As disclosed in Japanese Patent Laying-Open No. 6-232348, in a DRAM (Dynamic Random Access Memory), circuits having the same circuit configuration such as decode circuits and word line drive circuits are provided. As the storage capacity increases, the number of such circuits significantly increases. In repeating circuitry having repeatedly provided decode circuits and word line drive circuits, a prescribed number of particular circuits (addressed circuits) are selectively driven among the circuits having the same configuration in response to an address signal. If these circuits are formed by low-Vth transistors, the power supply circuit arrangement as shown in FIG. 55 (hierarchical power supply arrangement: sub-threshold leakage current reducing circuit) may be employed. In this case, as shown in FIG. 53, activation/inactivation of a power supply to a decoder or a word line driver must be controlled for each of the blocks (because a word line is selected on a block basis.) Control signals φACT and /φACT are activated when an active cycle is started. As a result, the number of circuits connected to sub-power supply line 904 or sub-ground line 908 increases, and as the parasitic capacitance increases, it takes longer time until sub-power supply line 904 and sub-ground line 908 are driven to prescribed voltage (Vcc and ground voltage Vss) levels and therefore the operation starting timings of the internal circuits should be delayed until these voltages becomes stable, which impedes high-speed accessing operations.

As previously described, when a defective row/column is repaired using a spare decoder, a row/column to be selected is determined after determining if a spare is to be used/not used. In this case, as shown in FIG. 53, if redundancy replacement is performed within the same block, a corresponding power supply circuit (a circuit transmitting any of the power supply voltage and ground voltage) can be selected in response to an address signal to control the connection. If, however, a spare row/column is used for repairing a defective cell in another memory block in the flexible redundancy arrangement, a memory block including a memory cell to be driven into a selected state must be specified according to a spare determination result, the power source voltage (power supply voltage and ground voltage) cannot be driven into a stable state at a high speed, and high speed accessing operations cannot be implemented.

SUMMARY OF THE INVENTION

It is an object of the present invention to provide an array-divided semiconductor memory device including a redundancy circuit, which permits the use efficiency of spare lines (spare word lines and spare bit line pairs) to be significantly improved.

Another object of the invention is to provide an array-divided semiconductor memory device including a redundancy circuit, which permits a defective normal line to be accurately repaired without erroneous operation.

Yet another object of the present invention is to provide an array-divided semiconductor memory device including a power supply circuit without increasing accessing time and current consumption.

A further object of the present invention is to provide an array-divided semiconductor memory device including a redundancy circuit which permits the spare line use efficiency to be improved and a power supply circuit which permits accessing time and power consumption to be reduced.

Briefly stated, in a semiconductor memory device according to the present invention, spare lines are provided together as a single array, a plurality of memory mats are provided corresponding to the spare arrays, and a defective normal line in these plurality of memory mats is made replaceable with a spare line in a corresponding spare array.

A power supply circuit corresponding to a spare block is driven into a selected state when an active cycle is started.

Furthermore, the selecting way of the power supply circuit is changed between a normal mode and a refresh mode.

By providing a spare array exclusively for a spare line, the spare line can be shared among a plurality of memory blocks or sub arrays, and therefore the use efficiency of the spare lines may be significantly improved over the case of providing a spare line for each memory block or sub array.

In the array-divided arrangement, the selecting way of the power supply circuit is changed between a normal mode and a refresh mode, the numbers of bits in an address signal to be decoded can be different, and therefore the power supply circuit can be driven into a selected state at a high speed in the normal mode. Meanwhile, since a high speed response is not required in the refresh mode, a large number of address signal bits are decoded to select a minimum necessary power supply circuit and current consumption is reduced.

If a spare element is included, in the normal mode power supply switch circuits for both a particular memory block including the spare element and an addressed memory block are driven into a selected state, so that the power supply circuits can be driven into a selected state without having to wait for a result of spare determination and that high speed accessing operations are implemented.

In the refresh mode, the power supply circuit corresponding to a memory block including a memory cell to be selected is driven into a selected state according to the spare determination result, so that the number of power supply circuits to be selected in the refresh mode can be a minimum necessary number, and the current consumption can be reduced. Thus, a semiconductor memory device with improved use efficiency of spare elements without increase accessing time and current consumption can be implemented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2A is a schematic diagram depicting how a defective column in a memory array shown in FIG. 1 is repaired;

FIG. 2B is a schematic diagram of a spare decoder used for repairing a defective column;

FIG. 20 is a schematic diagram of a modification of the fifth embodiment;

FIG. 22 is a schematic diagram of a memory array and a power switch circuit according to the sixth embodiment;

FIG. 23A is a diagram showing the selected state of a power switch circuit in a normal mode in hierarchical power supply arrangement 1 according to the sixth embodiment;

FIG. 23B is a waveform diagram representing the operation;

DESCRIPTION OF THE PREFERRED EMBODIMENTS

First Embodiment

Figure 1:
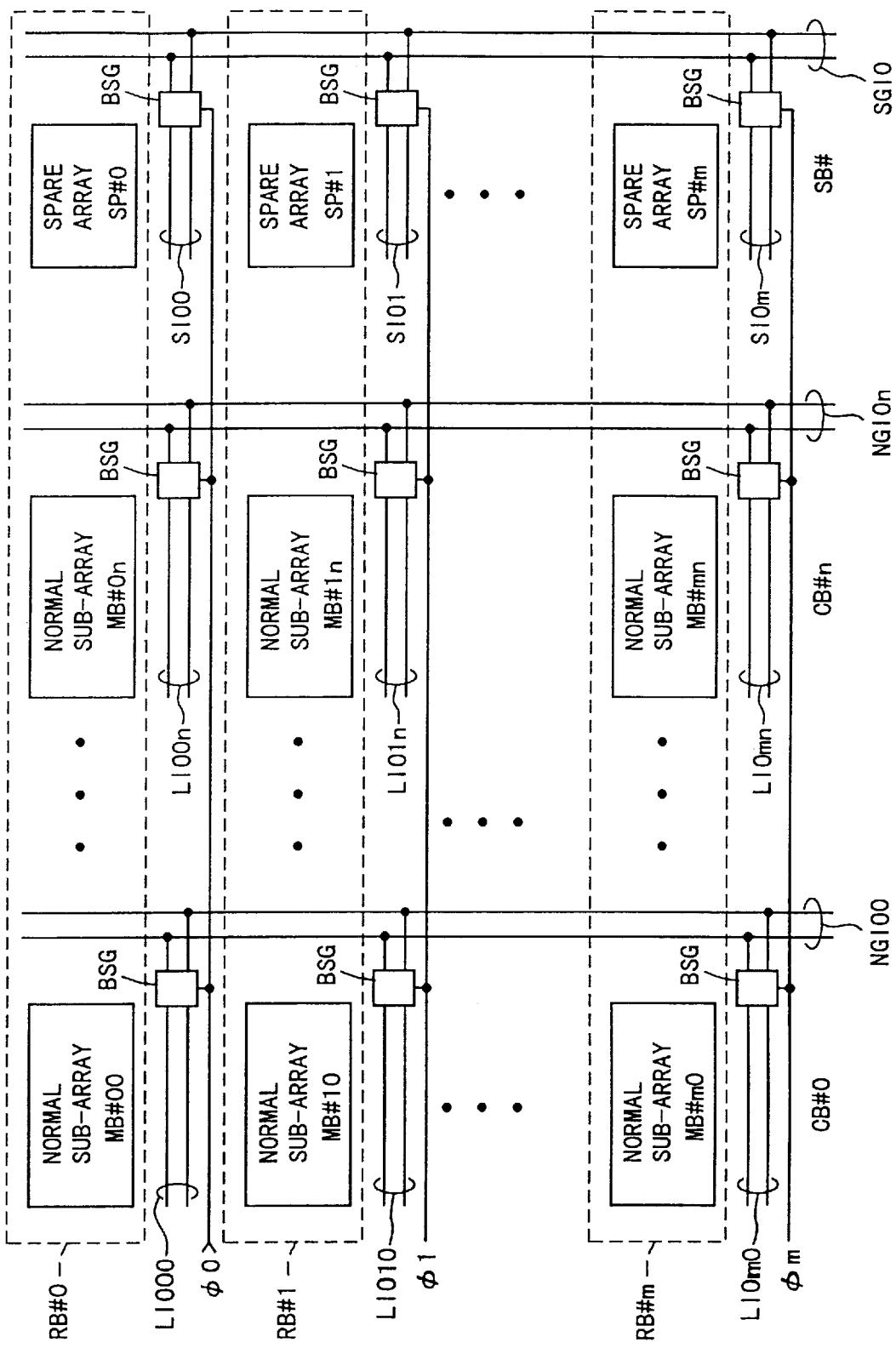
FIG. 1 is a schematic diagram of a main part of a semiconductor memory device according to a first embodiment of the invention.

FIG. 1 is a schematic diagram of an array portion in a semiconductor memory device according to a first embodiment of the invention. In FIG. 1, a memory array is divided into a plurality of sense amplifier blocks (row blocks) RB#0 to RB#m. These row blocks RB#0 to RB#m each share word lines. Row blocks RB#0 to RB#m are each divided into a plurality of sub-arrays. Row block RB#i (i=0 to m) is divided into normal sub-arrays MB#i0 to MB#in. These normal sub-arrays MB#i0 to MB#in each have a plurality of memory cells arranged in a matrix of rows and columns and share word lines (rows). A sensing operation is performed on the basis of a sense amplifier block.

Row blocks RB#0 to RB#m are provided with spare arrays SP#0 to SP#m respectively to repair a defective column (a column including a defective normal memory cell) in corresponding row blocks RB#0 to RB#m. These spare arrays SP#0 to SP#m each have memory cells (spare memory cells) arranged in a plurality of columns. (The number of rows of spare arrays SB#0 to SB#m is the same as the number of rows of memory cells included in a normal sub-array.)

Normal local data buses LIO00 to LIOmn are provided to normal sub-arrays MB#00 to MB#mn, respectively. These normal local data buses LIO00 to LIOmn communicate data only with corresponding normal sub-arrays MB#00 to MB#mn.

Normal sub-arrays arranged in alignment along the column direction form column blocks CB#0 to CB#n. Spare local data buses SIO0 to SIOm are similarly provided to spare arrays SP#0 to SP#m. These spare local data buses SIO0 to SIOm communicate data only with corresponding spare arrays SP#0 to SP#m. Normal global data buses NGIO0 to NGIOn are provided to normal sub-arrays arranged in alignment in the column direction, in other words, to column blocks CB#0 to CB#n, respectively. These normal global data buses NGIO0 to NGIOn are coupled to normal local data buses provided for normal sub-arrays in corresponding column blocks through respective block selecting gates BSG. Block selecting gate BSG conducts in response to a corresponding block selecting signal to connect a corresponding normal local data bus and a corresponding normal global data bus, when a corresponding row block is selected. Spare local data buses SIO0 to SIOm are also coupled to spare global data bus SGIO through corresponding block selecting gates BSG. Block selecting gates BSG provided for spare arrays SP#0 to SP#m each conduct when a corresponding row block is selected, to connect a corresponding spare local data bus to spare global data bus SGIO.

By providing a spare array SP#i common to normal sub-arrays MB#i0 to MB#in in row block RB#i, spare columns included in spare array SP#i can be used for normal sub-arrays MB#i0 to MB#in, so that the use efficiency of spare columns is improved.

When a spare column is provided for each of normal sub-arrays and more defective columns than the spare columns provided in a normal sub-array are present, the defective columns can not be repaired. However, if, as shown in FIG. 1, spare arrays are provided and spare columns are collectively provided, a large number of defective columns present in a normal sub-array can be repaired by replacing the defective column with a spare column in a corresponding spare array, which improves the yields of the products.

FIG. 2A is a diagram showing how a defective normal column is repaired by way of illustration. In FIG. 2A, spare arrays SP#0 to SP#m each include four spare bit line pairs (spare columns) SBL0 to SBL3.

Column decode circuits Y0 to Yn are provided for column blocks CB#0 to CB#n, respectively. A spare decode circuit SPD is provided for spare block SP#. Column decode circuits Y0 to Yn transmit a column selecting signal through a column selecting line CSL common to memory sub-arrays included in a corresponding column block. Spare decode circuit SPD transmits a spare column selecting signal through spare column selecting lines SCSL0 to SCSL3 provided for spare bit line pairs SBL0 to SBL3, respectively. Let us now assume that normal columns (normal bit line pairs) are repaired by replacement independently from one another in normal memory sub-arrays MB#00 to MB#mn.

FIG. 2B is a diagram showing an example of spare decode circuit SPD shown in FIG. 2A. In FIG. 2B, spare decode circuit SPD includes OR circuits OG0 to OG3 provided corresponding to spare column selecting lines SCSL0 to SCSL3, respectively. For each of OR circuits OG0 to OG3, spare decoders provided corresponding to row block RB#0 to RB#m are disposed. For OR circuit OG0, spare decoders SG00 to SG0m are provided, and for OR circuit OG3, spare decoders SD30 to SD3m are provided. A defective normal bit line pair in each row block is programmed in a spare decoder provided for each OR circuit.

Now, as shown in FIG. 2A, normal bit line pair PBL0 in memory sub-array MB#00 is replaced with spare bit line pair SBL0 in spare array SP#0, and normal bit line pair PBL1 in memory sub-array MB#0n is replaced with spare bit line pair SBL1 in spare array SP#0. Normal bit line pair PBL2 in memory sub-array MB#10 is replaced with spare bit line pair SBL0 in spare array SP#1, and defective normal bit line pairs PBL3 and PBL4 included in memory sub-arrays MB#m0 and MB#mn respectively are replaced with spare bit line pairs SBL0 and SBL3 in spare array SP#m. In this case, the address of defective normal bit line pair PBL0 is programmed in spare decoder SD00, and the address of defective normal bit line pair PBL1 is programmed in the spare decoder provided for an OR circuit provided corresponding to spare column selecting lines CSL1. Defective normal bit line pair PBL2 has its address programmed in spare decoder SD01 provided for OR circuit OG0. Defective normal bit line pairs PBL3 and PBL4 have their addresses programmed in spare decoders SD0m and SD3m. As a result, when a defective normal bit line pair is addressed, a corresponding spare column selecting line is driven into a selected state. At this time, according to the output signals of these OR circuits, the decoding operations of column decode circuits Y0 to Yn are stopped. More specifically, the use of the spare decode circuit shown in FIG. 2B permits defective normal bit line pairs to be repaired independently from one another among memory sub-arrays MB#00 to MB#mn.

In the configuration of the spare decode circuit shown in FIG. 2B, the address of a defective normal bit line pair can be programmed for each row block. It is therefore not requested that the spare decoders each store "Don't care" state. If normal column selecting line CSL is defective, each spare decoder has only to be programmed with the same address signal. In this case, however, by providing the spare decoder with the function of storing the "Don't care" state, defective normal bit line pairs can be repaired on a row block basis and defective normal bit line pairs can be also repaired by replacing a defective normal column selecting line as well.

Modification

Figure 3A:
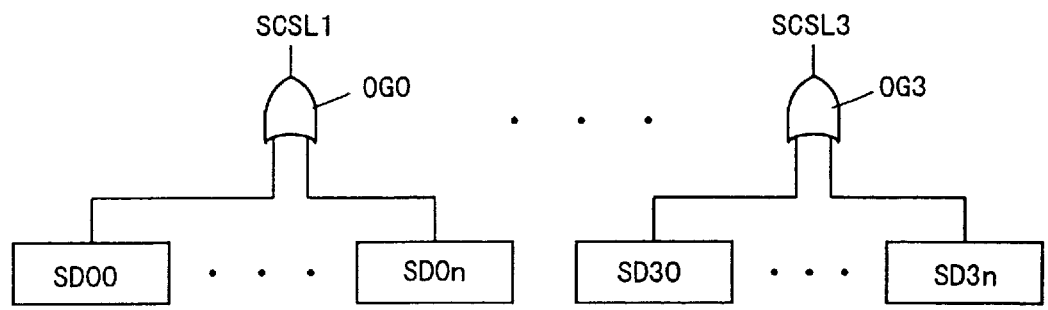
FIG. 3A shows a modification of the spare decoder.
Figure 3B:
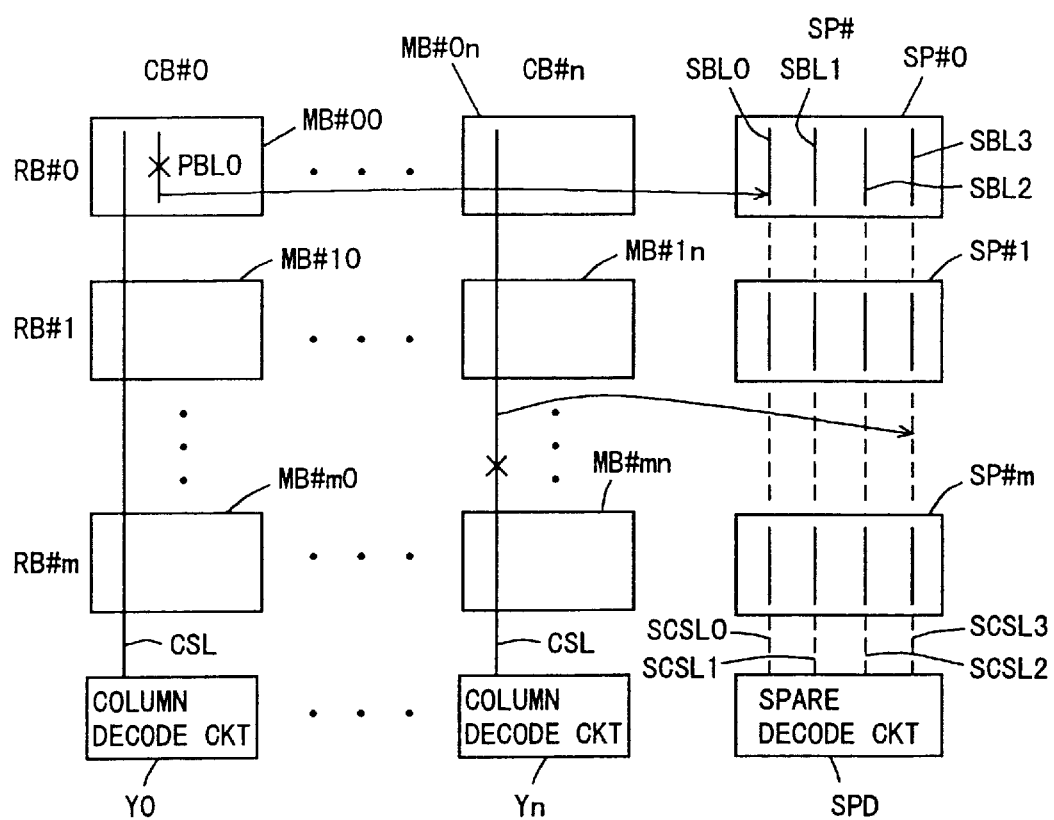
FIG. 3B is a diagram depicting how a defective column is repaired by the spare decoder shown in FIG. 3A.

FIG. 3A is a diagram of a modification of the spare decode circuit shown in FIG. 2A. In FIG. 3A, a spare decoder is disposed for a column block. More specifically, for OR circuit OG0, spare decoders SD00 to SD0n are provided, while for OR circuit OG3, spare decoders SD30 to SD3n are provided. Spare decoders SD00 to SD0n correspond to column blocks CB#0 to CB#n, respectively, while spare decoders SD30 to SD3n correspond to column blocks CB#0 to CB#n, respectively.

Let us now assume that a normal bit line pair PBL0 in memory sub-array MB#00 is defective, and that a column selecting line CSL from column decode circuit Yn is defective. In this case, the address of defective normal bit line pair PBL0 is programmed in spare decoder SD00, and the address of defective normal column selecting line CSL is programmed in spare decoder SD3n. When the address of defective normal column selecting line CSL is programmed, spare decoder SD3n has its column block address bit invalidated, and the output signal of spare decoder SD3n indicates a selected state if a normal bit line pair corresponding to a defective column selecting line CSL in any of memory sub-arrays MB#0n to MB#mn in column block CB#n is addressed.

In this case, defective normal bit line pair PBL0 is replaced with spare bit line pair SBL0 in spare array SP#0, and defective normal column selecting line CSL from column decode circuit Yn is replaced with spare column selecting line SCSL3.

Note that in the arrangement shown in FIG. 1, a single memory sub-array is selected and connected to a corresponding normal global data bus. As a result, 1-bit data is input/output.

Figure 4:
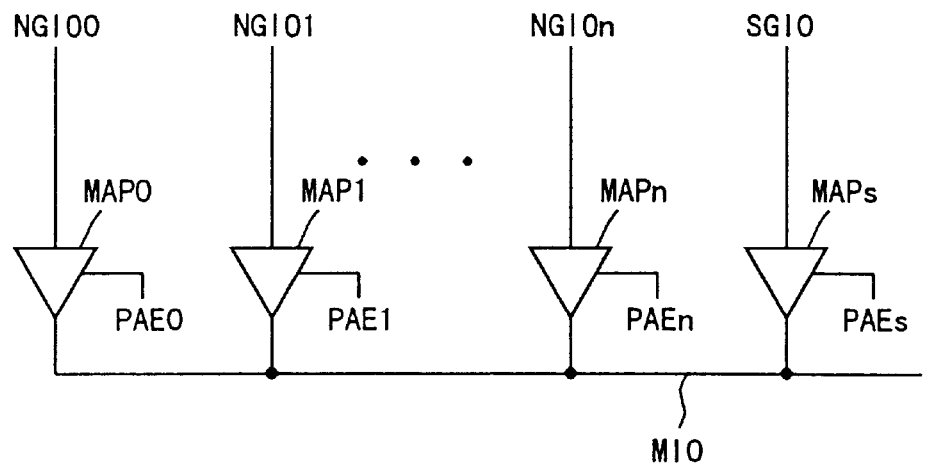
FIG. 4 is a schematic diagram of an internal data reading portion in the array arrangement shown in FIG. 1.

FIG. 4 is a schematic diagram of a data reading portion. In FIG. 4, main amplifiers MAP0 to MAPn are provided to normal global data buses NGIO0 to NGIOn, respectively, and a spare main amplifier MAPs is provided corresponding to a spare global data bus SGIO. Main amplifier MAP0 to MAPn are selectively activated in response to activation of main amplifier activation signals PAE0 to PAEn, and spare main amplifier MAPs is activated in response to a spare main amplifier activation signal PAEs. When spare main amplifier activation signal PAEs is activated, main amplifier activation signals PAE0 to PAEn are all maintained in a non-active state. Thus, when a defective bit is repaired by replacement, 1-bit data can be accurately read out. In order to write data, a write driver has only to be provided in place of a main amplifier.

Spare main amplifier activation signal PAEs is activated when any of the output signals of OR circuits OG0 to OG3 attains an H level.

Note that in the configuration of the reading portion in FIG. 4, normal global data buses NGIO0 to NGIOn are connected to normal local data buses provided corresponding to a selected row block. However, since only one of column decode circuits Y0 to Yn transmits an activated column selecting signal onto a column selecting line, only one of normal global data buses NGIO0 to NGIOn receives the data of a selected memory cell (when a normal memory cell is accessed).

If all the memory sub-arrays are selected in a selected row block, a spare local data bus is provided for each of the spare sub-bit line pairs in each spare array, and spare global data buses are provided corresponding to these plurality of spare local data buses. Using spare decoders SD00 to SD3n having the configuration shown in FIG. 3A, one of the spare main amplifiers provided for the plurality of spare global data buses is selectively activated. Alternatively, using the output signals of these spare decoders SD00 to SD3n, a column block at which a defective normal column has been repaired is detected, and the output signal of the spare main amplifier provided for the detected column block is selected and transmitted. This can be implemented by using a switch circuit.

In FIGS. 2A and 3A, spare decoders are used for row blocks or column blocks. However, the number of spare decoders can be suitably determined depending upon the number of defective normal bit line pairs to be repaired in the entire memory array.

The number of spare bit line pairs in each of spare arrays SP#0 to SP#m can be suitably determined. What is required is that a plurality of spare bit line pairs are provided per column block.

As described above, according to the first embodiment of the invention, a spare array is provided for each row block, and an arbitrary defective normal column in a plurality of sub-arrays included in a corresponding row block can be repaired, so that defective normal columns can be efficiently repaired in each row block.

A spare decoder to select a spare column (spare bit line pair) is shared among a plurality of memory sub-arrays, in other words, a spare decoder is not necessary for each of memory sub-arrays, which reduces the circuit occupying area and improves the use efficiency of spare decoders.

Second Embodiment

Figure 5:
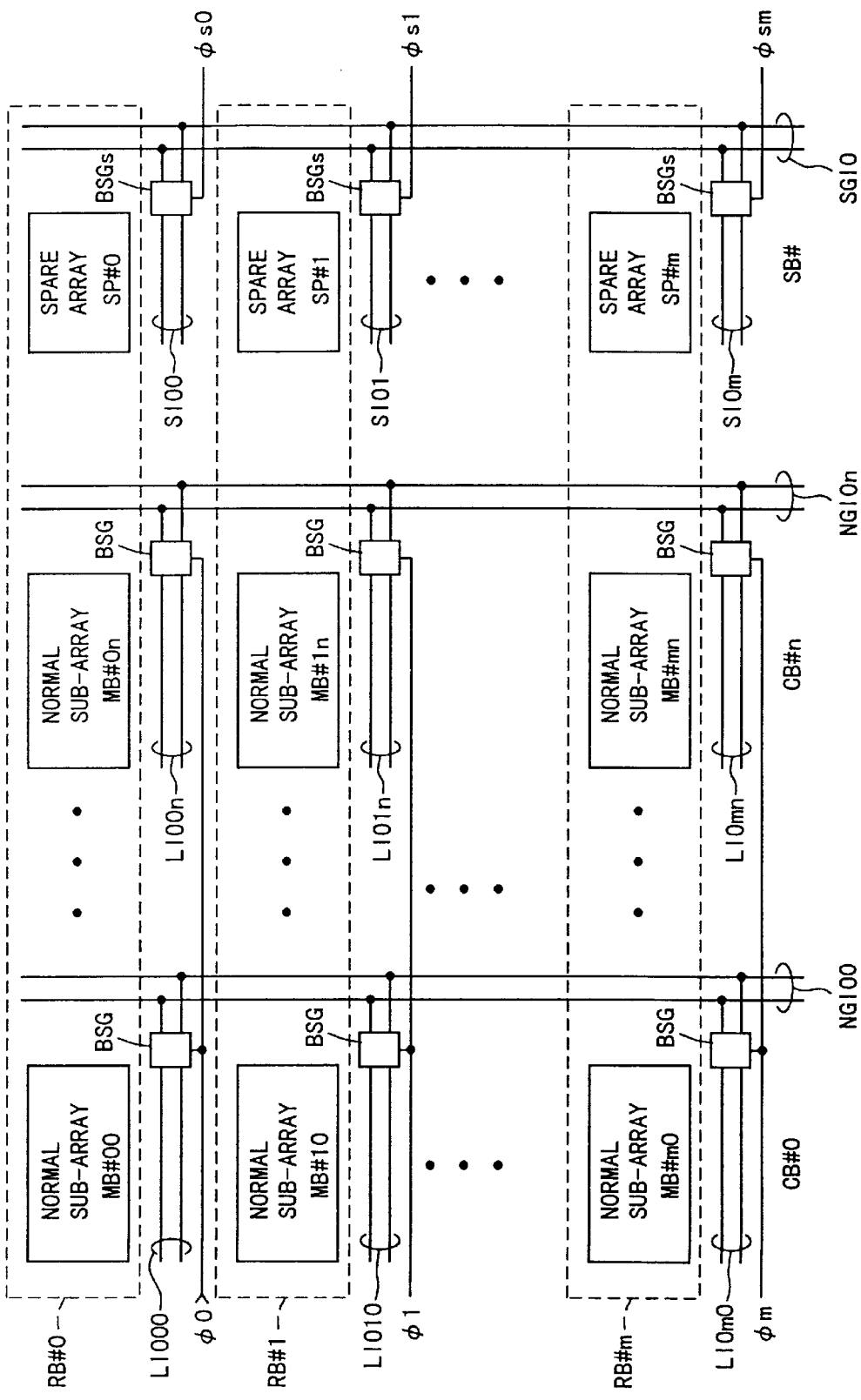
FIG. 5 is a schematic diagram of a main part of a semiconductor memory device according to a second embodiment of the invention.

FIG. 5 is a schematic diagram of a memory array portion in a semiconductor memory device according to a second embodiment of the invention. In the array arrangement shown in FIG. 5, block selecting gates BSGs provided corresponding to spare arrays SP#0 to SP#m receive signals $\phi$so to $\phi$sm different from signals $\phi$0 to $\phi$m to select a corresponding row block. More specifically, when a defective normal column is repaired, a prescribed number of spare local data buses among spare local data buses SIO0 to SIOm are simultaneously connected to spare global data bus SGIO. The other arrangement is the same as that in FIG. 1, and corresponding portions are denoted by the same reference characters.

Figure 6:
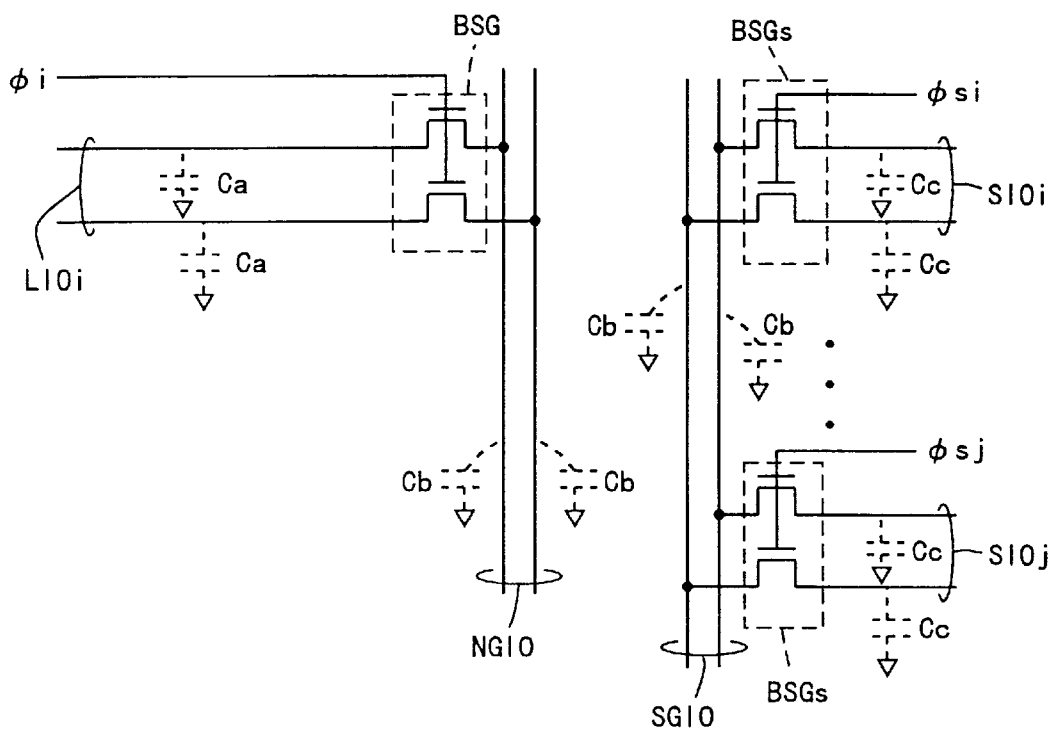
FIG. 6 is a schematic diagram depicting how a normal local data bus and a normal global data bus are connected and a spare local data bus and a spare global data bus are connected in the memory array shown in FIG. 5.

FIG. 6 is a schematic diagram depicting how normal global data buses are connected to local data buses and spare local data buses. In FIG. 6, normal global data bus NGIO is connected to a local data bus LIOi through a block selecting gate BSG. Block selecting gate BSG conducts in response to a row block selecting signal $\phi$i. Meanwhile, spare global data bus SGIO is connected to spare local data bus SIOi through spare block selecting gate BSGs and at the same time connected to a plurality of spare local data buses. FIG. 6 generically shows spare local data bus SIOj connected to spare global data buses SGIO by way of illustration.

In a memory sub-array, normal memory cells are arranged in a matrix of rows and columns. In a spare-array, spare memory cells are arranged in a matrix of rows and columns. The number of columns in the spare array, however, is significantly smaller than the number of columns in a normal sub-array, because the spare array is provided to repair a defective column in a normal sub-array in a corresponding row block. As a result, when parasitic capacitance Ca is connected to bus lines to local data bus LIOi, smaller parasitic capacitance Cc is present at bus lines of spare local data bus SIOi.

Meanwhile, normal global data bus NGIO and spare global data bus SGIO are provided extending in the column direction in a memory array, and almost the same parasitic capacitance Cb is present on these buses. As a result, if only a single spare local data bus is connected to spare global data bus SGIO, the parasitic capacitance produced is Cb+Cc. At the time of accessing a normal memory cell, the parasitic capacitance produced on the bus line is Ca+Cb. At the time of accessing a spare memory cell, the parasitic capacitance on the bus is small, a signal changes in a timing faster than that in accessing a normal memory cell. Therefore, signal propagation delay is different between normal memory cell accessing and spare column selecting, the timings of changes in the internal signals are different, which could cause inconsistency in internal timings and erroneous operations. Particularly in the case where memory array as shown in FIG. 5 is provided in plurality and multiple-bit data is input/output, if a spare column is selected in a memory array and a normal column is selected in another memory array, the timings of transferring data are different, and therefore the set up/hold time of internal data could be different, which destabilizes the circuit operations.

Also when columns are selected sequentially in synchronization with a clock signal, data is externally read out alternately after it is read and latched in parallel with selected data in another memory cell array. If the transmission time of a data signal is different for selecting a normal memory cell and for selecting a spare column, the set up/hold time relative to the latch timing is different, which could make it difficult to read out data accurately.

Thus, as shown in FIG. 6, at the time of accessing a defective spare memory cell, a plurality of spare local data buses are simultaneously connected to spare global data bus SGIO. Thus, the signal propagation delay time is made equal between the case of selecting a normal memory cell and the case of accessing a spare memory cell.

The number of spare local data buses k driven simultaneously into a selected state is specifically given by the following expression:

$$Cb+Ca=Cb+k \cdot Cc$$

Therefore the following expression results:

$$Ca=k \cdot Cc$$

Thus, the problems associated with mismatch in the timings can be avoided.

Figure 7:
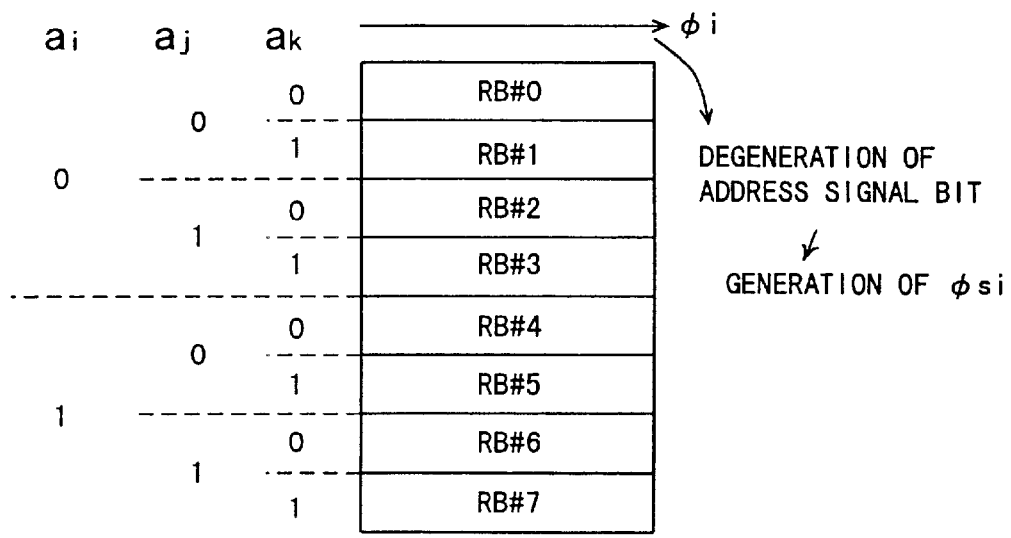
FIG. 7 is a diagram showing the way to generate a spare local data bus selecting signal.

Let us now assume that eight row blocks RB#0 to RB#7 are provided as shown in FIG. 7. Row blocks RB#0 to RB#7 are addressed by 3 address signal bits, ai, aj and ak. These 3 address signal bits, ai, aj and ak are decoded to generate a block selecting signal φi.

One of the group of row blocks RB#0 to RB#3 and the group of row blocks RB#4 to RB#7 is addressed by address signal bit aj, one of the group of row blocks RB#0, RB#1, RB#4 and RB#5 and the group of row blocks RB#2, RB#3m RB#6 and RB#7 is addressed by address signal bit ai, and one of the group of row blocks RB#0, RB#2, RB#4 and RB#6 and the group of row blocks RB#1, RB#3, RB#5 and RB#7 is addressed by address signal bit ak. In this case, address signal bits ai to ak can be suitably invalidated (set to a "Don't care" state) to generate spare array block selecting signal φsi.

If, for example, address signal bit ak is invalidated, two row blocks are simultaneously addressed, two spare local data buses can be connected to a spare global data bus. If address signal bit aj is invalidated, two row blocks can be similarly addressed. If address signal bits aj and ak are both invalidated, four row blocks can be simultaneously addressed. If 3 address signal bits ai to ak are all invalidated, all the row blocks can be addressed. Thus, by the use of this arrangement, spare local data buses for a necessary number (multiples of 2) of spare arrays can be connected to the spare global data bus.

Figures 8, 9:
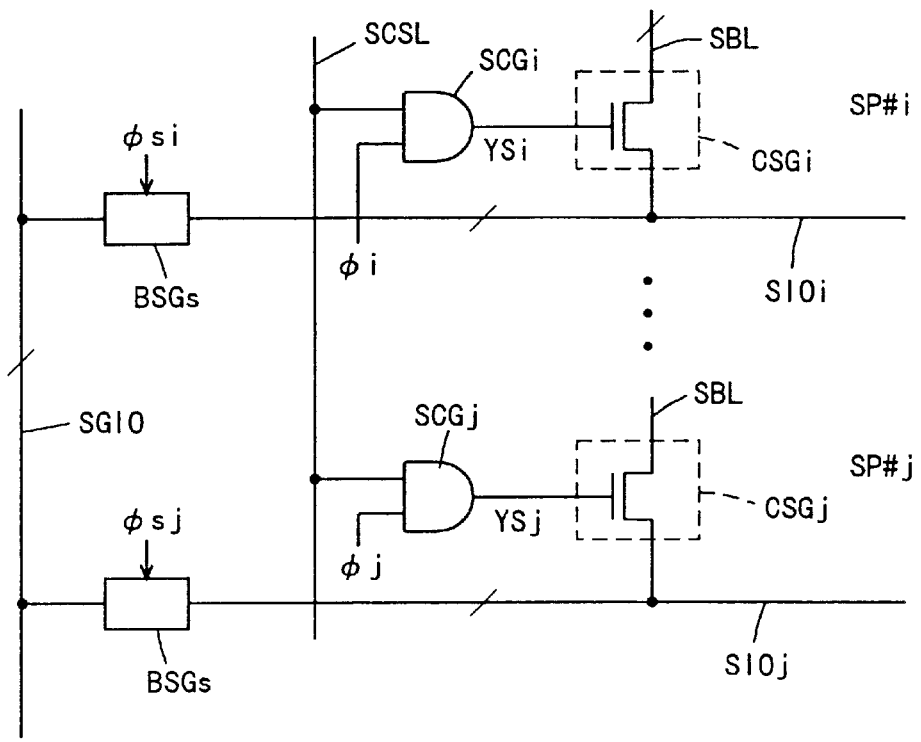
FIG. 8 is a schematic diagram of a column selecting portion in a spare array in the memory array shown in FIG. 5.
FIG. 9 is a schematic diagram of a main part of a semiconductor memory device according to a third embodiment of the invention.

FIG. 8 is a schematic diagram of a column selecting portion in a spare block. In FIG. 8, the configuration of two spare arrays SP#i and SP#j is shown.

Referring to FIG. 8, in spare array SP#i, a spare column selecting gate CSG1 conducts to connect a spare bit line pair SBL to spare local data bus SIOi in response to a local column selecting signal YSi output from an AND circuit SCG1 which in turn receives a column selecting signal and a row block address signal φi from a spare column decode circuit which is not shown. In spare array SP#j, a spare column selecting gate CSGj conducts to connect a spare bit line pair SBL and spare local data bus SIOj in response to a spare local column selecting signal YSj from an AND circuit SCGj which in turn receives a spare column selecting signal and a row block selecting signal φj transmitted onto a spare column selecting line SCSL from the spare column decode circuit. Spare local data buses SIOi to SIOj are connected to spare global data bus SGIO through spare block selecting gates BSGs which conduct in response to block selecting signals φsi and φsj.

In the configuration shown in FIG. 8, when a spare array is accessed, spare local data buses SIOi to SIOj are coupled to spare global data bus SGIO in parallel. In this state, a spare bit line pair SBL for a spare array provided corresponding to a selected row block is connected to a corresponding spare local data bus. Thus, if a spare column selecting signal applied onto spare column selecting line SCSL from the spare column decode circuit is provided in common to spare arrays SP#0 t SP#m and a plurality of spare local data buses are simultaneously connected to the spare global data bus, a spare column corresponding to an addressed defective column can be accurately selected for data accessing. Thus, such a situation can be prevented that a spare bit line pair held in a precharge state is connected to the spare global data bus through a corresponding spare local data bus and the spare memory data is destroyed.

In the foregoing description, an address signal bit for addressing a row block is set to a degenerated state (Don't care state) and a plurality of spare local data buses are simultaneously connected to the spare global data bus. However, a decode circuit may be separately provided, and a set of spare local data buses selected at a time for each addressing of a row block may be determined based on the output of the decode circuit.

As described above, according to the second embodiment, a plurality of spare local data buses are connected to the spare global data bus in parallel, the signal propagation delay for the global data bus can be the same for accessing a normal memory cell and for accessing a spare memory cell, so that the problems associated with mismatch in the internal timings can be avoided and a stably operating semiconductor memory device can be implemented.

Third Embodiment

FIG. 9 is a schematic diagram of a main part of a semiconductor memory device according to a third embodiment of the invention. In FIG. 9, a memory array is divided into a plurality of row blocks (sense amplifier blocks) RBX#0 to RBX#m along the column direction. Row blocks RBX#1 to RBX#m are formed by normal memory sub-arrays MA#1 to MA#m having normal memory cells arranged in a matrix of rows and columns. Row block RBX0 includes a normal memory sub-array MA#0 having normal memory cells arranged in a matrix of rows and columns, and a spare array SPX# having spare memory cells arranged in a plurality of rows and sharing the columns with normal memory sub-array MA#0. The plurality of spare rows (spare word lines) included in spare array SPX# can replace defective normal word lines included in normal memory sub-arrays MA#0 to MA#m. Row decoders X0 to Xm are provided for normal memory sub-arrays MA#0 to MA#m, respectively, and a spare row decode circuit SPDX is provided for spare array SPX#.

In the configuration shown in FIG. 9, spare array SPX# is provided in common to normal memory sub-arrays MA#0 to MA#m. As a result, if defective rows concentrate in one normal memory sub-array, spare word lines included in spare array SPX# can be used for repairing by replacement, and therefore the yields of the products can be improved. A spare row decoder is shared among a plurality of normal memory sub-arrays (row blocks) and therefore the number of spare decoders can be reduced.

Figure 10:
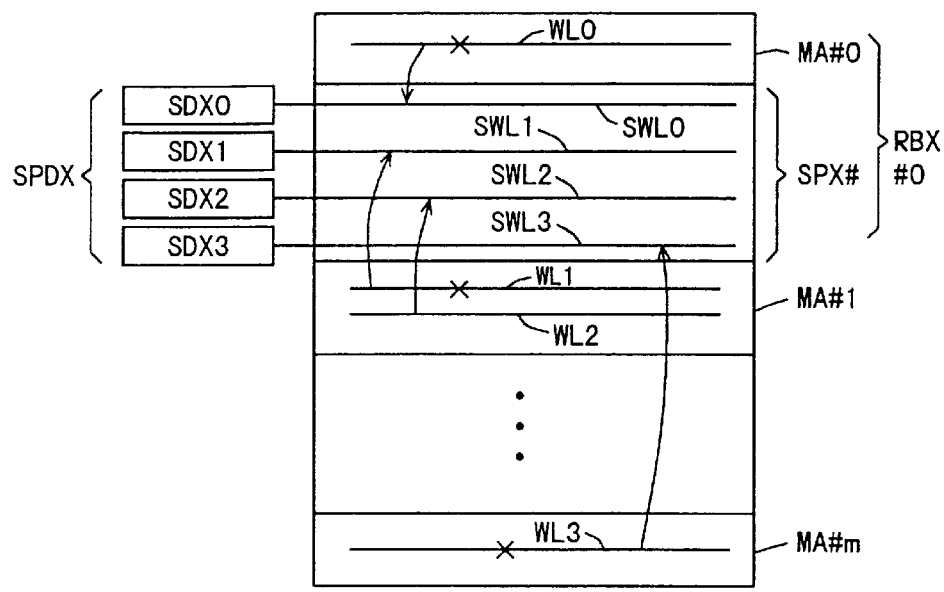
FIG. 10 is a diagram showing how a defective row in the memory array shown in FIG. 9 is repaired by way of illustration.

FIG. 10 is a schematic diagram of spare row decode circuit SPDX shown in FIG. 9. FIG. 10 shows the configuration of spare row decode circuit SPDX when four spare word lines SWL0 to SWL3 are provided by way of illustration. Spare row decode circuit SPDX includes spare row decoders SDX0 to SDX3 provided corresponding to spare word lines SWL0 to SWL3, respectively. These spare row decoders SDX0 to SDX3 are programmed with both a block address to address a memory sub-array and a row address to address a row in a sub-array.

Let us now assume that a defective normal word line WL0 included in normal memory sub-array MA#0, defective normal word lines WL1 and WL2 included in normal memory sub-array MA#1, and a defective normal word line WL3 included in normal memory sub-array MA#m are repaired by replacement with spare word lines as shown in FIG. 10. In this case, the address (including a block address) of word line WL0 is programmed in spare row decoder SDX0, and the addresses of defective normal word lines WL1 and WL2 are programmed in spare row decoders SDX1 and SDX2, respectively, and the address of defective normal word line WL3 is programmed in spare row decoder SDX3. Therefore, defective normal word lines WL0, WL1, WL2 and WL3 are replaced with spare word lines SWL0, SWL1, SWL2 and SWL3, respectively.

Thus, since a spare row decoder is shared among normal memory sub-arrays MA#0 to MA#m, a spare row decoder is not necessary for each of the normal memory sub-arrays, and therefore increase in the array occupied area can be restrained. Since spare word lines are shared among normal memory sub-arrays MA#0 to MA#m, and therefore the use efficiency of spare word lines can be improved.

By providing spare array SPX# in common to normal memory sub-arrays MA#0 to MA#m in row block RBX#0, spare word line SWL included in spare array SPX# can be used by an arbitrary normal memory sub-array, and the use efficiency of spare word lines can be improved.

Since spare array SPX# is included in normal memory sub-array MA#0, a sense amplifier provided for row block RBX0 has only to be activated when one of spare decoders SDX0 to SDX3 is selected, and therefore the control operation of the sense amplifier is simplified.

In the configuration shown in FIGS. 9 and 10, one row block is selected among row blocks RBX#0 to RBXm for sensing operation. (A word line is selected.)

The number of spare word lines SWL included in spare array SPX# is arbitrary.

As in the foregoing, according to the third embodiment of the invention, spare word lines are collectively provided in a single spare array for common use among a plurality of normal memory sub-arrays, the number of spare row decoders is reduced, and the use efficiency of spare word lines is improved.

Fourth Embodiment

Figure 11:
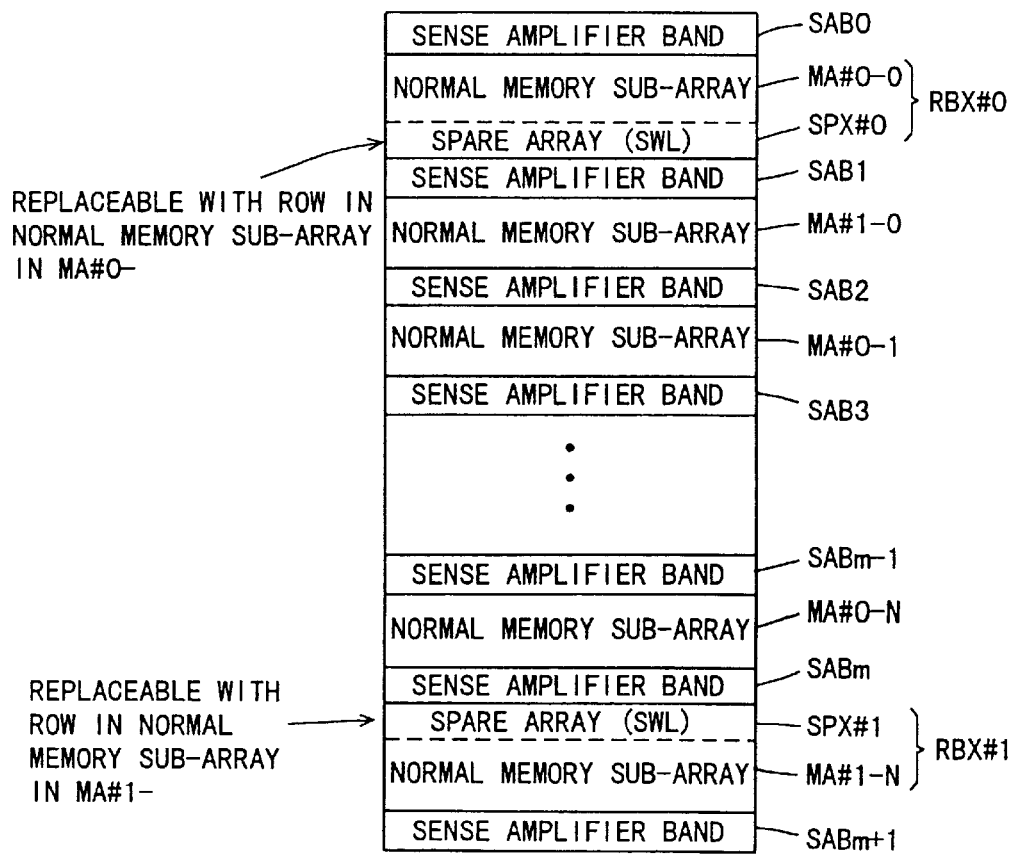
FIG. 11 is a schematic diagram of an array portion in a semiconductor memory device according to a fourth embodiment of the invention.

FIG. 11 is a schematic diagram of an array portion in a semiconductor memory device according to a fourth embodiment of the invention. In FIG. 11, a memory array includes normal memory sub-arrays MA#0-0 to MA#0-N and normal memory sub-arrays MA#1-0 to MA#1-N provided in the column direction, alternately with normal memory sub-arrays MA#0-0 to MA#0-N. A spare array SPX#0 having a prescribed number of spare word lines SWL is provided for normal memory sub-array MA#0-0 to form one row block (sense amplifier block) RBX0, while in normal memory sub-array MA#1-N, a spare array SPX#1 having a prescribed number of spare word lines SWL is provided to form a row block RBX#1. Normal memory sub-arrays MA#0-0 to MA#0-N and MA#1-0 to MA#1-N each have normal memory cells arranged in a matrix of rows and columns.

Sense amplifier bands SAB1 to SABm are provided between memory sub-arrays adjacent to one another in the column direction. A sense amplifier band SAB0 is provided outside normal memory sub-array MA#0-0, and a sense amplifier band SABm+1 is provided adjacent to normal memory sub-array MA#1-N.

These sense amplifier bands SAB0 to SABm+1 have an alternate shared sense amplifier arrangement. When one normal memory sub-array or row block is selected, the sense amplifiers included in the sense amplifier bands provided on both sides are used for sensing operation.

Spare word lines in spare array SPX0 included in row block RBX#0 can replace normal word lines included in memory sub-arrays MA#0-0 to MA#0-N, and each spare word line in spare array SPX#1 provided in normal memory sub-array MA#1-N can replace each normal word line included in normal memory sub-arrays MA#1-0 to MA#1-N.

In a normal operation, one of normal memory sub-arrays MA#0-0 to MA#0-N is selected or one of normal memory sub-arrays MA#1-0 to MA#1-N is selected. More specifically, in the arrangement shown in FIG. 11, one normal memory sub-array is driven into a selected state. Now, advantages brought about by alternately arranging normal memory sub-arrays MA#0-0 to MA#0-N and normal memory sub-arrays MA#1-0 to MA#1-N in the column direction and providing a spare array for each of the groups of sub-arrays will be described.

Figure 12:
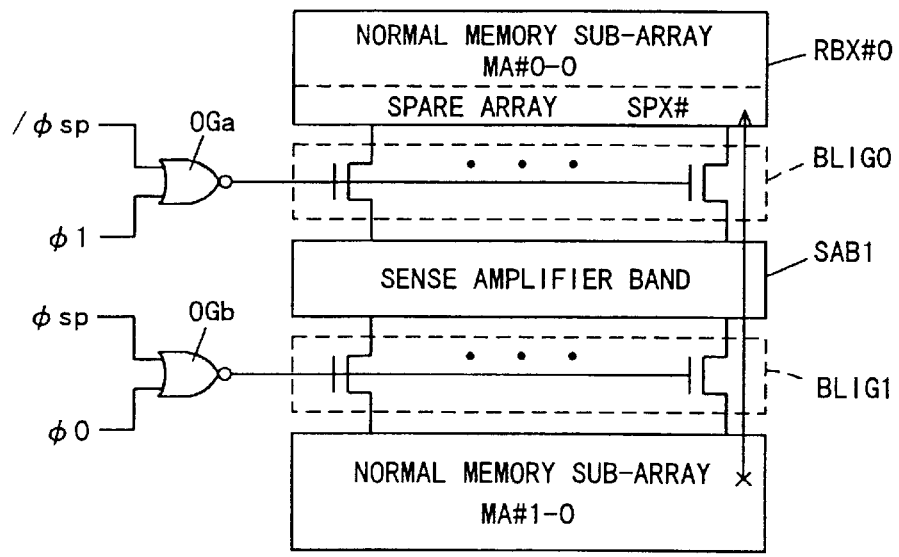
FIG. 12 is a diagram showing the effect of a memory block arrangement shown in FIG. 11.

Let us now assume that spare word lines in spare array SPX# included in row block RBX0 as shown in FIG. 12 can replace defective normal word lines in all the normal memory sub-arrays. In the shared sense amplifier arrangement, row block RBX0 and normal memory sub-array MA#1-0 are provided on both sides of sense amplifier band SAB1. A bit line isolation gate BLIG0 is provided between sense amplifier band SAB1 and row block RBX0, and a bit line isolation gate BLIG1 is provided between sense amplifier band SAB1 and normal memory sub-array MA#1-0. Bit line isolation gate BLIG0 is supplied with the output signal of NOR circuit OGa receiving a replacement instruction signal/φsp and a sub-array designating signal φ1 as a bit line isolation control signal.

Bit line isolation gate BLIG1 is supplied with the output signal of an NOR circuit OGb receiving replacement instruction signal φsp and sub-array designating signal φ as a bit line isolation instruction signal. Replacement instruction signal φsp is selectively pulled to an H level, active state when a defective normal cell is addressed and a spare word line included in spare array SPX# is selected. Sub-array designating signal φ1 attains an active state, H level, when normal memory sub-array MA#1-0 is addressed, and sub-array designating signal φ0 attains an active state, H level, when normal memory sub-array MA#0-0 is addressed.

Let us assume that a defective normal word line included in normal memory sub-array MA#1-0 is replaced with a spare word line included in spare array SPX#. When this defective normal word line in normal memory sub-array MA#1-0 is addressed, sub-array designating signal φ1 attains an H level, while sub-array designating signal φ maintains an L level. As a result, the output signal of NOR circuit OGa attains an L level, bit line isolation gate BLIG0 attains a non-conductive state, the spare array SPX# is disconnected from sense amplifier band SAB1. Meanwhile, the defective normal word line is replaced with a spare word line included in spare array SPX#, replacement instruction signal φsp is driven into an H level, therefore the output signal of NOR circuit OGb attains an H level, and bit line isolation gate BLIG1 attains a non-conductive state. As a result, sense amplifier band SAB1 is disconnected from both spare array SPX# and normal memory sub-array MA#1-0, and the defective normal word line cannot be repaired.

Figure 13:
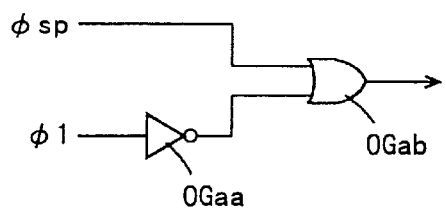
FIG. 13 is a schematic diagram of a bit line isolation instruction signal generation portion for solving problems associated with the arrangement shown in FIG. 12.

For the purpose of avoiding this situation, the circuit shown in FIG. 13 could be used as the bit line isolation control circuit in order to turn on bit line isolation gate BLIG0 when a spare word line is used.

In FIG. 13, the bit line isolation control circuit includes an inverter OGaa which receives sub-array designating signal φ1, and an OR circuit OGab which receives the output signal of inverter OGaa and replacement instruction signal φsp. In the bit line isolation control circuit shown in FIG. 13, when a normal memory sub-array is addressed, the output signal of inverter OGaa attains an L level. When a defective normal word line is not addressed, replacement instruction signal φsp is at an L level, and therefore the output signal of OR circuit OGab attains an L level, which turns off bit line isolation gate BLIG0. Meanwhile, if replacement instruction signal φsp is activated and a spare word line included in the spare array is used, the output signal of OR circuit OGab attains an H level, which turns on bit line isolation gate BLIG0.

However, the bit line isolation control circuit shown in FIG. 13 has a different circuit configuration from the control circuit provided for other bit line isolation gates and a different number of gate stages. (The OR circuit is formed by an NOR circuit and an inverter receiving the output of the NOR circuit.) As a result, the gate delay is different, the timing margin is reduced, and erroneous operation could be caused.

As shown in FIG. 11, in spare array SPX#0, by providing spare word lines which can replace defective normal word lines in normal memory sub-arrays MA#0-0 to MA#0-N, a spare word line included in a spare array included in this row block RBX#0 is not used if a defective normal word line in normal memory sub-array MA#1-0 is addressed. Therefore, in this case, the use of the bit line isolation control circuit shown in FIG. 14 permits a defective normal word line to be accurately repaired by replacement.

Figure 14:
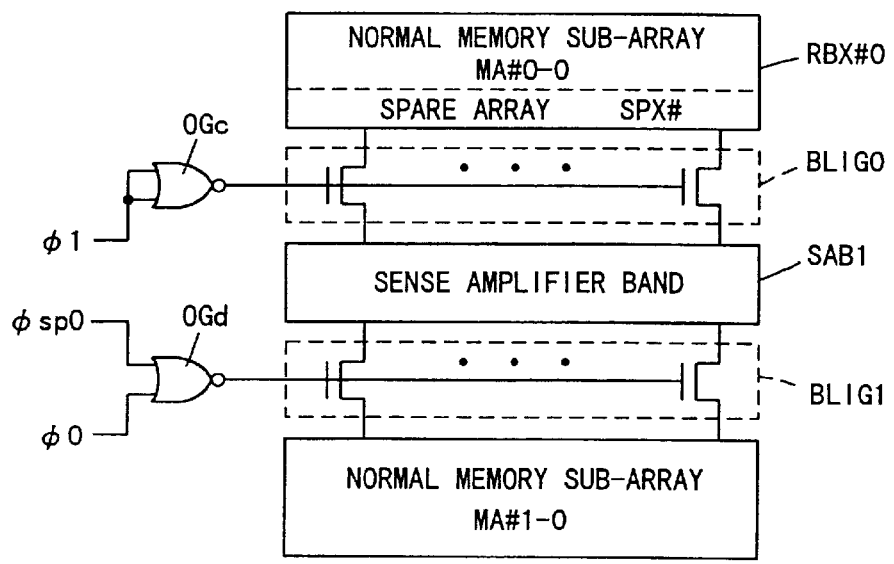
FIG. 14 is a schematic diagram of a bit line isolation instruction signal generation portion in the memory block arrangement shown in FIG. 11.

In FIG. 14, a 2-input NOR circuit OGc receiving sub-array designating signal φ1 is provided for bit line isolation gate BLIG0, and an NOR circuit OG receiving spare replacement instruction signal φsp0 and sub-array designating signal φ0 is provided for bit line isolation gate BLIG1. Spare replacement instruction signal φsp0 is driven into an active state, H level, when a defective normal word line is addressed in any of normal sub-arrays MA#0-0 to MA#0-N. Sub-array designating signal φ0 is driven into an active state, H level, when normal memory sub-array MA#0-0 is addressed, while sub-array designating signal φ1 is driven into an active state, H level, when normal memory sub-array MA#1-0 is addressed.

When spare array SPX#0 provided corresponding to sub-array MA#0-0 is used, normal memory sub-array MA#1-0 will not be addressed. This is because a spare word line included in spare array SPX#0 is selected when a defective normal word line included in normal memory sub-arrays MA#0-0 to MA#0-N is addressed. Also in this case, the output signal of NOR circuit OGc maintains an H level, the output signal of NOR circuit OGd attains an L level, and sense amplifier band SAB1 is connected to row block RBX#0 and disconnected from normal memory sub-array MA#1-0. Conversely, when normal memory sub-array MA#1-0 is addressed, the output signal of NOR circuit OGc attains an L level, row block RBX#0 is disconnected from sense amplifier band SAB1, and normal memory sub-array MA#1-0 is connected to sense amplifier band SAB1. (The output signal of NOR circuit OGd maintains an H level.)

The similar configuration is provided for the other row block RBX#1. Thus, a memory block including a spare array and a memory sub-array adjacent to this block will not be simultaneously addressed, so that defects can be accurately repaired.

Figure 15:
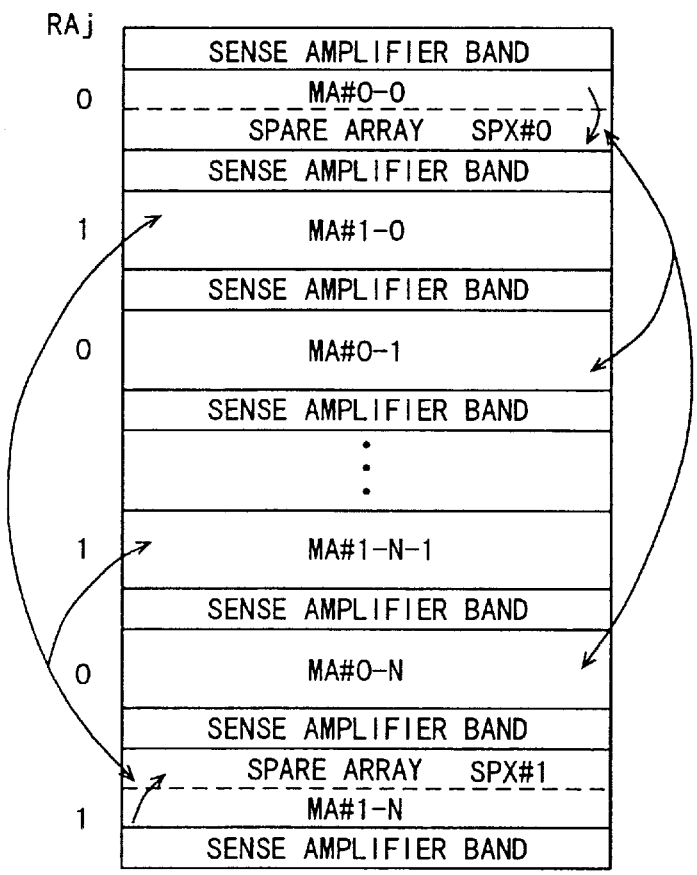
FIG. 15 is a schematic diagram depicting how a defective normal row is replaced with a spare row according to the fourth embodiment.

FIG. 15 is a schematic diagram showing an example of replacement of a defective normal word line in the semiconductor memory device according to the fourth embodiment of the invention. In FIG. 15, spare array SPX#0 includes spare word lines which can replace defective normal word lines in normal memory sub-arrays MA#0-0 to MA#0-N. Spare array SPX#1 includes spare word lines which can replace defective normal word lines included in normal memory sub-arrays MA#1-0 to MA#1-N. Normal sub-arrays sharing a sense amplifier band have different values in address signal bit RAj. Thus, erroneous operation caused by access conflict (simultaneous selection of a normal/spare word line) can be prevented, so that defects can be accurately repaired.

Fifth Embodiment

Figure 16:
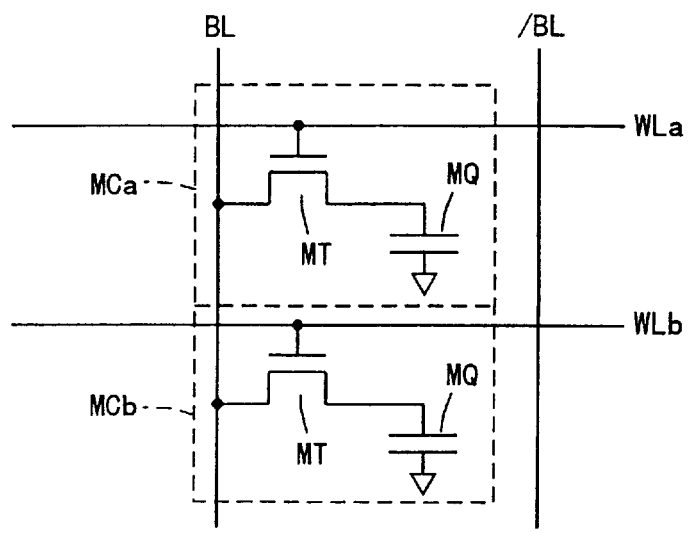
FIG. 16 is a diagram of a memory cell structure.

FIG. 16 is a diagram of a memory cell included in a semiconductor memory device. In FIG. 16, two memory cells MCa and MCb disposed corresponding to the crossing portions of word lines WLa and WLb and a bit line BL are represented. Memory cells MCa and MCb each include a capacitor MQ and an access transistor MT formed by an n-channel MOS transistor and responsive to the signal potential of a corresponding word line (WLa or WLb) for connecting capacitor MQ to bit line BL. These memory cells MCa and MCb are both a dynamic type memory cell, to which a pair of bit lines BL and /BL is provided, and the potential difference generated between bit lines BL and /BL is differentially amplified by a sense amplifier.

In the arrangement shown in FIG. 16, when word line WLa is driven into a selected state, the voltage level of non-selected word line WLb rises through the capacitive coupling by parasitic capacitance between word lines WLa and WLb, access transistor MT included in memory cell MCb is weakly turned on, and the stored charge of capacitor MQ is transmitted onto bit line BL. When selected word line WLa makes a transition to a non-selected state, the capacitive coupling between word line WLa and bit line BL causes the voltage level of bit line BL to be lowered (when bit line BL is driven to a ground voltage level), access transistor MT included in memory cell MCb connected to non-selected word line WLb is weakly turned on, and the stored charge of the capacitor is allowed to flow to bit line BL. Such a phenomenon of causing current leakage in a memory cell connected to a non-selected word line as another word line is selected is called "disturb refresh". If the charge holding characteristic of a memory cell is poor, the stored data in the memory cell is lost before a refresh operation is performed at a prescribed cycle, and a soft-error is caused. In order to test such "disturb refresh" characteristic, word lines are sequentially driven into a selected state and the charge holding characteristics of memory cells are tested, in other words, a "disturb refresh test" is performed. In the "disturb refresh test", in order to provide a prescribed number of disturbances to each memory cell, a word line is driven into a selected state a prescribed number of times.

If the storage capacity of a semiconductor memory device increases, the number of word lines increases accordingly, and time required for this "disturb refresh test" increases as well. In order to perform such disturb refresh test at a high speed, a larger number of word lines than the number of word lines selected at a time in a normal operation mode are simultaneously driven into a selected state in this disturb refresh test. In this case, although depending upon the way to select a word line, if the flexible redundancy scheme is employed, a spare word line and a normal word line in one sub-array may be simultaneously driven into a selected state to cause access conflict, the stored data in the memory cell is destroyed, and the disturb refresh test can no longer be performed. The arrangement which can prevent a normal word line and a spare word line in one memory sub-array from being simultaneously selected even if a larger number of word lines than the number in the normal operation mode are driven into a selected state in a disturb refresh test will be now described.

Figure 17:
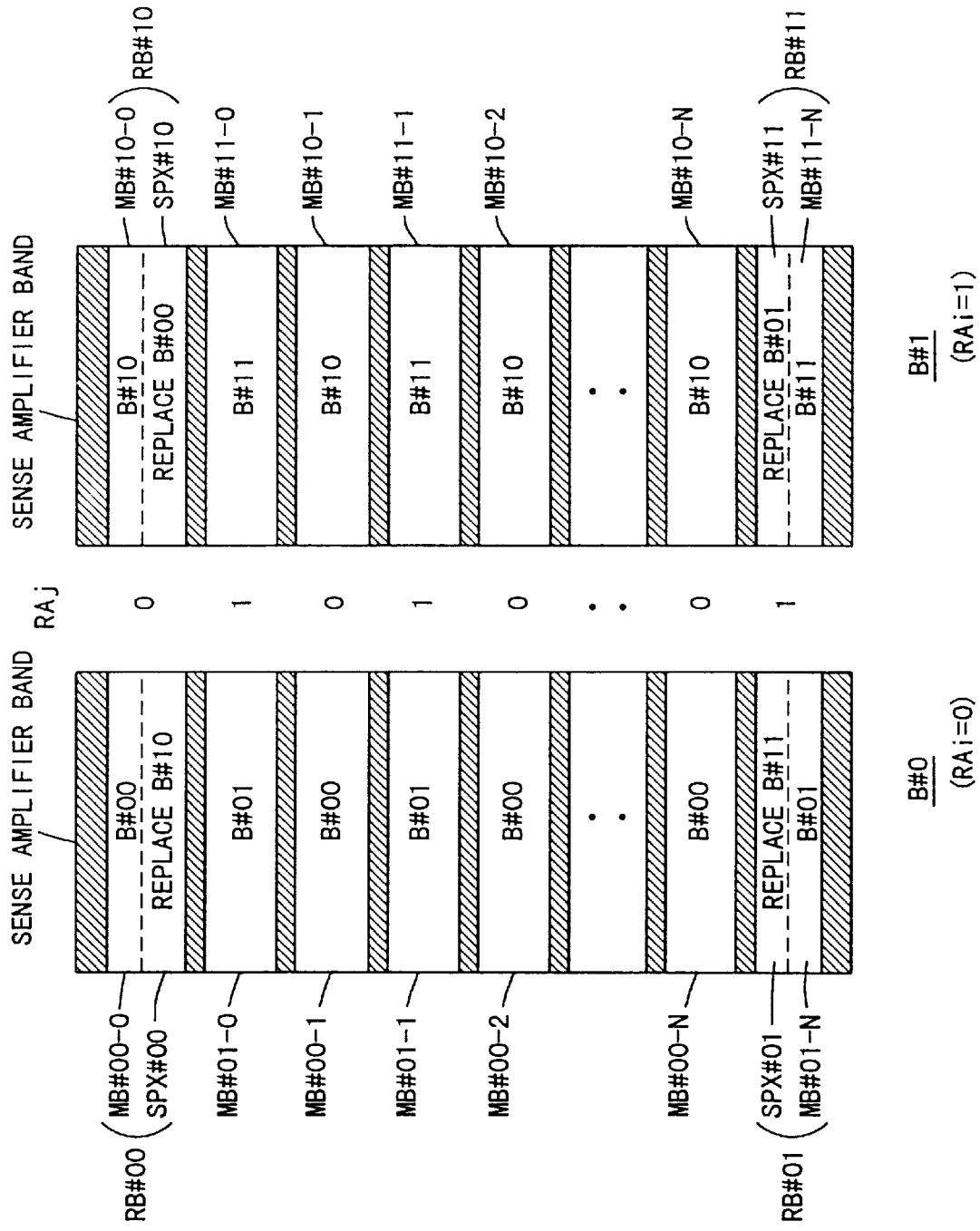
FIG. 17 is a schematic diagram of an array portion in a semiconductor memory device according to a fifth embodiment of the invention.

FIG. 17 is a schematic diagram showing the arrangement of an array portion in the semiconductor memory device according to the fifth embodiment of the invention. In FIG. 17, the memory array includes two memory mats B#0 and B#1. Memory mat B#0 includes normal memory sub-arrays MB#00-0 to MB#00-N and normal memory sub-arrays MB#01-0 to MB#01-N. Normal memory sub-arrays MB#00-0 to MB#00-N and normal memory sub-arrays MB#01-0 to MB#01-N are alternately disposed. Sense amplifier bands represented by shadowed regions are disposed between these normal memory sub-arrays MB#00-0 to MB#00-N and MB#01-0 to MB#01-N. A spare array SPX#00 including spare word lines is provided for normal sub-array MB#00-0, and a spare array SPX#01 including spare word lines is provided for normal memory sub-array MB#01-N.

Normal memory sub-array MB#00-0 and spare array SPX#00 form a row block (sense amplifier block) RB#00, while normal memory sub-array MB#01-N and spare array SPX#01 form a row block RB#01. Normal memory sub-array MB#00-0 to MB#00-N form a memory block group B#00 which is addressed when row address bit RAj for example is 1, while normal memory sub-arrays MB#01-0 to MB#01-N form a memory block group B#01 selected when row address signal bit RAj is for example 0.

Memory mat B#1 includes normal sub-arrays MB#10-0 to MB#10-N and normal memory sub-arrays MB#11-0 to MB#11-N. Normal memory sub-arrays MB#10-0 to MB#10-N and normal memory sub-arrays MB#11-0 to MB#11-N are provided alternately along the column direction. Sense amplifier bands represented by shadowed regions are provided between these normal memory sub-arrays MB#10-0 to MB#10-N and normal memory sub-arrays MB#11-0 to MB#11-N. A spare array SPX#10 including spare word lines is provided for normal memory sub-array MB#10-0, while a spare array SPX#11 is provided for normal memory sub-array MB#11-N. Normal memory sub-array MB#10-0 and spare array SPX#10 form a row block (sense amplifier block) RB#10-0, while normal memory sub-array MB#11-N and spare array SPX#11 form a row block RB#11-N. Normal memory sub-arrays MB#10-0 to MB#10-N are included in memory block group B#10, and normal memory sub-arrays MB#11-0 to MB#11-N are included in memory block group B#11.

In the array arrangement shown in FIG. 17, spare array SPX#00 provided in row block RB#00 includes spare word lines which can replace defective normal word lines in normal memory sub-arrays included in memory block group B#10. Spare array SPX#01 included in row block RB#01 includes spare word lines which can replace defective normal word lines in normal memory sub-arrays included in memory block group B#11. Spare array SPX#10 included in row block RB#10-0 includes spare word lines which can replace defective normal word lines in normal memory sub-arrays included in memory block group B#00. Spare array SPX#11 included in row block RB#11-N includes spare word lines which can replace defective normal word lines in normal memory sub-arrays included in memory block group B#01. The operation will be now described.

Figure 18A:
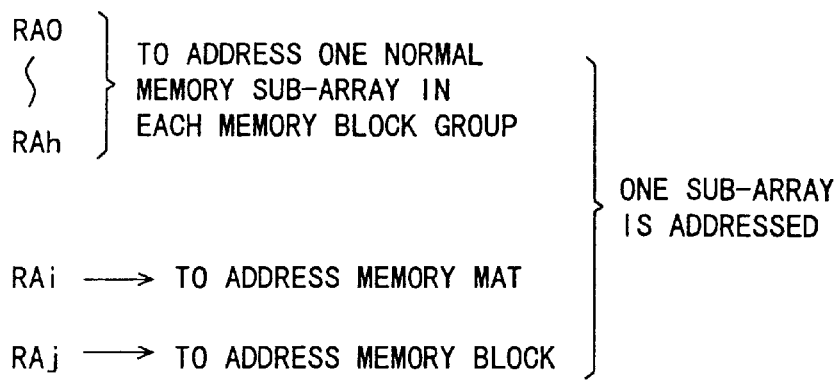
FIG. 18A shows the correspondence between address signal bits and a selected memory portion in a normal operation mode in the array arrangement shown in FIG. 17.

Now assume that one normal memory sub-array is addressed by address signal bits RA0 to RAh as shown in FIG. 18A. A memory mat is addressed by row address signal bit RAi, and a memory block group is addressed by row address signal bit RAj.

In the normal operation mode, these address signal bits RA0 to RAj are all valid, and one mat is addressed, in which one memory block group is addressed and one normal sub-array is addressed in the addressed memory block group. If an addressed word line is a defective word line, a spare word line to replace the defective word line is included in a memory mat different from the selected memory mat. Therefore, the defective normal word line can be replaced without any problem (without problems associated with the sharing of a sense amplifier band).

Figure 18B:
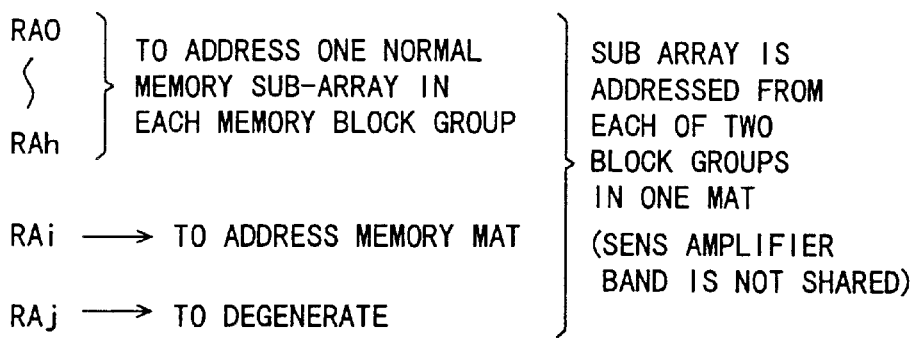
FIG. 18B shows the correspondence between address signal bits and a selected memory block in a test mode.

Meanwhile, assume that row address signal bit RAj is in a degenerated state as shown in FIG. 18B in a test operation mode different from the normal operation mode. Thus, one of memory mats B#0 and B#1 is addressed, and one normal memory sub-array is addressed from each of two memory block groups in the addressed memory mat. Since the two normal memory sub-arrays are addressed in one memory mat, address signal bits are allocated so that normal sub-arrays which do not share a sense amplifier band are addressed in the selecting operation. A corresponding spare word line used if the addressed normal word line is a defective normal word line is prepared in a non-selected memory mat. As a result, even if a plurality of (two) normal word lines are simultaneously addressed in one memory mat, a spare word line and a normal word line are prevented from being driven into a selected state at a time in row blocks RB#00, RB#01, RB#10 and RB#11. In a non-selected memory mat, a spare word line in a row block is simply driven into a selected state upon replacing a defective normal word line, and problems associated with sharing a sense amplifier band are not present.

If, for example, in the test operation mode, memory mat B#0 is addressed and a normal memory sub-array is selected from both memory block groups B#00 and B#01, a corresponding spare word line is prepared in a spare array SPX#10 included in row block RB#10 and/or in spare array SPX#11 included in row block RB#11 in non-selected memory mat B#1. As a result, since the memory mat in which a spare word line is selected and the memory mat in which a normal word line is selected are different, a normal word line and a spare word line are prevented from being selected at a time in one memory mat. By appropriately allocating address signal bits, two normal sub-arrays which do not share a sense amplifier band can be driven into a selected state in one memory mat. Note that if the number of memory mats is increased, the number of normal word lines driven into a selected state at a time can be further increased.

Figure 19:
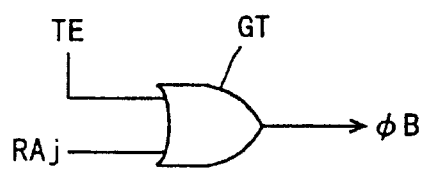
FIG. 19 is a schematic diagram of an example of a control portion to select a memory block in the test mode shown in FIG. 18B.

FIG. 19 is a diagram showing a portion for changing the number of sub-arrays to be selected depending upon the operation mode. In FIG. 19, there is provided a gate circuit (OR circuit) GT which receives address signal bit RAj and a test mode instruction signal TE. When test mode instruction signal TE attains an active state of H level, memory block group designating signal φB attains an active state, H level, regardless of the value of row address signal bit RAj. As a result, in the test operation mode, row address signal bit RAj can be pulled to a degenerated state, and normal sub-arrays can be addressed from two memory block groups in one memory mat.

In order to address normal sub-arrays which do not share a sense amplifier band, the address of one memory block group and the address of the other memory block group need only be allocated in the opposite directions. (If one memory block group is allocated with addresses 0 to N from the top to the bottom along the column direction, normal sub-arrays in the other memory group are sequentially allocated with addresses 0 to N from the bottom to the top.)

As for the connection between a sense amplifier band and a spare array and the sensing operation in a non-selected memory mat, a spare decoder is constantly operated for comparison, and the comparison result is applied to a spare array for each row block in the same manner as that shown in FIG. 14. A sense amplifier control circuit provided for a corresponding row block has only to be activated when the output signal of the spare decoder is active. Thus, when a spare word line is used in a non-selected memory mat, a corresponding sense amplifier can be activated.

For data accessing, the configuration the same as that shown in FIG. 4 may be employed (in the disturb refresh test, data accessing is not performed.)

Modification

Figure 20:
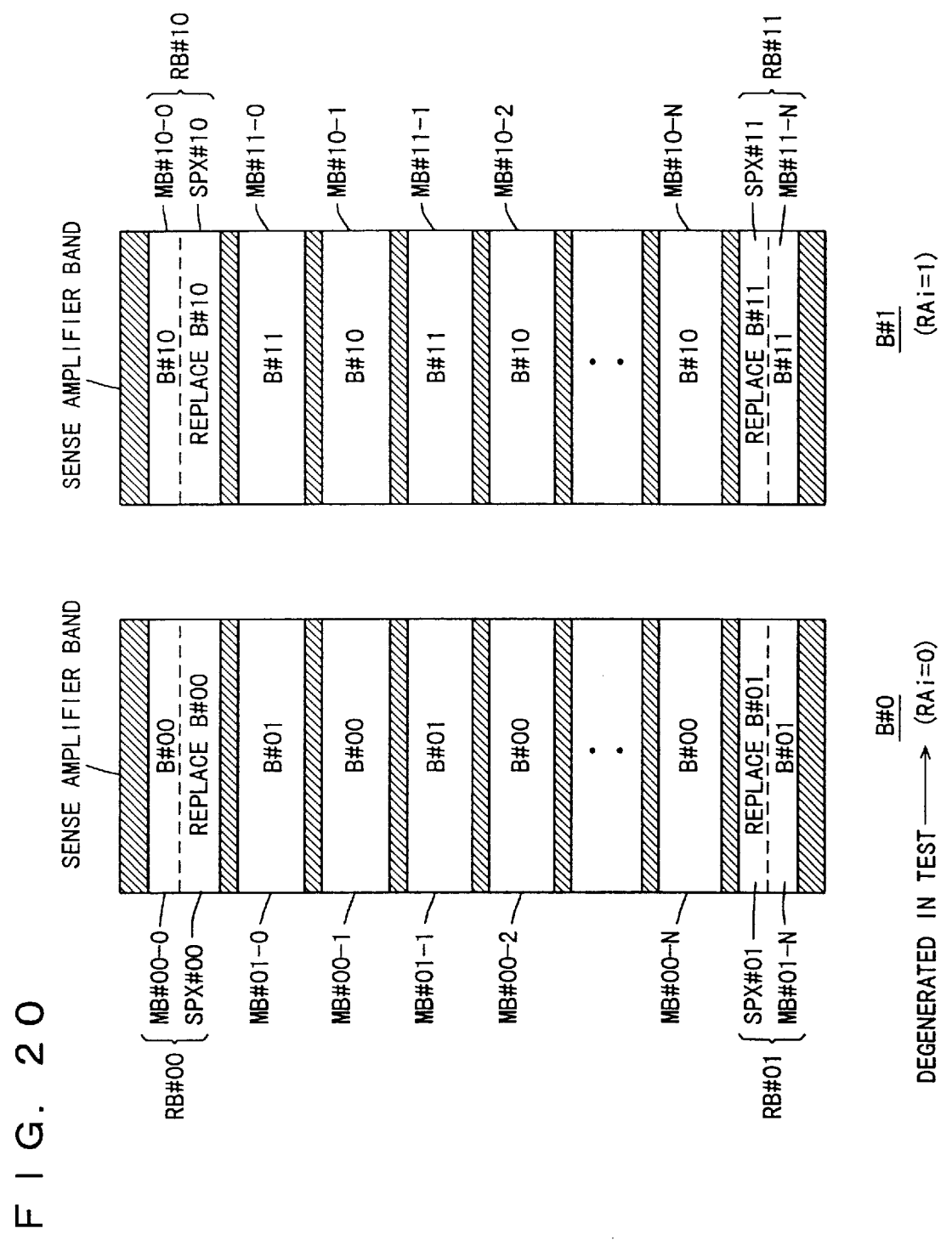

FIG. 20 is a schematic diagram of a modification of the fifth embodiment according to the invention. In FIG. 20, similarly to the arrangement shown in FIG. 17, the memory array is divided into two memory mats B#0 and B#1. In memory mat B#0, normal memory sub-arrays MB#00-0 to MB#00-N belonging to memory block group B#00 and normal memory sub-arrays MB#01-0 to MB#01-N included in memory block group B#01 are alternately provided along the column direction. Spare array SPX#00 is provided for normal memory sub-array MB#00-0, while spare array SPX#01 is provided for normal memory sub-array MB#01-N. Spare array SPX#00 includes a plurality of spare word lines which can replace defective normal word lines in normal memory sub-arrays belonging to memory block group B#00, while spare array SPX#01 includes spare word lines which can replace defective normal word lines in normal memory sub-arrays belonging to memory block group B#01.

In memory mat B#1, normal memory sub-arrays MB#10-0 to MB#10-N included in memory block group B#10 and normal memory sub-arrays MB#11-0 to MB#11-N included in memory block group B1#11 are alternately provided along the column direction. Spare array SPX#10 is provided for normal memory sub-array MB#10-0, while spare array SPX#11 is provided for normal memory sub-array MB#11-N. Spare array SPX#10 includes a plurality of spare word lines which can replace defective normal word lines in normal memory sub-arrays included in memory block group B#10, while spare array SPX# 11 includes a plurality of spare word lines which can replace defective normal word lines in normal sub-arrays included in memory block group B#11.

Also in the arrangement shown in FIG. 20, sense amplifier bands represented by shadowed regions are provided between normal sub-arrays.

In this arrangement shown in FIG. 20, in the normal mode, one of memory mats B#0 and B#1 is selected, and one normal memory sub-array is selected in the selected memory mat. As a result, in the selected one memory mat, a normal word line is selected and a defective normal word line is repaired by replacement in the same manner as that shown in FIG. 11.

In the test mode, row address signal bit RAi, for example, is pulled to a degenerated state, and memory mats B#0 and B#1 are both addressed. In each of these memory mats B#0 and B#1, one normal sub-array is selected. In each of memory mats B#0 and B#1, normal sub-arrays included in different memory block groups are alternately provided, and normal sub-arrays sharing a sense amplifier band are included in different memory block groups. Therefore, in the test mode, normal memory sub-arrays sharing a sense amplifier are prevented from being addressed at the same time, in other words problems of sense amplifier conflict can be prevented, so that a plurality of (two) normal word lines or spare word lines can be equivalently driven into a selected state for testing operation. (In any of row blocks RB#00 to RB#11, a word line and a spare word line will not be driven into a selected state at the same time.) Thus, the disturb refresh test can be performed at a high speed.

Note that in this fifth embodiment, the disturb refresh test has been described. However, if a larger number of word lines than that in the normal operation mode are driven into a selected state in the self refresh mode, a self refresh instruction signal can be used in place of the test mode instruction signal and the same effects are provided. The configuration to degenerate address signal bit RAi (the address signal bit to address a memory mat) in the modification can be the same configuration as that shown in FIG. 19.

As described above, according to the fifth embodiment of the invention, when a plurality of memory mats are provided, and a larger number of normal word lines than the number in the normal operation mode are driven into a selected state in a particular operation mode such as the disturb refresh test, a normal word line and a spare word line in one row block are not simultaneously driven into a selected state, the advantageous characteristic feature of the flexible redundancy scheme, in other words, the efficient use of spare decoders and spare word lines is not impaired and prescribed operation modes can be accurately implemented.

Note that by increasing the number of memory mats in this modification, a larger number of normal word lines (4, 8) can be readily driven into a selected state at a time.

Sixth Embodiment

Figure 21A:
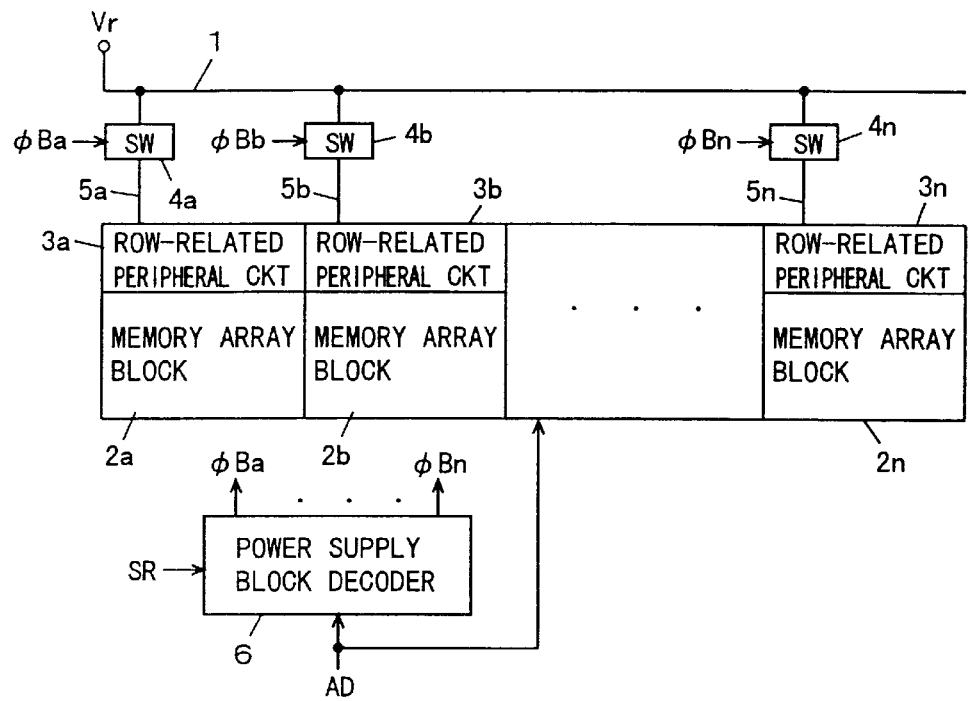
FIG. 21A is a schematic diagram of a hierarchical power supply arrangement 1 according to a sixth embodiment of the invention.

FIG. 21A is a schematic diagram showing a structure of a main part of a semiconductor memory device according to a sixth embodiment of the invention. In FIG. 21A, the memory array is divided into a plurality of memory array blocks 2a to 2n. Memory array blocks 2a to 2n each include a plurality of memory cells arranged in a matrix of rows and columns. A memory cell row is selected on a block basis. Row-related peripheral circuits 3a to 3n to drive memory cell rows in memory array blocks 2a to 2n into a selected state are provided for memory array blocks 2a to 2n, respectively. These row-related peripheral circuits 3a to 3n which will be described in detail each include a decode circuit (which may include a predecoder) to decode an address signal and a word line drive circuit to drive a memory cell row into a selected state according to the output signal of the decode circuit.

Power supply switch circuits (SW) 4a to 4n driven into a selected state in response to selecting signals φBa to φBn are provided between row-related peripheral circuits 3a to 3n and a main power supply line 1. These power supply switch circuits 4a to 4n each cause a greater current flow when driven into a selected state than when driven into a non-selected state. Main power supply line 1 is supplied with a prescribed voltage Vr. Voltage Vr may be any of a power supply voltage Vcc, a ground voltage Vss and a high voltage Vpp or a combination of these voltages. A suitable voltage is selected as voltage Vr depending upon the configuration of row-related peripheral circuits 3a to 3n.

In order to determine selection/non-selection of power switch circuits 4a to 4n, a power supply block decoder 6 to generate selecting signals φBa to φBn (generically represented as a control signal) based on an address signal AD and a self refresh mode instruction signal SR is provided. Address signal AD is applied to row-related peripheral circuits 3a to 3n as a memory cell row (word line) address.

Power supply block decoder 6 changes the number of power supply circuits driven into a selected state between a normal operation mode and a self refresh mode. Power supply block decoder 6 changes the selecting sequence of power supply switch circuits 4a to 4n between the self refresh mode and the normal mode. Based on these characteristics, if a spare word line is included in memory array blocks 2a to 2n, a semiconductor memory device operating with low current consumption without increasing the accessing time can be implemented.

Figure 21B:
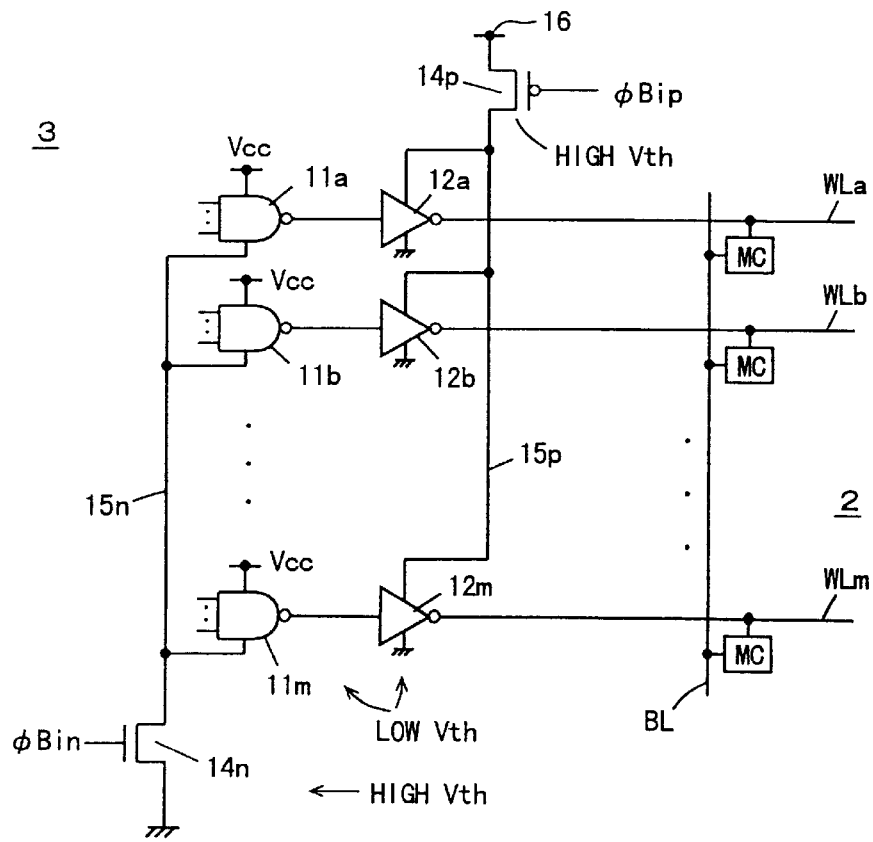
FIG. 21B is a diagram of a power switch circuit in a row-related peripheral circuit shown in FIG. 21A.

FIG. 21B is a diagram-showing an example of row-related peripheral circuits 3a to 3n shown in FIG. 21A. In FIG. 21B, one row-related peripheral circuit 3 is representatively shown.

In memory array block 2 (2a to 2n), memory cells MC are arranged in a matrix of rows and columns, and word lines WLa to WLm are provided for memory cells MC, respectively. A bit line pair BL, /BL is provided for each column of memory cells, but only bit line BL is shown in FIG. 21.

Row-related peripheral circuit 3 includes repeating circuits provided corresponding to word lines WLa to WLn. Herein, the repeating circuits have the same configuration and the same function. A prescribed number of repeating circuits among the plurality of repeating circuits are selected by an address signal.

In FIG. 21B, a repeating circuit includes an NAND-type decode circuit 11 (11a to 11m), and a word line drive circuit 12 (12a to 12m) to drive a corresponding word line WL (WLa to WLm) into a selected state.

In a stand-by cycle, the output signals of NAND-type decode circuits 11a to 11m are at an H level. As a result, in the stand-by cycle, in these NAND-type decode circuits 11a to 11m, a sub-threshold leakage current to the ground node is generated. Therefore, NAND-type decode circuits 11a to 11m have each ground node coupled to a sub-ground line 15n. Sub-ground line 15n is coupled to the ground node through a power supply switch transistor 14n. Power supply switch transistor 14n turns on in response to control signal φBin.

Meanwhile, in inverter-type word line drive circuits 12a to 12m, the input signals are at an H level in a stand-by cycle, and a sub-threshold leakage current flows thereinto from the power supply node. As a result, the power supply nodes of these inverter-type word line drive circuits 12a to 12m are coupled to a sub-power supply line 15p. Sub-power supply line 15p is coupled to a voltage source node 16 through a power supply switch transistor 14p which conducts in response to a selecting signal φBip. Voltage source node 16 is supplied with power supply voltage Vcc or high voltage Vpp. The voltage applied to voltage source node 16 is appropriately determined depending upon the configuration of the repeating circuit.

NAND-type decode circuits 11a to 11m each have the other power supply node coupled together to the main power supply line, and the ground nodes of inverter-type word line drive circuits 12a to 12m are coupled to the main ground line.

In a stand-by cycle, control signal φBin is set to an L level (ground voltage level), while control signal φBip is set to an H level of the voltage level of node 16. Thus, power supply switch transistors 14n and 14p are turned off. These power supply switch transistors 14n to 14p have a large threshold voltage (high-Vth), and the sub-threshold leak currents are extremely small in the off state. Meanwhile, NAND-type decode circuits 11a to 11m and word line drive circuits 12a to 12m each include a low-Vth MOS transistor as a component. As a result, the current consumption in the repeating circuits, or the row-related peripheral circuits in a stand-by cycle can be reduced. Since these repeating circuits operate at a high speed, the accessing time can be reduced as well.

In the correspondence between FIGS. 21A and 21B, power supply switch circuits 4a to 4n correspond to power supply switch transistors 14n to 14p, while sub-power supply voltage source lines 5a to 5n correspond to sub-ground line 15n and sub-voltage supply line 15p. The ground node and voltage source node 16 correspond to main ground line and main power supply line 1, respectively. Now, the specific manner to select power supply switch circuits 4a to 4n will be described.

For the purpose of simplifying the description, a selecting operation when a spare line is not included will be described.

Hierarchical Power Supply Arrangement 1

FIG. 22 is a schematic diagram showing a main part of a semiconductor memory device according to the sixth embodiment of the present invention. In FIG. 22, a memory array is divided into eight memory blocks MAB1 to MAB8. Memory blocks MAB1 to MAB8 each include a memory block 2 (2a to 2n) and a corresponding row-related peripheral circuit 3 (3a to 3n) shown in FIG. 21A. Memory blocks MAB1 to MAB4 form one global block GAB0, while memory blocks MAB5 to MAB8 form one global block GAB1.

Power supply switch circuits SW1 to SW8 are provided for memory blocks MAB1 to MAB8, respectively. These power supply switch circuits SW1 to SW8 couple sub-power supply lines provided corresponding to memory blocks MAB1 to MAB8 and corresponding memory blocks.

In allocating addresses, three address signal bits RA1, AR2 and RA3 are used to address a block. Address bit RA1 specifies one of global blocks GAB0 and GAB1. A combination of address bits RA2 and RA3 specifies one memory block in global blocks GAB0 and GAB1. As a result, by these 3 address signal bits RA1 to RA3, one memory block can be selected for selecting a memory cell row.

FIG. 23A illustrates the manner of selecting memory block and a power supply switch circuit in a normal operation mode. In FIG. 23A, in the normal operation mode, one of memory blocks MAB1 to MAB8 is selected and an addressed word line is driven into a selected state. In FIG. 23A, a word line WL in memory block MAB2 is driven into a selected state as an example. When memory block MAB2 is selected, power supply switch circuits SW1 to SW4 provided for global block GAB0 including memory block MAB2 are all driven into a selected state.

As shown in FIG. 23B, the set of power supply switch circuits SW1 to SW4 or the set of power supply switch circuits SW5 to SW8 is selected by address signal bit RA1. As a result, by decoding 1-bit address signal, control signals φB1 to φB4 for the power supply switch circuits can be driven into a selected state, so that a prescribed voltage can be supplied at a fast timing in an access cycle.

Meanwhile, in order to select memory block MAB2, 3 address signal bits RA1 to RA3 should be decoded. Considering the timing skew of these 3 address signal bits RA1 to RA3, a row-decoding operating for activating memory block address signal φB2 is performed. Thus, compared to the case of decoding 1-bit address signal, the load of the output signal line of the decode circuit is greater in the case of decoding 3 address signal bits, and the skew prolongs the decoding time.

Therefore, in the normal operation mode, the power supply switch circuits for a global block including selected memory block MAB2 are driven into a selected state, so that a prescribed voltage can be supplied stably to the selected memory block at a fast timing after the start of an active cycle in the normal operation mode, and the accessing time can be prevented from increasing.

Figure 24:
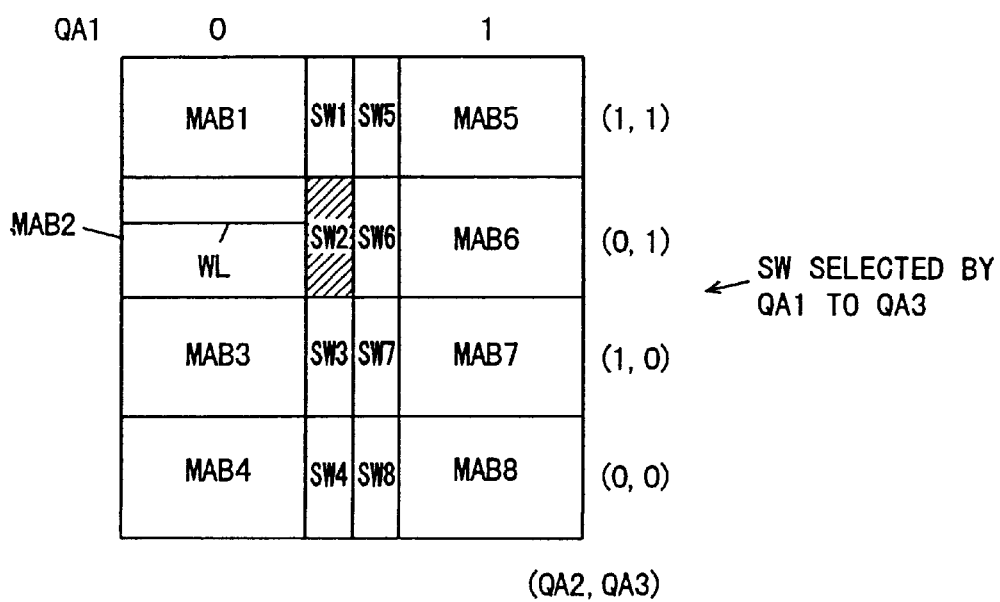
FIG. 24 is a schematic diagram of the selected state of the hierarchical power supply arrangement in FIG. 22 in a refresh mode.

FIG. 24 is a diagram showing the manner to select a power switch circuit in a refresh mode. In FIG. 24, also in the refresh mode, a word line WL is selected in one memory block. Also in FIG. 24, memory block MAB2 is selected, in which word line WL to be refreshed is selected. In the refresh mode, only power supply switch circuit SW2 provided for the selected memory block MAB2 is driven into a selected state. The other power supply switch circuits SW1, SW3 to SW8 are maintained in a non-selected state. In the refresh mode, stored data is simply rewritten, and data accessing is not performed. As a result, a high speed accessing is not required, and therefore 3 refresh address signal bits QA1 to QA3 can be used to select this power supply switch circuit without any problem. By driving one power supply switch circuit into a selected state while maintaining the other power supply switch circuits in a non-selected state, a current flowing through the power supply circuit is reduced, the current consumption in the refresh mode can be restrained from increasing, in other words, the refresh mode with reduced current consumption can be implemented.

Figure 25:
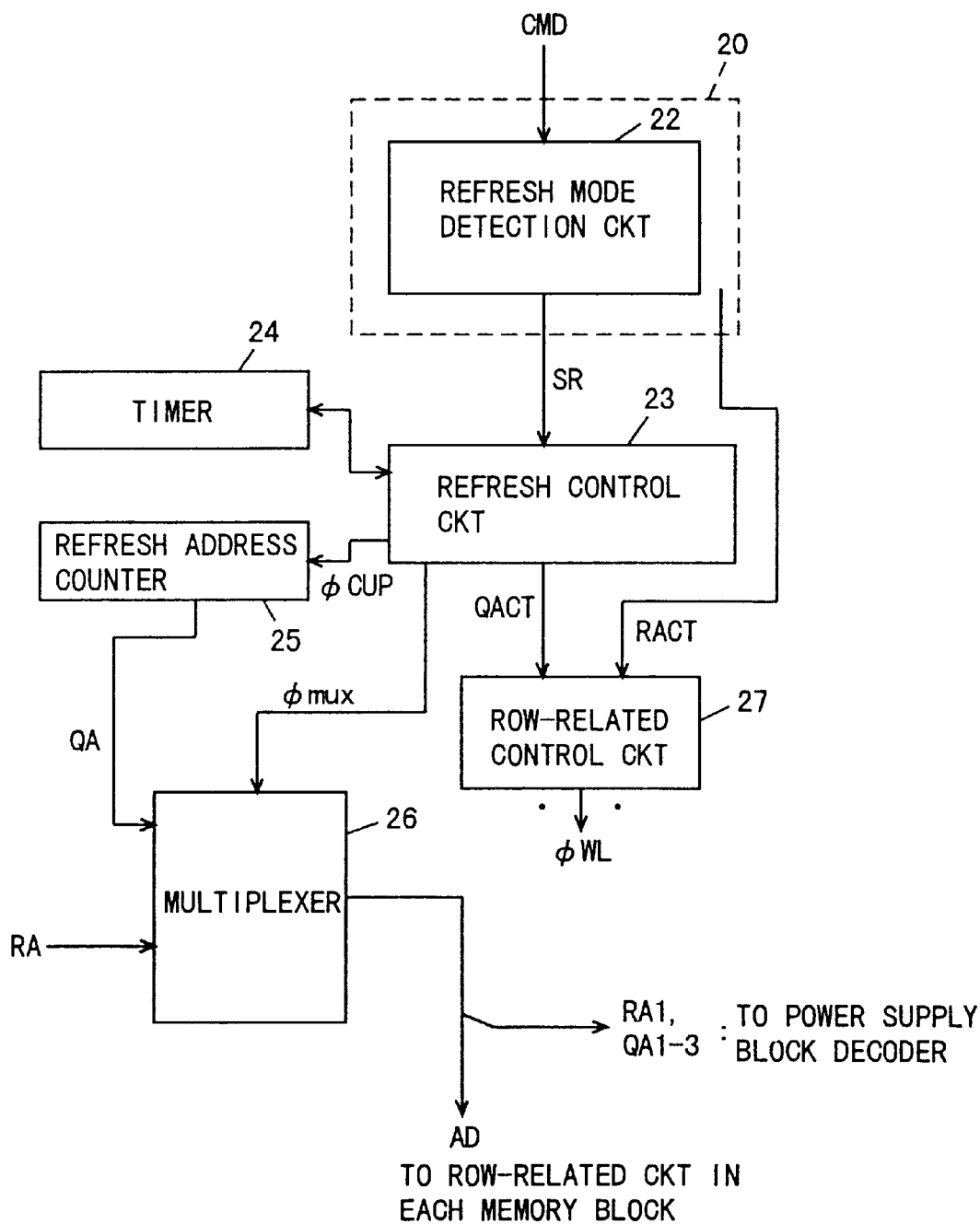
FIG. 25 is a schematic diagram of a row-related control portion in the semiconductor memory device according to the sixth embodiment.

FIG. 25 is a schematic diagram showing a control portion in the semiconductor memory device according to the sixth embodiment. In FIG. 25, the semiconductor memory device includes an operation mode detection circuit 20 which receives an externally applied control signal CMD and generates an operation mode instruction signal, a refresh control circuit 23 which is activated in response to an activation of a self refresh mode instruction signal SR from refresh mode detection circuit 22 to activate a timer 24 and generate a refresh cycle activation signal QACT at prescribed time intervals, a refresh address counter 25 which performs a counting operation in response to a count up instruction signal φCUP from refresh control circuit 23 and generates a refresh address specifying a refresh row, a multiplexer 26 which selects one of a refresh address signal QA from refresh address counter 25 and an externally applied row address signal RA under the control of refresh control circuit 23, and a row-related control circuit 27 which generates control signals necessary for selecting a row according to refresh cycle activation signal QACT from refresh control circuit 23 or array activation signal RACT from an array activation detection circuit included in operation mode detection circuit 20.

Operation mode detection circuit 20 generates an instruction signal corresponding to an operation mode designated according to externally applied control signal CMD. The externally applied control signal CMD may be a command (a combination of states of a plurality of control signals) in a normal synchronous type semiconductor memory device, or may be a row address strobe signal /RAS, a column address strobe signal /CAS, a write enable signal /WE and a chip select signal /CS as in a standard DRAM (Dynamic Random Access Memory). The external control signal applied to operation mode detection circuit 20 may be appropriately determined depending upon the configuration of the semiconductor memory device.

Refresh control circuit 23 drives refresh cycle activation signal QACT into an H level, active state for a prescribed time period at prescribed time intervals according to a count up signal from timer 24 when self refresh mode instruction signal SR is activated. Row-related control circuit 27 generates control signals necessary for selecting a row when one of activation signals QACT and RACT is activated. In FIG. 25, row-related control circuit 27 generates a word line driving signal φWL which gives a timing for driving a word line into a selected state. During the activation period of these activation signals QACT and RACT, in a memory block addressed by an address signal, a row (word line) is maintained in a selected state. The activation period of these activation signals QACT and RACT defines one memory cycle (for a selected memory block).

Timer 24 responds to a self refresh instruction from refresh control circuit 23 to generate a refresh request signal at prescribed time intervals for application to refresh control circuit 23. Refresh address counter 25 increments or decrements the count value by 1 according to count up instruction signal φCUP applied at the end of this memory cycle. Multiplexer 26 selects refresh address QA from refresh address counter 25 in the self refresh mode according to a switch control circuit φMUX from refresh control circuit 23 and selects externally applied row address signal RA in the normal mode. Address signal AD from multiplexer 26 is applied to a row-related peripheral circuit in each memory block. In the address signal, address signal bits QA1 to QA3 or RA1 are applied to a power supply block decoder (see FIG. 21A). Since the address signal bits are transmitted through the same bus lines from multiplexer 26, 3 address signal bits are applied to the power supply block decoder through the same address signal lines, and then these address bits are supplied in different paths within power supply block decoder 6.

Figure 26:
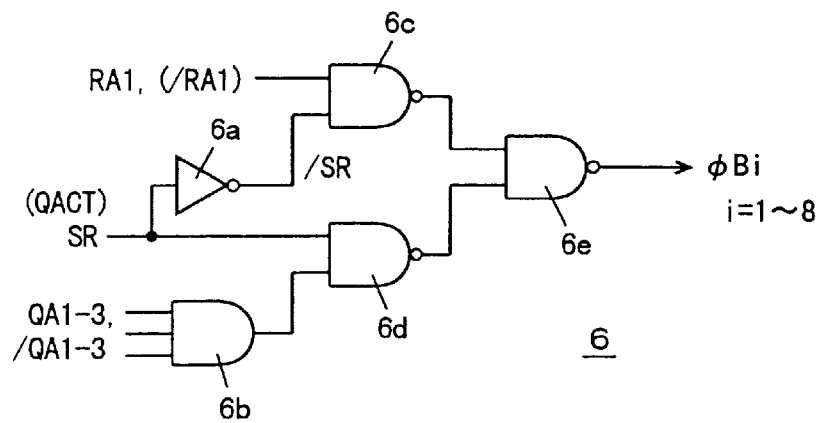
FIG. 26 is a diagram of an example of a power supply block decoder shown in FIG. 21.

FIG. 26 is a diagram showing a structure of power supply block decoder 6 shown in FIG. 21A. In FIG. 26, a portion to generate one power supply block selecting signal φBi (i=1 to 8) is shown. In FIG. 26, power supply block decoder 6 includes an inverter circuit 6a which inverts self refresh instruction signal SR, an AND circuit 6b which receives prescribed 3 address signal bits among address signal bits QA1 to QA3 and /QA1 to /QA3 in the refresh mode, an AND circuit 6c which receives the output signal /SR of inverter circuit 6a and address bit RA1 or /RA1, an AND circuit 6d which receives self refresh mode instruction signal SR and the output signal of AND circuit 6b, and an AND circuit 6e which receives the output signals of AND circuits 6c and 6d and generates power supply block selecting signal φBi. AND circuit 6b is supplied with address signal bits corresponding to the address of a memory block provided corresponding to power supply block selecting signal φBi. Similarly to NAND circuit 6c, address bit RA1 or /RA1 to specify a global block including a memory block corresponding to power supply block selecting signal φBi is applied.

In the self refresh mode, self refresh mode instruction signal SR is at an H level, signal /SR from inverter circuit 6a is at an L level, and NAND circuit 6c outputs an H level signal regardless of the states of address bits RA1 and /RA1. Meanwhile, NAND circuit 6a operates as an inverter to invert the output signal of AND circuit 6b. Therefore, in the self refresh mode, power supply block selecting signal φBi is generated according to address bits QA1 to QA3 and /QA1 to /QA3.

Meanwhile, in the normal operation mode, self refresh mode instruction signal SR is at an L level and the output signal /SR of inverter circuit 6a is an H level. In this state, the output signal of NAND circuit 6d attains an H level, NAND circuit 6c operates as an inverter, and power supply block selecting signal 4Bi is generated according to address bit RA1 or /RA1. Thus, in the normal mode, power supply block selecting signals φBi for a global block including a selected memory block (a memory block including a selected row) are activated. Meanwhile, in the self refresh mode, power supply block selecting signal φBi for a power supply switch circuit provided corresponding to a memory block to be refreshed is driven into a selected state.

Figure 27:
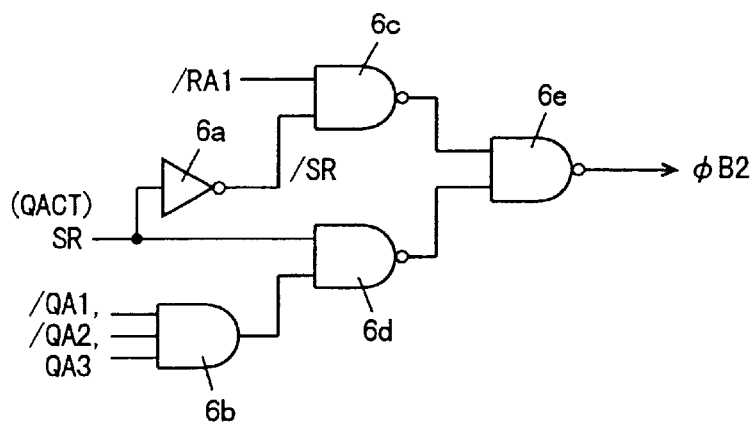
FIG. 27 is a diagram of a power supply block decode circuit for a power supply block selecting signal φB2.

FIG. 27 is a diagram showing a structure of a portion to generate power supply block selecting signal φB2 to power supply switch circuit SW2. For power supply block selecting signal φB2, AND circuit 6b receives address bits /QA1, /QA2 and QA3, and NAND circuit 6c receives address bit /RA1. The address (QA1, QA2, QA3) of a memory block having power supply switch circuit SW2 is (0, 0, 1). Therefore, when memory block MAB2 is addressed, the output signal of AND circuit 6b attains an H level. Meanwhile, in the normal mode, address bit /RA1 attains an H level ("1"), and power supply block selecting signals φB1 to φB4 to power supply switch circuits SW1 to SW4 provided corresponding to global block GB0 including memory block MAB2 are driven into an H level, selected state. By changing the number of decoded bits depending upon the operation mode, the number of power supply switch circuits driven into a selected state can be changed between the normal mode and the self refresh mode.

If the number of memory blocks are 8, there are two global blocks, a 1-bit address signal is decoded in the normal mode, while a 3-bit address signal is decoded in the self refresh mode. However, the number of address signal bits used in the normal mode and self refresh mode can be appropriately determined depending upon the number of memory blocks and global blocks. The number of address signal bits validated in the normal mode has only to be smaller than the number of address signal bits decoded in the self refresh mode.

Modification

Figure 28:
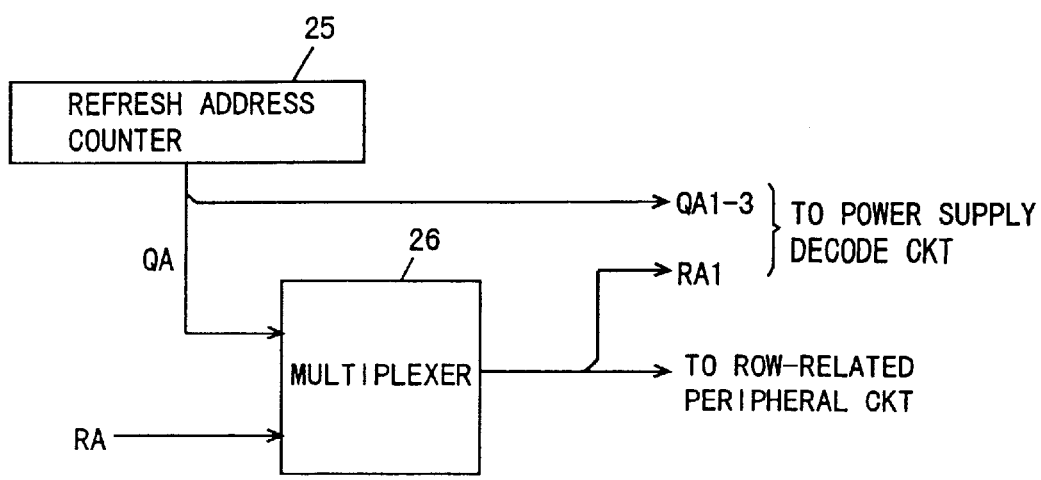
FIG. 28 is a schematic diagram depicting how address bits are allocated in hierarchical power supply arrangement 1 according to the sixth embodiment.

FIG. 28 is a schematic diagram showing a modification of hierarchical power supply arrangement 1 according to the sixth embodiment of the invention.

In the configuration shown in FIG. 28, refresh address QA from the refresh address counter and externally applied row address signal RA are applied to multiplexer 26. The row-related peripheral circuit is supplied with an internal row address signal from multiplexer 26. Meanwhile, address bits QA1 to QA3 from refresh address counter 25 and internal row address bit RA1 from multiplexer 26 are applied to a power supply block decode circuit. In this configuration, refresh address bits QA1 to QA3 are directly applied to the power block decode circuit from refresh address counter 25. Since the address bits do not pass through multiplexer 26, the influence of gate delay (signal propagation delay) in multiplexer 26 is eliminated in the self refresh mode, and a decoding operation can be performed at a fast timing.

As described above, according to hierarchical power supply arrangement 1, the number of address bits used for selecting a power supply block is changed between the normal mode and refresh mode, the accessing time in the normal mode is not increased, and the current consumption can be reduced in the refresh mode.

Modification 2

Figure 29:
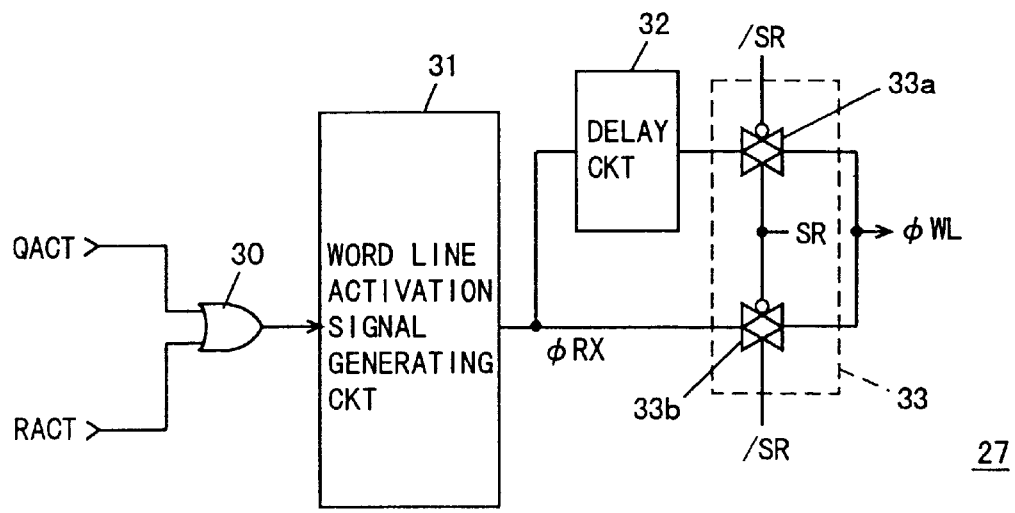
FIG. 29 is a diagram of a modification of the hierarchical power supply arrangement according to the sixth embodiment.

FIG. 29 is a schematic diagram showing a modification 2 of hierarchical power supply arrangement 1. In FIG. 29, the configuration of a part of row-related control circuit 27 shown in FIG. 25 is shown. In FIG. 29, row-related control circuit 27 includes an OR circuit 30 which receives activation signals QACT and RACT, a word line activation signal generation circuit 31 which is responsive to a rising of the output signal of OR circuit 30 for driving a word line activation signal φRX into an active state, a delay circuit 32 which delays word line activation signal φRX from word line activation signal generation circuit 31 by a prescribed time period, and a selecting circuit 33 which selects one of the output signal of delay circuit 32 and signal φRX from word line activation signal generation circuit 31 according to self refresh mode instruction signals SR and /SR to generate a word line driving signal φWL. Selecting circuit 33 includes a CMOS transmission gate 33a which conducts to pass the output signal of delay circuit 32 in response to an activation of self refresh mode instruction signal SR, and a CMOS transmission gate 33b which conducts to pass word line activation signal φRX from word line activation signal generation circuit 31 in response to an inactivation of self refresh mode instruction signal SR.

Figure 30:
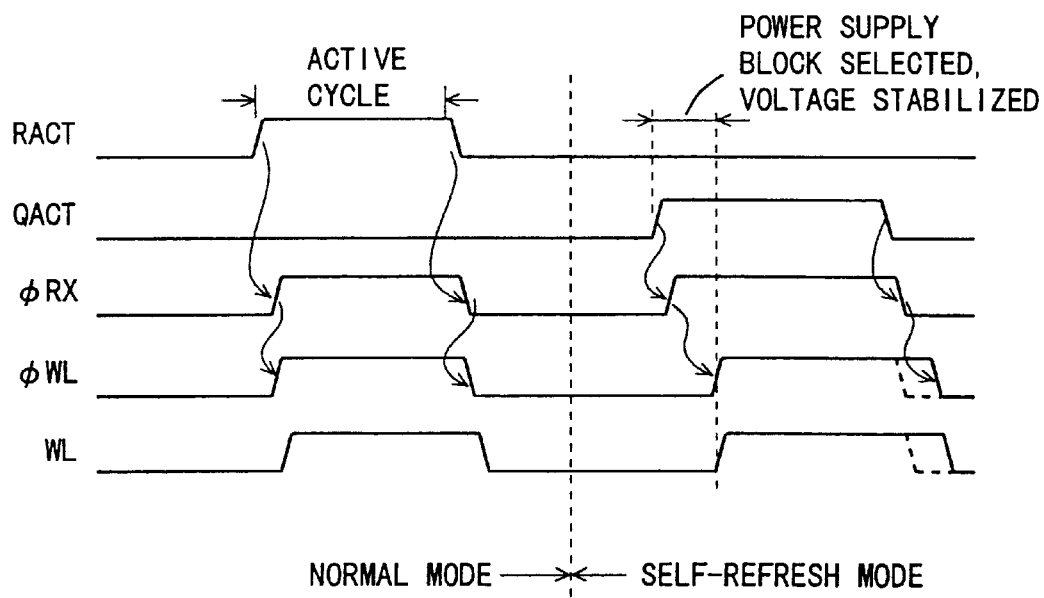
FIG. 30 is a signal waveform diagram representing the operation of the hierarchical power supply arrangement shown in FIG. 29.

The operation of row-related control circuit 27 will be described with reference to the signal waveform diagram in FIG. 30.

In a normal mode, array activation signal RACT is driven into an active state according to a memory cycle start instruction signal (or an active command). When array activation signal RACT is activated, the output signal of OR circuit 30 is activated, and word line activation signal generation circuit 31 generates word line activation signal φRX at a prescribed timing. In the normal mode, CMOS transmission gate 33b conducts, and CMOS transmission gate 33a is in a non-conductive state. As a result, word line driving signal φWL is generated according to word line activation signal φRX. When one active cycle completes, array activation signal RACT falls to an L level non-selected state, word line activation signal φRX is inactivated accordingly, and a selected word line is driven into a non-selected state.

In the self refresh mode, refresh activation signal QACT is activated. Word line activation signal generation circuit 31 responds to the activation of refresh activation signal QACT to drive word line activation signal φRX into an active state. In the self refresh mode, CMOS transmission gate 33a conducts, while CMOS transmission gate 33b is in a non-conductive state. As a result, word line driving signal φWL is driven into an active state according to a delayed word line activation signal from delay circuit 32.

By delaying the activation timing of word line driving signal φWL in the self refresh mode, after a power supply switch circuit is selected and a prescribed supply voltage to a memory block to be refreshed is stabilized, a word line is selected, so that a decoding operation can be performed accurately to drive the addressed word line (refresh row) into a selected state. As shown in the waveforms in FIG. 30, delay circuit 32 is a rising delay circuit, and word line driving signal φWL may be inactivated in response to an inactivation of refresh activation signal QACT. Even if a word line is driven into a selected/non-selected state with a delay to refresh activation signal QACT, the sense amplifier is activated/inactivated according to this word line driving signal φWL, and there will be no problem. The problem of so-called RAS precharge time is not caused particularly in the self refresh mode. In the self refresh mode, the refresh interval is, for example, as long as 16 μs, the RAS precharge time period can be sufficiently secured, even if such delay circuit 32 is used.

Figure 31:
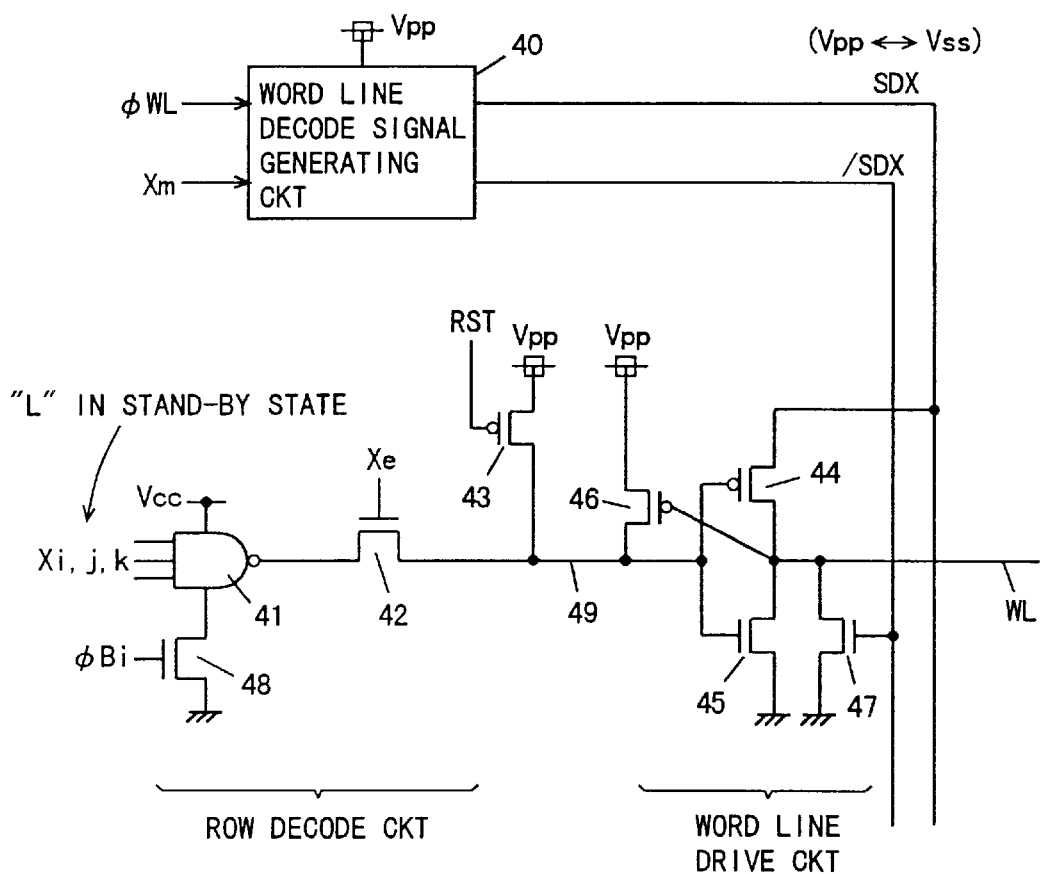
FIG. 31 is a diagram of a repeating circuit in a row-related peripheral circuit in the modification of hierarchical power supply arrangement 1.

FIG. 31 is a diagram showing a part of a row-related peripheral circuit operating according to word line driving signal φWL shown in FIG. 29. In FIG. 31, the configuration of a repeating circuit for one word line WL is shown. In FIG. 31, the repeating circuit includes an NAND-type decode circuit 41 which receives address bits (a predecode signal) Xi, Xj and Xk, a decode transistor 42 which is formed by an n-channel MOS transistor and selectively transmits the output of NAND-type decode circuit 41 onto a node 41 according to an address bit (predecode signal) X1, a p-channel MOS transistor 43 which responds to a reset signal RST to precharge a node 49 to high voltage Vpp level, a p-channel MOS transistor 44 which transmits a signal SDX from a word line decode signal generation circuit 40 onto a word line WX when the signal on node 49 is at an L level, an n-channel MOS transistor 45 which conducts when the signal on node 49 is at an H level to discharge word line WL to a ground voltage level, a p-channel MOS transistor 46 which conducts when the signal on word line WL is at an L level to maintain node 49 at high voltage Vpp level, and an n-channel MOS transistor 47 which conducts when signal /SDX from word line decode signal generation circuit 40 is at an H level to discharge word line WL to the ground voltage level.

Herein, the decode circuit is formed by NAND-type decode circuit 41 and decode transistor 42. The word line drive circuit is formed by MOS transistors 44 to 47.

Word line decode signal generation circuit 40 is activated in response to an activation of word line driving signal φWL, to generate signals SDX and /SDX according to an address bit (predecode signal) Xm. Signal SDX changes between high voltage Vpp and ground voltage Vss. Signal /SDX changes between power supply voltage Vcc and the ground voltage.

In a stand-by state, address bits Xi, Xj and Xk are all at an L level. As a result, in NAND-type decode circuit 41, a sub-threshold leakage current flows to the ground potential, the ground node of NAND-type decode circuit 41 is connected to the main ground line through a MOS transistor 48. MOS transistor 48 receives power supply block selecting (specifying) signal φBi at its gate The operation will be now briefly described.

In a stand-by state, address bits Xi, Xj and Xk are all at an L level, and the output signal of NAND-type decode circuit 41 is at an H level equal to the power supply voltage Vcc level. MOS transistor 48 is in an off state, because power supply block selecting signal φBi is at an L level. In a stand-by state, word line decode signal generation circuit 40 holds signal SDX at an L level equal to the ground voltage level, and signal /SDX at an H level. Node 49 is held at the high voltage Vpp level by reset signal RST through MOS transistor 43. In this state, word line WL is held at the ground voltage level by MOS transistors 45 and 47.

When an active cycle is started, power supply block selecting signal φBi attains an H level when selected, and NAND-type decode circuit 41 receives power supply voltage Vcc and ground voltage Vss as both operation power supply voltages to perform a decoding operation. When address bits Xi, Xj, Xk and Xl are all at an H level, node 49 is discharged to the ground voltage level by the function of NAND-type decode circuit 41. (MOS transistor 49 for reset is in an off state.) MOS transistor 46 has a small current driving capability, and therefore node 49 is surely discharged to the ground voltage level by NAND-type decode circuit 41 and decode transistor 42. When the voltage level on node 49 becomes an L level, MOS transistor 45 attains an off state. MOS transistor 44 shifts to an off state, because signal SDX is at an L level and the gate and source potentials of the transistor 44 are equal.

Word line decode signal generation circuit 40 is responsive to an activation of word line driving signal 4WL for operating to drive signals SDX and /SDX to an H level/L level according to address bit Xm. When address bit Xm is at an H level, signal SDX is driven into the high voltage Vpp level, and signal /SDX is discharged to the ground voltage level. Therefore, at this time, word line WL is driven into the high voltage Vpp level through MOS transistor 44. Meanwhile, when address bit Xm is at an L level, signal SDX attains an L level and signal /SDX attains an H level.

As a result, p-channel MOS transistor 44 maintains an off state. When MOS transistors 44 and 45 both attain an off state, MOS transistor 47 is turned on by signal /SDX and word line WL is surely maintained at the ground voltage level.

In the case of the repeating circuit shown in FIG. 31, one row decode circuit is provided for two word lines WL. One of the two word lines is selected by signals SDX and /SDX. If address signal bit Xm applied to word line decode signal generation circuit 40 is replaced by two-bit address, one row decode circuit is provided for four word lines.

Thus, in the case of the configuration of the repeating circuit shown in FIG. 31, in the normal mode, word line driving signal φWL is driven into an active state at a fast timing, and word line WL is driven into an active state at a fast timing accordingly. Meanwhile, in the self refresh mode, the activation of word line driving signal φWL is delayed behind the activation of power supply block selecting signal φBi. Power supply block selecting signal φBi is driven into an active state at a relatively delayed timing (in order to fully decode a power supply block address signal) in the self refresh mode. After the voltage level of the ground node of NAND-type decode circuit 41 surely reaches the ground voltage level, signals SDX and /SDX from word line decode signal generation circuit 40 are driven into a specified state. Thus, in the self refresh mode, a decoding operation can be surely performed to transmit high voltage Vpp or ground voltage Vss onto selected word line WL.

In the configuration shown in FIG. 31, as a so-called hierarchical power supply arrangement, a sub-ground line is connected to NAND-type decode circuit 41. If word line decode signal generation circuit 40 is provided for each of memory blocks, a power supply switch circuit may be provided for each memory block for a signal line supplying high voltage Vpp, and high voltage Vpp may be supplied in the above described manner. In word line decode signal generation circuit 40, a leakage current from high voltage Vpp can be prevented from flowing by a sub-threshold leakage current and current can be prevented from being consumed. In this configuration, the power supply nodes (sources) of MOS transistors 43 and 46 need only be coupled to a sub-high voltage supply line common to word line decode signal generation circuit 40.

According to the configuration of modification 2 as described above, in addition to the previously described effects, a word line can be driven after the voltage at the operation voltage supply node is stabilized, so that a decoding operation can be surely performed and an addressed word line can be surely driven into a selected state. Note that if high voltage Vpp is provided in a hierarchical power supply arrangement, a word line can be driven after high voltage Vpp is stabilized.

Hierarchical Power Supply Arrangement 2

Figure 32A:
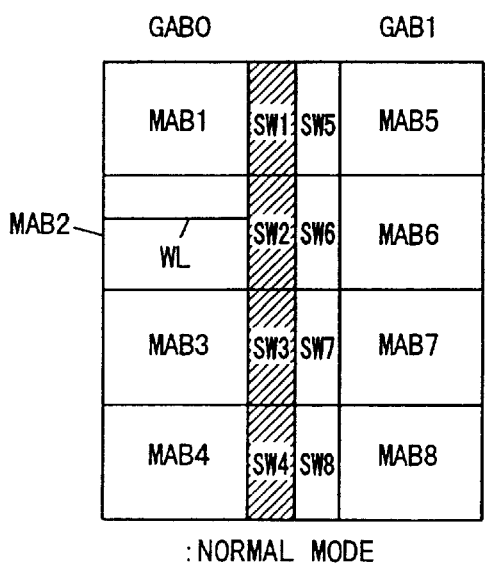
FIGS. 32A and 32B are diagrams showing the selected states of the power switch circuit in a normal mode and a refresh mode, respectively in a hierarchical power supply arrangement 2 according to the sixth embodiment of the invention.
Figure 32B:
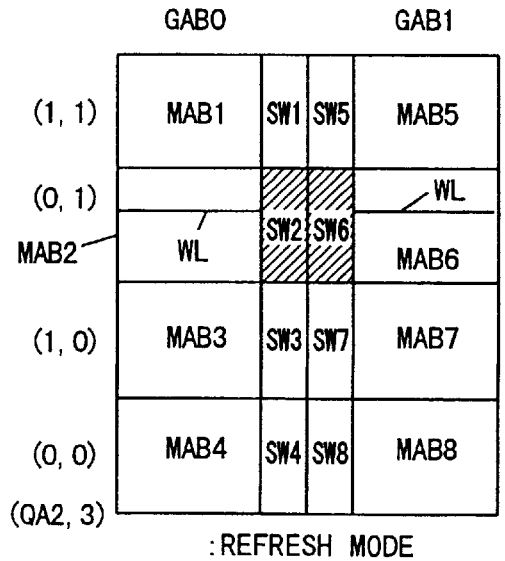

FIGS. 32A and 32B are diagrams showing the selected state of the power supply circuit in hierarchical power supply arrangement 2 according to the sixth embodiment of the invention. As shown in FIG. 32A, a word line WL is driven into a selected state in a single memory block in a normal mode. In this case, a power supply switch circuit provided for a global block including a selected memory block is driven into a selected state. In FIG. 32A, word line WL is selected in memory block MAB2, and power supply switch circuits SW1 to SW4 for global array block GAB0 including memory block MAB2 are driven into a selected. This is the same as the operation of the previously described power supply arrangement 1 in the normal mode.

As shown in FIG. 32B, in a refresh mode, one memory block is selected in each of global array blocks GAB0 and GAB1 for refreshing. In this case, power supply switch circuits SW2 and SW6 provided for memory blocks MAB2 and MAB6 are driven into a selected state. Address bits are allocated similarly to the allocation of the address bits shown in FIG. 22. In this case, in a self-refresh mode, an address bit QA1 to specify a global block is degenerated (ignored). Therefore, a power supply block selecting signal is generated according to address bits QA2 and QA3.

Figure 33:
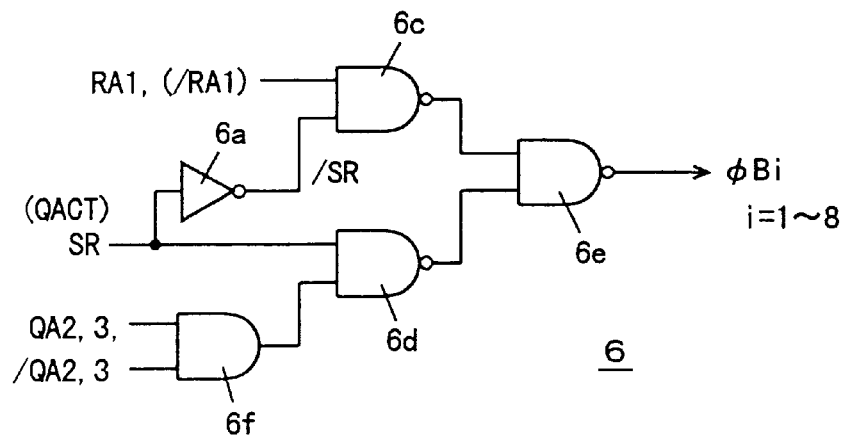
FIG. 33 is a schematic diagram of a power supply block decoder for FIGS. 32A and 32B.

FIG. 33 is a schematic diagram showing a structure of a power supply block decode circuit. Since the power supply block decode circuit shown in FIG. 33 has the same configuration as shown in FIG. 26, except for that an AND circuit 6f to decode refresh address bits receives a prescribed set among refresh address bits QA2, QA3, /QA2 and /QA3, the corresponding portions are denoted with the same reference characters and the detailed description is not provided.

In power supply block decode circuit 6 shown in FIG. 33, refresh address bits QA1 and /QA1 are not used. Therefore, one memory block is selected in each of global blocks GAB0 and GAB1.

Figure 34:
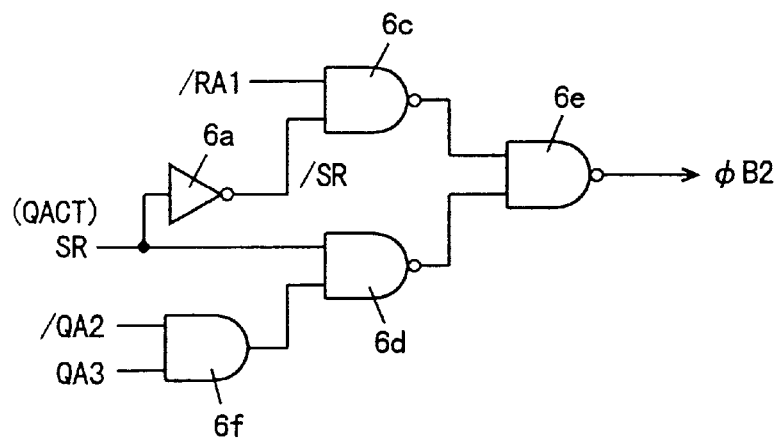
FIG. 34 is a diagram of a power block decode circuit for a particular power supply block selecting signal φB2.

FIG. 34 is a diagram showing a structure of the portion to generate a control signal (power supply block selecting signal) φB2 to power supply switch circuit SW2 provided for memory block MAB2. In FIG. 34, in the power supply block decode circuit, refresh address bits /QA2 and QA3 are applied to AND circuit 6f. Memory block MAB2 is selected when refresh address bits (QA2 and QA3) are (0, 1). Therefore, when memory block MAB2 is addressed, the output signal of AND circuit 6f attains an H level, and power supply block selecting signal φB2 is driven into an H level, active state. In the power supply block decode circuit, address bit QA1 is not used, therefore memory block MAB6 is also selected in global block GAB1, and corresponding power supply switch SW6 is driven into a selected state.

Figure 35:
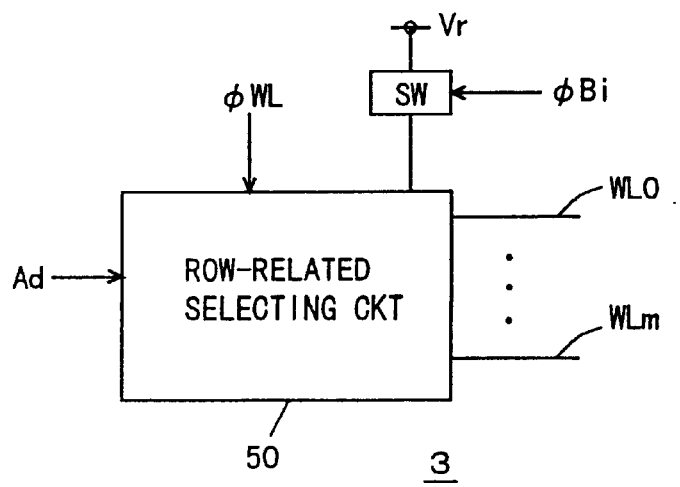
FIG. 35 is a schematic diagram of a modification of hierarchical power supply arrangement 2 according to the sixth embodiment.

In this hierarchical power supply arrangement 2, as shown in FIG. 35, word line driving signal φWL is applied to a row-related selecting circuit 50 included in a row-related peripheral circuit 3. A prescribed voltage Vr is applied to row-related selecting circuit through a power supply switch circuit SW. Row-related selecting circuit 50 drives any of word lines WL0 to WLm into a selected state in response to an address signal Ad when selected. Power supply switch circuit SW is driven into a selected state in response to a power supply block selecting signal φBi. Row-related selecting circuit 50 includes a word line decode signal generating circuit 40 shown in FIG. 31. Word line driving signal φWL is generated by a control circuit shown in FIG. 29. Therefore, word line driving signal φWL applied to row-related selecting circuit 50 has its activation timing in a self-refresh mode delayed behind the activation timing in a normal operation mode. Thus, power supply switch circuit SW is driven into a selected state, and after stable voltage Vr is supplied to row-related selecting circuit 50, row-related selecting circuit 50 performs a word line selecting operation. Thus, the selected word line can be stably driven into a selected state.

According to this hierarchical power supply arrangement 2, if a larger number of word lines than those in the normal mode are driven into a selected state in the refresh mode, a power supply switch circuit in a global block is driven into a selected state in the normal mode, while in the self-refresh mode, only the power supply switch circuit for a selected memory block is driven into a selected state, so that the power consumption in the refresh mode can be reduced without increasing the accessing time. The word line driving timing can be delayed in the self-refresh mode to accurately perform a word line selecting operation.

There are eight memory blocks in this hierarchical power supply arrangement 2, but the number of memory blocks may be as desired, and the number of global blocks is also arbitrary. In the self-refresh mode, two word lines are selected, but the number of rows refreshed simultaneously is also arbitrary, and the number of refresh address bits has only to be adjusted depending upon the number of rows to be simultaneously refreshed.

Hierarchical Power Supply Arrangement 3

Figure 36:
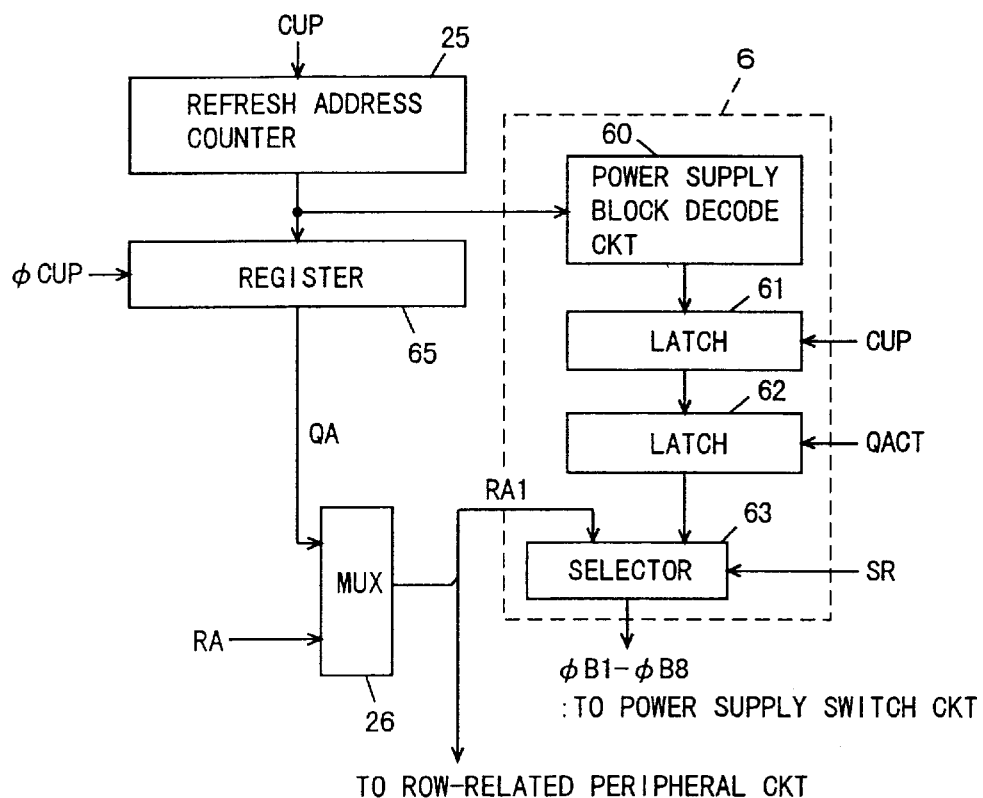
FIG. 36 is a schematic diagram of a control portion in a hierarchical power supply arrangement 3 according to the sixth embodiment.

FIG. 36 is a schematic diagram showing the configuration of hierarchical power supply arrangement 3 according to the sixth embodiment of the present invention. In FIG. 36, the configuration of the portion to control this hierarchical power supply circuit is shown.

In FIG. 36, a power supply block selecting signal generating portion includes a power supply block decoder 6 which decodes a refresh address output from refresh address counter 25 and latches the result of decoding in advance by one cycle, and outputs the latched result in the present refresh cycle. Refresh address counter 25 counts in response to a count up instruction signal CUP activated in a refresh cycle, and holds the count value. The count value output from refresh address counter 25 is applied to register 65. Register 65 responds to an instruction signal φCUP activated at the end of the refresh cycle to take and output the output count value of refresh address counter 25. An address signal output from register 65 is applied to a multiplexer (MUX) 26 as a refresh address signal QA.

Figure 37:
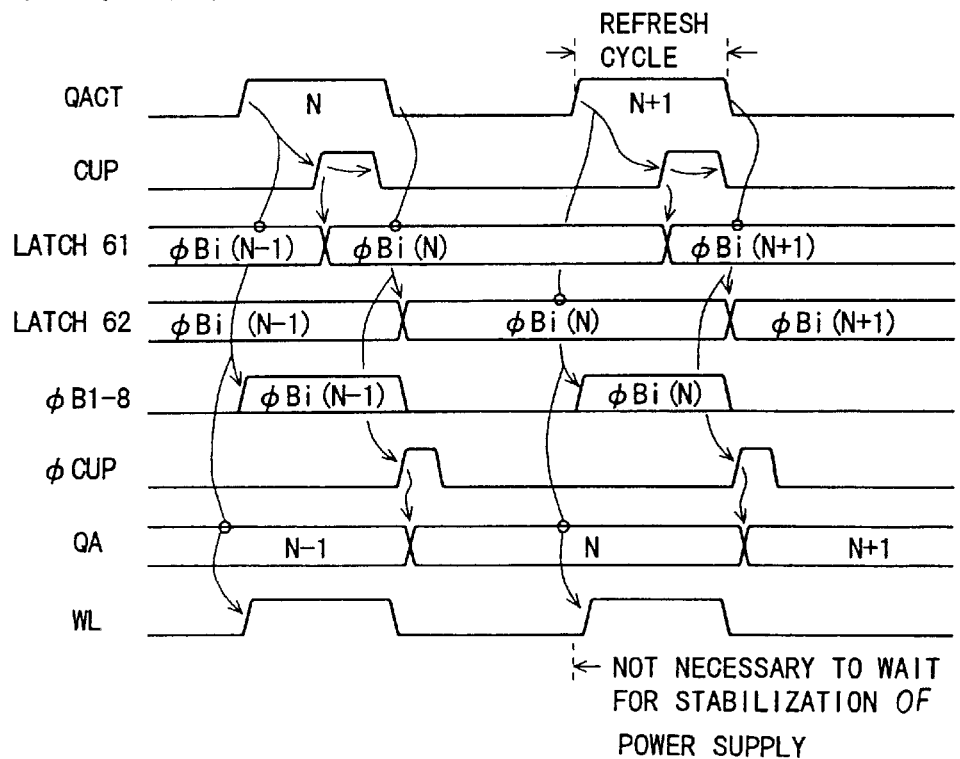
FIG. 37 is a signal waveform chart representing the operation of hierarchical power supply arrangement 3 according to the sixth embodiment.

Power supply block decoder 6 includes a power supply block decode circuit 60 which decodes the output count of refresh address counter 25, a latch 61 which responds to an activation of count up instruction signal CUP to latch the output signal of power supply block decode circuit 60, a latch 62 which responds to refresh cycle activation signal QACT to take and output the data latched by latch 61, and a selector 63 which selects one of the output signal of latch 62 and address bit RA1 from multiplexer 26 according to self refresh mode instruction signal SR to output power supply block selecting signals φB1 to φB8. Herein, the memory array is divided into eight memory blocks MAB1 to MAB8, and a global block or four memory array blocks are selected according to this row address bit RA1. The operations of the control signal generation portion shown in FIG. 36 will be now described with reference to the signal waveform diagram in FIG. 37.

In a self-refresh mode, when refresh cycle activation signal QACT is in an inactive state, latch 61 latches power supply block selecting signal φBi(N−1) generated by power supply block decode circuit 60 in the previous cycle (N−1). Latch 62 also latches power supply block signal φBi(N−1). Selector 63 selects the output signal of latch 62 in response to self-refresh mode instruction signal SR.

When refresh cycle activation signal QACT is activated, latch 62 outputs the latched data, and power supply block selecting signals φBi is driven into a selected/non-selected state based on the result of decoding in the previous memory cycle (N−1). In this cycle (N), register 65 generates a refresh address taken in the previous cycle. Therefore, in this cycle (N), the selecting control of the power supply switch circuit and refresh operation are performed based on power supply block selecting signal φBi(N−1) and refresh address QA (N−1) decoded in the previous cycle. In the previous cycle, the decoding operation of generating the power supply block selecting signal is completed, and when refresh cycle activation signal QACT is activated, power supply block selecting signal φBi(N−1) is immediately made definite. As a result, in the refresh cycle, the word line selecting timing does not have to be delayed, and the refresh operation may be performed at fast timing. The word line selecting timing does not have to be changed between the normal mode and refresh mode, and the control in selecting word lines is easily made.

In response to an activation of this refresh cycle activation signal QACT, count up instruction signal CUP is activated at a prescribed timing. In response to the activation of count up instruction signal CUP, refresh address counter 25 performs a count up operation, and the count value is incremented or decrement by 1. Power supply block decode circuit 60 decodes a refresh address from refresh address counter 25, and generates a power supply selecting signal based on the result of decoding. Latch 61 takes the output signal of power supply block decode circuit 60 in response to count up instruction signal CUP and enters a latching state in response to an inactivation of count up instruction signal CUP. During this period, a refresh operation is performed according to refresh address QA (N−1) generated in the previous cycle.

When refresh cycle activation signal QACT is inactivated, latch 62 takes a latched signal from latch 61 and drives the output signal into an inactive state. Thus, power supply block selecting signals φB1 to φB8 are all driven into an inactive state. In response to the activation of refresh cycle activation signal QACT, count up instruction signal φCUP is activated, and register 65 takes the count value output from refresh address counter 25. Thus, refresh address QA changes by 1.

When refresh cycle activation QACT is then activated again, latch 62 outputs the latched power supply block selecting signal, and power supply block selecting signals φB1 to φB8 are driven into a selected/non-selected state according to power supply block selecting signal φBi(N) obtained in the previous cycle (N). In this cycle (N+1), register 65 outputs the refresh address taken at the end of the previous cycle, and applies the address to the row-related circuits. According to refresh address QA(N) and power supply block selecting signal φBi(N) generated in the previous cycle, a refresh operation is executed.

In the activation period of this refresh cycle activation signal QACT, count up instruction signal CUP is activated, refresh address counter 25 performs a counting operation, and the count value is updated. Power supply block decode circuit 60 performs a decoding operation again to generate power supply block selecting signal φBi(N+1), and latch 61 latches power supply block selecting signal φBi(N+1) from power supply block decode circuit 60.

When refresh cycle activation signal QACT is inactivated, latch 62 once again takes the output signal of latch 61, and has the content thereof updated to power supply block selecting signal φBi(N+1). In response to the inactivation of refresh cycle activation signal QACT, latch 62 again drives output signal φBi(N) into a non-selected state. In response to the inactivation of refresh cycle activation signal QACT, count up instruction signal φCUP is activated, and register 65 takes the output count value of refresh address counter 25 and updates the refresh address. Each time refresh cycle activation QACT is activated at prescribed time intervals, the above-described operation is repeated.

In a refresh operation, a refresh address is generated according to the counting operation of refresh address counter 25. Therefore, in each refresh cycle, the next refresh address can be known, and therefore a power supply block selecting signal may be generated in advance by decoding the refresh address in the previous cycle. Thus, at the start of a refresh cycle, a decoding operation of selecting a power supply block is not necessary, and therefore a word line corresponding to a refresh row can be driven into a selected state at a faster timing.

Figure 38:
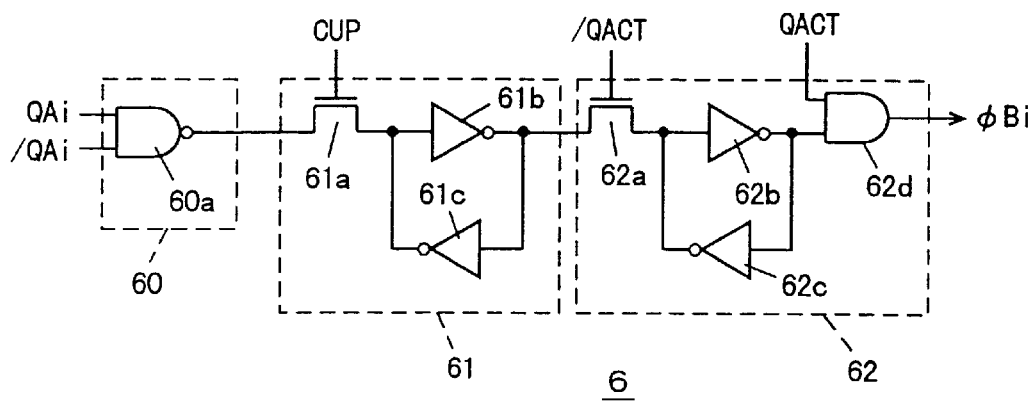
FIG. 38 is a diagram of an example of a power supply block decoder shown in FIG. 36.

FIG. 38 is a diagram showing an example of power supply block decoder 6. In FIG. 38, power supply block decode circuit 60 includes an NAND-type decode circuit 60a which receives prescribed refresh address bits QAi, and /QAi. The combination of refresh address bits QAi, and /QAi applied to NAND-type decode circuit 60a is determined by the address of a memory block corresponding to the power supply switch circuit controlled by power supply block selecting signal φBi.

Latch 61 includes a transfer gate 61a which conducts to pass the output signal of NAND-type decode circuit 60a when count up instruction signal CUP is activated (at an H level), and inverters 61b and 61c which form a latch circuit to latch a signal applied through transfer gate 61a. Inverters 61b and 61c are disposed in an anti-parallel arrangement and have their inputs and outputs cross-coupled to form a so-called inverter latch.

Latch 62 includes a transfer gate 62a which conducts to pass the output signal of latch 61 when complimentary refresh cycle activation signal /QACT is activated, inverters 62b and 62c which form a latch circuit to latch a signal applied through transfer gate 62a, and AND circuit 62d which is activated in response to an activation of refresh cycle activation signal QACT to generate power supply block selecting signal φBi. Inverters 62b and 62c form a so-called inverter latch.

In the configuration shown in FIG. 38, power supply block decode circuit 60 decodes refresh address bits QAi and /QAi from the refresh address counter and outputs a signal representing the result of decoding. In latch 61, transfer gate 61a conducts when count up instruction signal CUP is activated and passes a power supply block selecting signal newly generated by the activation of count up instruction signal CUP, and inverters 61b and 61c latch this newly generated power supply block signal. During the refresh cycle period, complimentary refresh cycle activation signal /QACT is in an inactive state, and the content latched by latch 62 does not change regardless of change in the output signal of latch 61.

During the refresh cycle period, AND circuit 62d operates as a buffer to output the power supply block selecting signal latched by inverters 62b and 62c. When the refresh cycle completes and refresh cycle activation signal QACT attains an L level, inactive state, AND circuit 62d is disabled, and power supply block selecting φBi attains an L level, inactive state. Thus, the power supply switch circuits all attain a non-selected state, which reduces the power consumption. Meanwhile, when complimentary refresh cycle activation signal /QACT attains an H level, active state, transfer gate 62a conducts to take the signal latched by latch 61 and latches a new power supply block selecting signal.

Without adversely affecting the refresh cycle operation in the present cycle, a power supply block selecting signal is generated and latched by decoding a refresh address for the next cycle.

Figure 39:
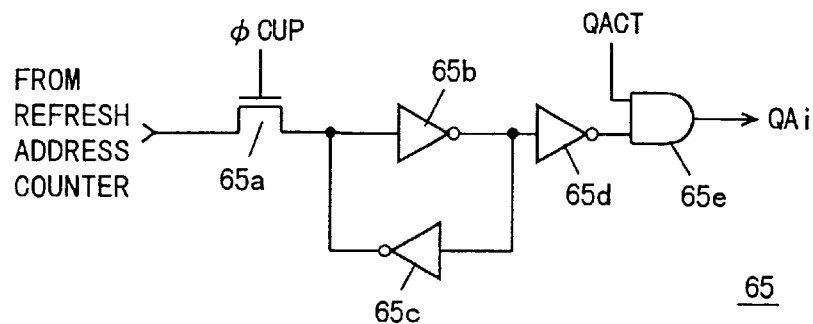
FIG. 39 is a diagram of an example of a register shown in FIG. 36.

FIG. 39 is a diagram showing an example of a 1-bit register circuit in register 65 shown in FIG. 36. In FIG. 39, register 60 includes a transfer gate 65a which conducts to pass a count bit from the refresh address counter when count up instruction signal φCUP is activated, inverters 65b and 65c which form a latch circuit to latch a signal applied through transfer gate 65a, an inverter 65d which inverts the output signal of inverter 65b, and an AND circuit 65e which is enabled to generate refresh address bit QAi according to the output signal of inverter 65d when refresh cycle activation signal QACT is activated.

In the configuration of register 65 shown in FIG. 39, the refresh address bit latched by inverters 65b and 65c is updated when count up instruction signal φCUP is activated. When refresh cycle activation signal QACT is activated, refresh address bit QAi to be used in the present cycle is generated.

When multiplexer 26 is provided in the stage preceding the row address buffer/latch, this AND circuit 65e is not necessary. The row address buffer/latch functions to maintain the internal row address signal bits in an active state in a stand-by cycle.

Figure 40:
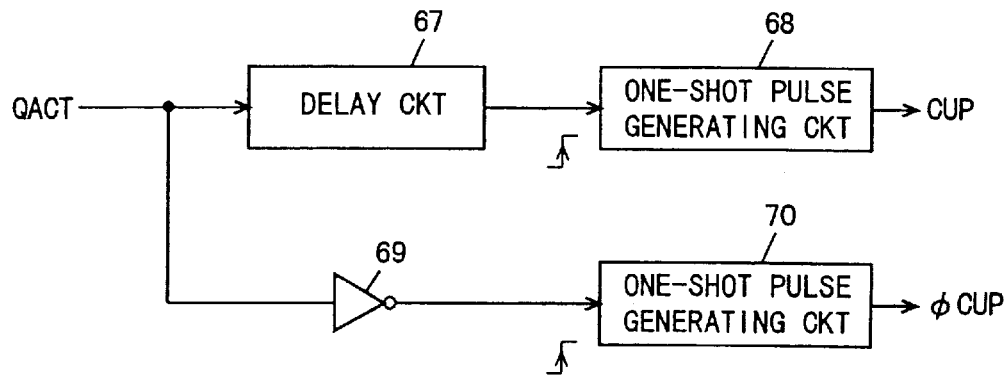
FIG. 40 is a schematic diagram of an example of a count up instruction signal generation portion shown in FIG. 36.

FIG. 40 is a schematic diagram representing how count up instruction signals CUP and φCUP are generated. In FIG. 40, the count up instruction signal generation portion includes a delay circuit 67 which delays refresh cycle activation signal QACT by a prescribed time period, a one-shot pulse generation circuit 68 which generates a one-shot pulse signal in response to a rising of the output signal of delay circuit 67, an inverter circuit 69 which inverts refresh cycle activation signal QACT, and a one-shot pulse generation circuit 70 which generates a one-shot pulse signal in response to a rising of the output signal of inverter circuit 69. Count up instruction signal CUP is output from one-shot pulse generation circuit 68, and count up instruction signal φCUP is output from one-shot pulse generation circuit 70. By setting the delay time by delay circuit 67 to an appropriate value, a count up operation can be performed by the refresh address counter within the refresh cycle period at an appropriate timing. The activation periods of count up instruction signals CUP and φCUP may be determined suitably depending upon the latching ability of each circuit.

Note that this count up instruction signal generation circuit has only to be included in refresh instruction control circuit 23 in FIG. 25.

In hierarchical power supply configuration 3, power supply block selecting signal φBi is set to an H level when selected. However, the logical level of the power supply block selecting signals φBi in the selected state may be appropriately determined depending upon the voltage level of the voltage supply lines applied. For example, if the power supply switch circuit is provided between a main ground line and a sub ground line, power supply block selecting signal φBi attains an H level when selected, while if the power supply switch circuit is provided between a main power supply line and a sub power supply line, power supply block selecting signal φBi attains an L level when selected.

Note that in the configuration shown in FIG. 36, in a normal mode, selector 63 selects row address signal bit RA1 from multiplexer 26 in response to self-refresh mode instruction signal SR. Therefore, a global block is selected according to this row address signal bit RA1.

As described above, according to hierarchical power supply arrangement 3, in the self-refresh mode, a power supply block selecting signal to be used in the next cycle is generated by incrementing and decoding the count value of the refresh address counter in the present cycle followed by latching the result of decoding. Therefore, the decoding operation of the power supply block selecting signal has been completed at the start of the next cycle, and the state of power supply block selecting signal φBi can be set at a high speed in the next cycle, so that a word line can be driven into a selected state at a faster timing in a refresh cycle. As a result, the activation timing for a word line does not have to be changed between the refresh mode and the normal mode, and therefore the configuration of the word line driving portion can be simplified.

Seventh Embodiment

Hierarchical Power Supply Arrangement 1

Figure 41:
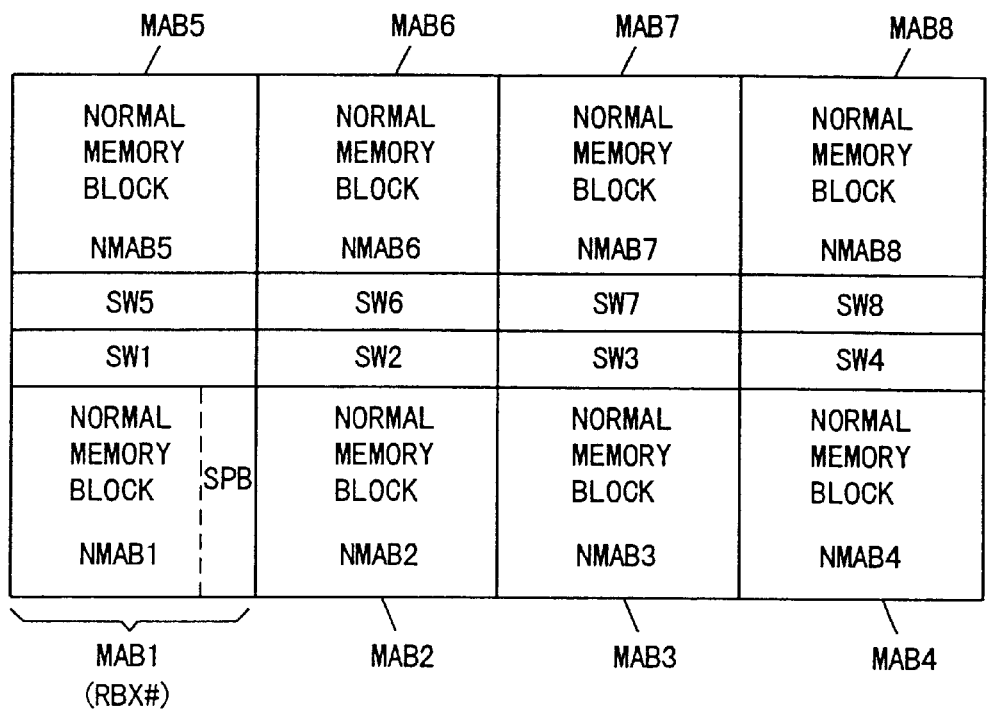
FIG. 41 is a schematic diagram of hierarchical power supply arrangement 1 according to a seventh embodiment of the invention.

FIG. 41 is a schematic diagram showing the configuration of an array portion in a semiconductor memory device according to a seventh embodiment of the present invention. In FIG. 41, a memory mat is divided into eight memory blocks MAB1 to MAB8. Memory blocks MAB2 to MAB8 include normal memory blocks NMAB2 to NMAB8 including normal memory cells, respectively. Memory block MAB1 includes a normal memory block NMAB1 and a spare block SPB including a spare element to repair a defective cell. Memory block MAB1 corresponds to a block RBX# formed by a normal memory sub array and a spare array shown in FIG. 11.

Switch circuits SW1 to SW8 are provided corresponding to memory blocks MAB1 to MAB8. Switch circuits SW1 to SW8 are driven into a selected state according to power supply block selecting signals XB1 to XB8 similarly to the forgoing sixth embodiment. Spare block SPB for memory block MAB1 is shared among normal memory blocks NMAB2 to NMAB8, and can repair a defective cell (defective row) in any of the normal memory blocks by replacing the defective cell. Block address bits RA1 to RA3 and QA1 to QA3 for memory blocks MAB1 to MAB8 are allocated similarly to the sixth embodiment.

Figure 42:
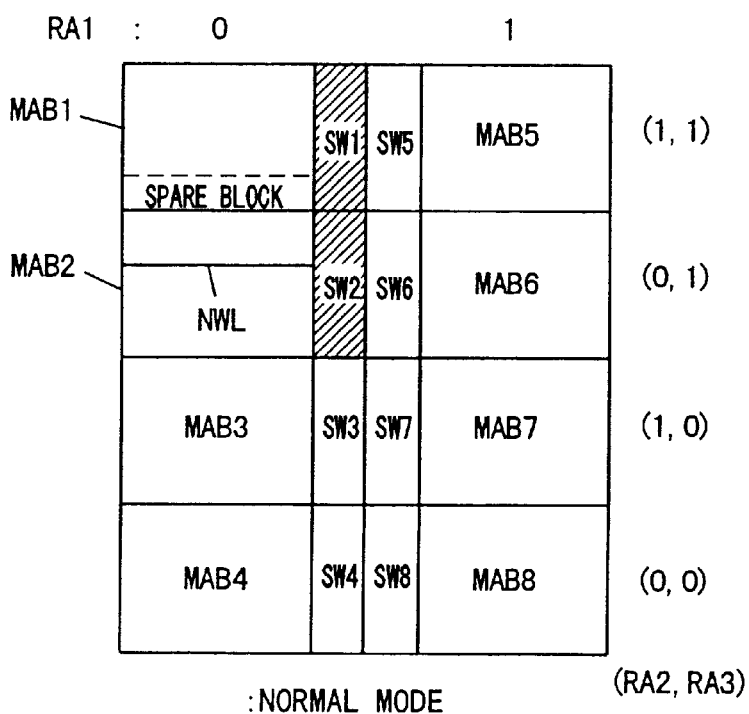
FIG. 42 is a schematic diagram showing the selected state of the power switch circuit in hierarchical power supply arrangement 1 according to the seventh embodiment in a normal mode.

Referring to FIG. 42, the operation in a normal mode will be now described. In the normal mode, regardless of an applied address signal (row address signal), power supply switch circuit SW1 provided for memory block MAB1 including spare block SPB is driven into a selected state. Before spare determination, the power supply switch circuit corresponding to a memory block including an addressed word line WL is driven into a selected state. In FIG. 42, memory block MAB2 includes an addressed word line WL. In the other memory blocks, the power supply switch circuits are maintained in a non-selected state. A spare determination as to whether a defective memory cell is addressed is performed by comparing addresses, and according to the result of determination, an addressed word line or spare word line is driven into a selected state.

Before the spare determination, a power supply switch circuit for a memory block including a memory cell to be selected (memory block including an addressed word line or spare word line) is driven into a selected state. Therefore, when a word line is driven into a selected state in the memory block including the memory cell to be selected, a prescribed voltage is stably supplied, and therefore the memory cell to be selected can be accurately driven into a selected state. The operation will be now more detailed with reference to the signal waveform diagram in FIG. 43.

When an active cycle is started, array activation signal RACT is driven into an H level, active state. According to the activation of array activation signal RACT, row address signal RA is made definite, and the addressed memory block is determined. According to the activation of array activation signal RACT, regardless of the applied row address signal RA, power supply block selecting signal φB1 to memory block MAB1 including a spare block is driven into an active state. According to address signal RA, one of memory blocks MAB2 to MAB8 is selected, and corresponding one of power supply block selecting signals φB2 to φB8 is driven into a selected state. According to address signal RA, a spare determination as to whether a defective row is addressed is made. If the result of spare determination indicates that a defective row is addressed (spare hit), a spare word line SWL included in spare block SPB is driven into a selected state. Meanwhile, when it is determined that a normal memory cell in a normal state is addressed (spare miss), a normal word line NWL is driven into a selected state.

When word line NWL or SWL is driven into a selected state, a corresponding power supply switch circuit has been selected to supply a prescribed voltage. Therefore, word line NWL or SWL can be accurately driven into a selected state.

Figure 43:
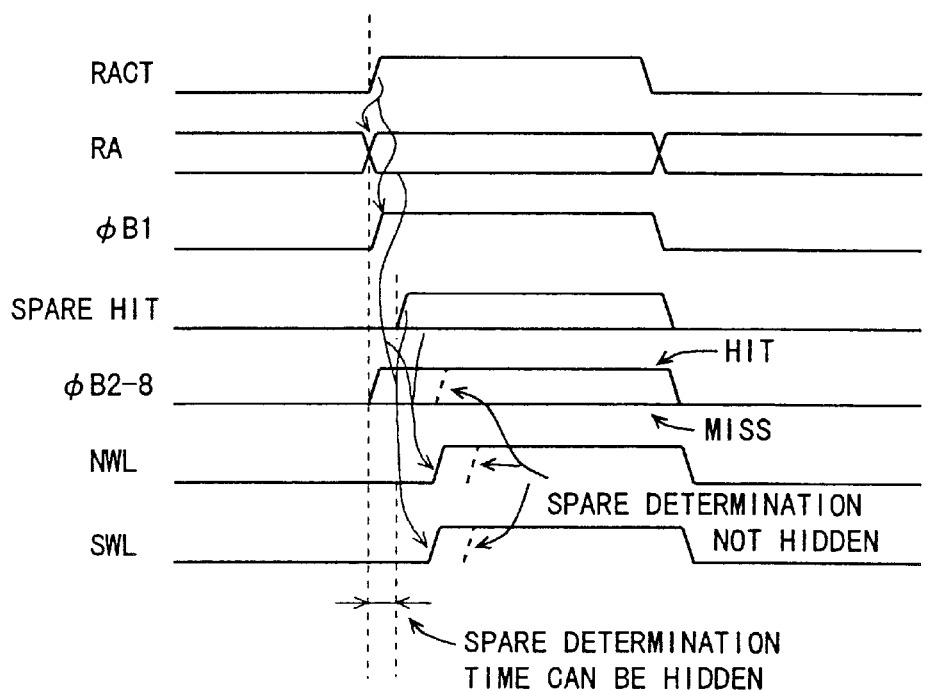
FIG. 43 is a signal waveform diagram representing the operation when the power switch circuit shown in FIG. 42 is selected.

When a memory block is selected based on the spare determination, after a spare hit/miss determination is made, the power supply circuit to a corresponding memory block is driven into a selected state (shown in broken line in FIG. 43). Thereafter, word line NWL or SWL must be driven into a selected state, and therefore the timing of activating the word line should be delayed, which increases the accessing time. However, by driving the power supply switch circuits to memory block MAB1 and the memory block including the addressed normal word line into a selected state before determining whether this defective normal word line has been addressed, a prescribed voltage can be supplied from a corresponding power supply switch circuit within the spare determination time period, so that a high speed operation is implemented. (The word line selecting timing does not have to be delayed.)

Figure 44:
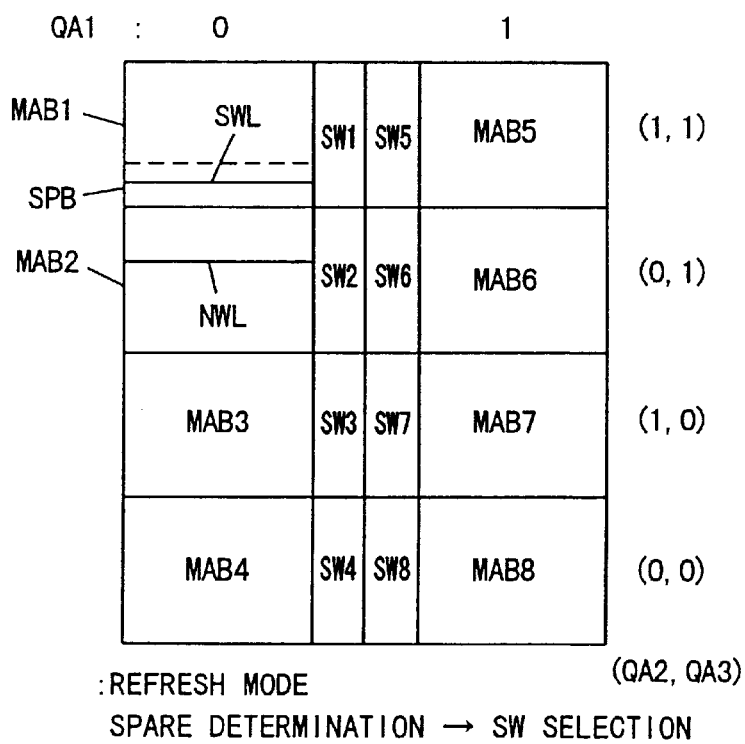
FIG. 44 is a schematic diagram showing the selected state of the power supply switch circuit and hierarchical power supply arrangement 1 according to the seventh embodiment in a refresh mode.
Figure 45:
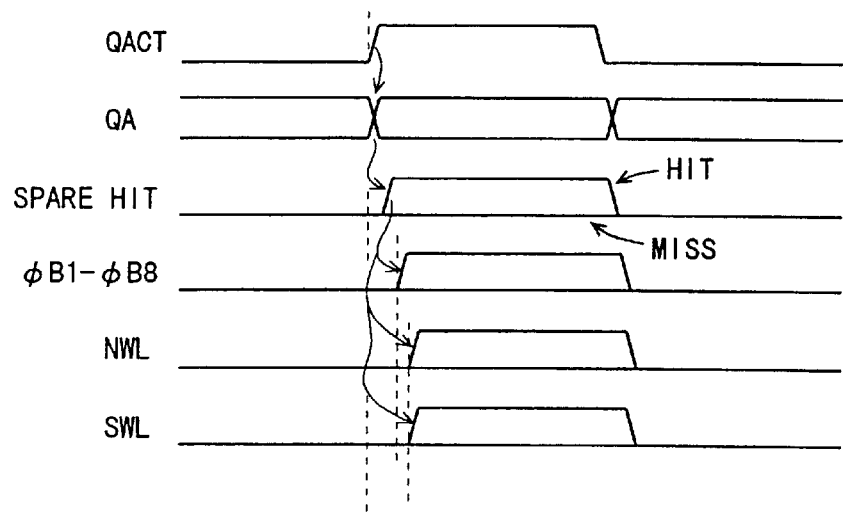
FIG. 45 is a signal waveform diagram representing the operation corresponding to the selected state of the memory switch circuit shown in FIG. 44.

Referring to FIGS. 44 and 45, the operation in the self-refresh mode will be now described. In the self-refresh mode, as shown in FIG. 44, a power supply switch circuit is selected according to the result of spare determination. Let us now assume that normal word line NWL in memory block MAB2 is addressed by refresh address signal QA. A spare determination as to whether or not normal word line NWL is defective is made by comparing the addresses. At this time, a decoding operation is also executed in parallel for selecting a power supply switch circuit, but the power supply block selecting signals are all maintained in a non-selected state. If a spare hit is determined, spare word line SWL must be driven into a selected state in place of normal word line NWL. In this case, power supply switch circuit SW1 is driven into a selected state based on the spare hit determination result. The other power supply switch circuits SW2 to SW8 are maintained in a non-selected state. Based on the spare hit determination result, spare word line SWL is driven into a selected state, and normal word line NWL is maintained in a non-selected state.

Meanwhile, if the spare determination result indicates a spare miss, power supply switch circuit SW2 is driven into a selected state, and normal word line NWL is driven into a selected state.

In the refresh mode, a data accessing is not requested, and therefore there will be no problem even if the power supply switch circuit is driven into a selected state after the spare determination. By driving only a power supply switch circuit corresponding to a memory block including a memory cell to be selected, the power consumption in the refresh mode can be reduced.

Figure 46A:
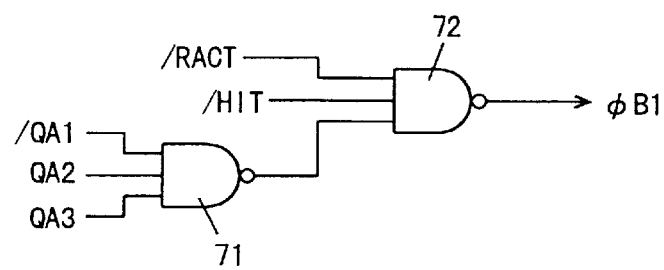
FIG. 46A is a diagram of an example of the power block decoder in hierarchical power supply arrangement 1 according to the seventh embodiment.

FIG. 46A is a diagram showing an example of a power supply block decode circuit which generates power supply block selecting signal φB1. In FIG. 46A, the power supply block decode circuit includes an NAND circuit 71 which receives refresh address bits /QA1, QA2, and QA3, and an NAND circuit 72 which receives a complimentary array activation signal /RACT, a complimentary spare hit signal /HIT and the output signal of NAND circuit 71 and outputs power supply block selecting signal φB1. Array activation signal /RACT is set to an L level at the start of an active cycle in the normal mode. Spare hit signal /HIT is set to an L level when a defective cell is addressed. NAND circuit 71 outputs an L level signal when memory block MAB1 is addressed. The operation of the power supply block decode circuit shown in FIG. 46 will be now described with reference to the signal waveform diagram in FIG. 46B.

In the normal mode, when an active cycle is started, complimentary array activation signal /RACT is driven into an L level. Therefore, regardless of the states of spare hit signal /HIT and the output signal of NAND circuit 71, power supply block selecting signal φB1 is driven into an active state. More specifically, when an active cycle is started in the normal mode, power supply block selecting signal φB1 is driven into a selected state.

In the refresh mode, array activation signal /RACT is fixed at an H level. In the refresh cycle, refresh cycle activation signal QACT is driven into an H level, active state, and refresh address signal QA is defined accordingly. When a spare determination is made and a spare hit is determined, spare hit signal /HIT attains an L level, and power supply block selecting signal φB1 is driven into an H level, selected state. Then, a spare word line in a spare block is driven into a selected state.

Meanwhile, when spare hit signal /HIT is at an H level and spare replacement is not necessary, power supply block selecting signal φB1 is driven into a selected/non-selected state according to the output signal of NAND circuit 71. When memory block MAB1 is addressed, the output signal of NAND circuit 71 attains an L level, and power supply block selecting signal CB1 is driven into a selected state (H level) accordingly. Meanwhile, if any of the other memory blocks MAB2 to MAB8 is addressed, the output signal of NAND circuit 71 is at an H level, and power supply block selecting signal φB1 maintains its L level.

Note that in the configuration of the power supply block decode circuit shown in FIG. 46A, even if the output signal of NAND circuit 71 is pulled to an L level and corresponding memory block MAB1 is addressed when spare hit signal /HIT is at an L level particular problem is not caused. This is because upon spare hit, memory block MB1 is selected. In order to drive power supply block selecting signal φB1 into a selected/non-selected state after the state of spare hit signal /HIT is defined, spare hit signal HIT is further applied to NAND circuit 71. After spare hit/miss determination result is defined, the output signal of NAND circuit 71 is defined to drive power supply block selecting signal φB1 into a selected state accordingly.

Figure 47A:
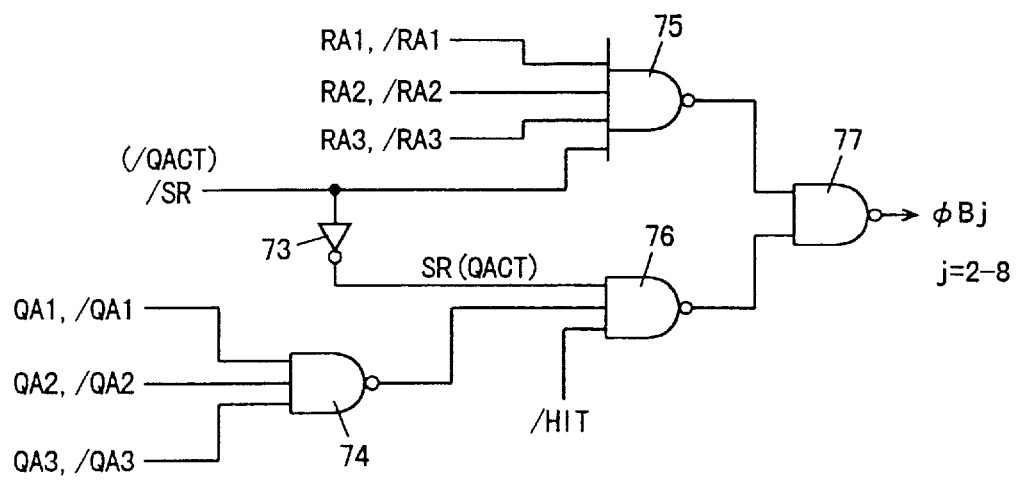
FIG. 47A is a diagram of a power supply block decoder in hierarchical power supply arrangement 1 according to the seventh embodiment.

FIG. 47A is a diagram showing a power supply block decode circuit for power supply block selecting signal φBj (j=2 to 8). In FIG. 47A, the power supply block decode circuit includes an inverter circuit 73 which inverts self-refresh mode instruction signal /SR, an NAND circuit 74 which receives a prescribed combination of refresh address bits QA1 to QA3 and /QA1 to/QA3, an NAND circuit 75 which receives self-refresh mode instruction signal /SR and a prescribed combination of row address bits RA1 to RA3 and /RA1 to /RA3, an NAND circuit 76 which receives the output signal of inverter 73, the output signal of NAND circuit 74 and spare hit signal /HIT, and an NAND circuit 77 which receives the output signals of NAND circuits 75 and 76 to generate power supply block selecting signal φBj(j=2 to 8). Refresh cycle activation signal /QACT may be used in place of self-refresh mode instruction signal /SR. The operation of power supply block decode circuit shown in FIG. 47A will be now described with reference to the signal waveform diagram shown in FIG. 47B.

In the normal mode, when array activation signal RACT is activated, row address signal RA is defined. After row address signal RA is defined, the output signal of NAND circuit 75 attains an H or L level in response to row address bits RA1 to RA3 and /RA1 to /RA3, because self-refresh mode instruction signal /SR is at an H level in the normal mode. The output signal of NAND circuit 76 is at an H level in the normal mode, and therefore power supply block selecting signal φBj is driven into a selected/non-selected state based on the output signal of NAND circuit 75.

Meanwhile, in the self-refresh mode, self-refresh mode instruction signal /SR attains an L level, and the output signal of NAND circuit 75 is set to an H level. Self-refresh mode instruction signal is at an H level. In the self-refresh mode, when refresh cycle activation signal QACT is driven into an H level of active state, refresh address signal QA is defined. A spare determination is made according to this refresh address signal QA, and spare hit signal /HIT is driven into an H or L level. At the time of a spare hit, spare hit signal /HIT attains an L level, the output signal of NAND circuit 76 attains an H level, and power supply block selecting signal φBj maintains its L level. Meanwhile, if the result of spare determination indicates a spare miss, spare hit signal /HIT maintains its H level. Therefore, power supply block selecting signal φBj is driven into a selected/non-selected state according to the output signal of NAND circuit 74.

In the configuration shown in FIG. 47A, in order to prevent power supply block selecting signal φBj from being driven into a selected state according to the output signal of NAND circuit 74 before the spare determination result is decided, spare hit signal HIT may be provided as an input to NAND circuit 74.

Modification 1

Figure 48:
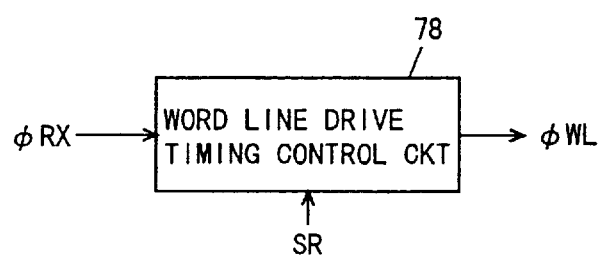
FIG. 48 is a schematic diagram of a modification of hierarchical power supply arrangement 1 according to the seventh embodiment.

FIG. 48 is a diagram showing a modification of hierarchical power supply arrangement 1. In the arrangement shown in FIG. 48, word line driving timing control circuit 78 changes the activation timing of word line driving signal AWL according to self-refresh mode instruction signal SR. Word line driving timing control circuit 78 generates word line driving signal φWL in the normal mode according to word line activation signal φRX. Meanwhile, in the self refresh mode, this word line driving signal φWL is generated by delaying word line activation signal φRX. The configuration of word line driving timing control circuit 78 is the same as the configuration shown in FIG. 29. Even if the activation timing of power supply block selecting signal φBi is delayed, the word line selecting timing can be delayed accordingly using word line driving timing control circuit 78 and therefore a word line can be accurately selected. Word line driving signal φWL determines the activation timings of both a spare word line and a normal word line.

Modification 2

Figure 49:
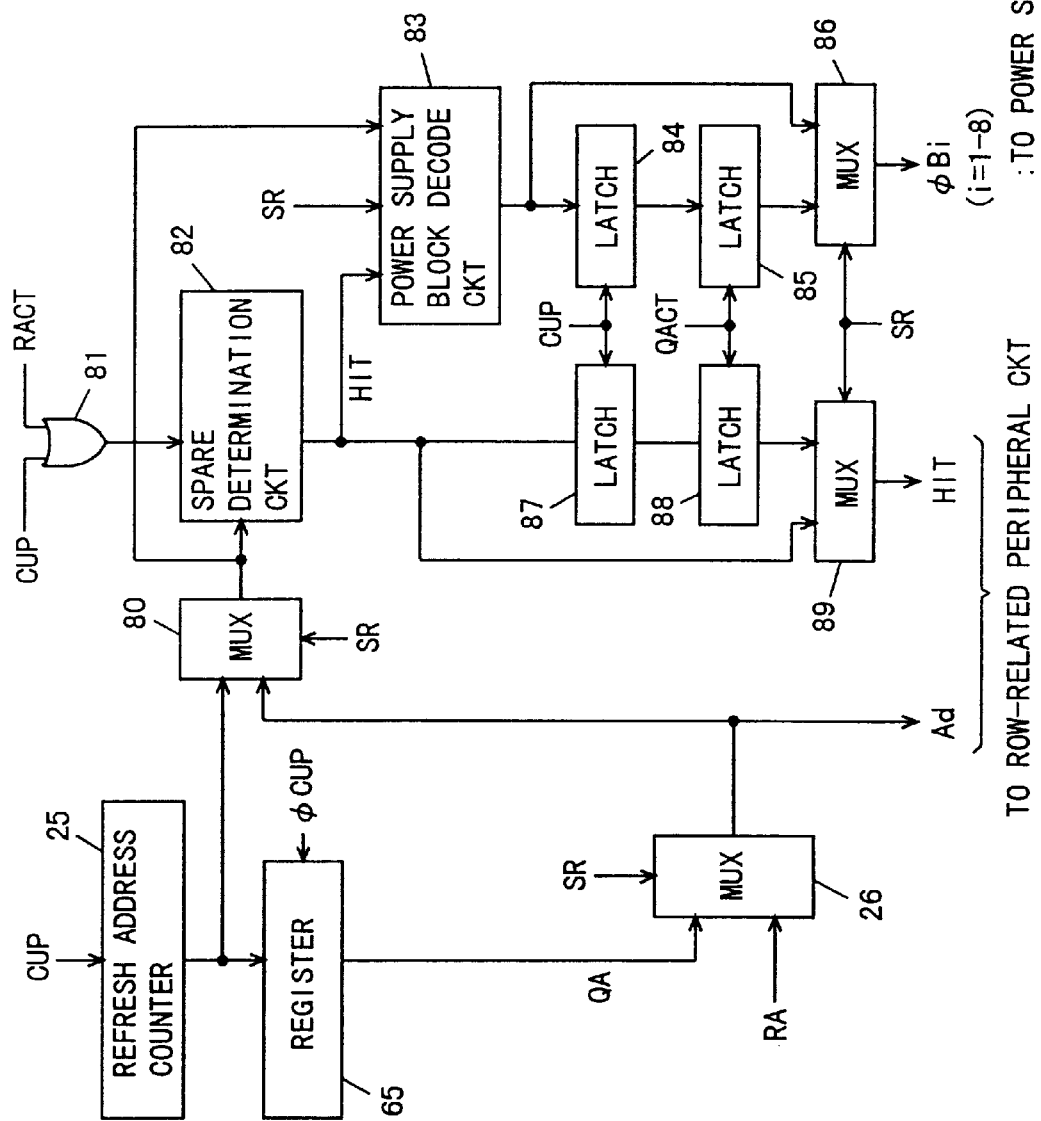
FIG. 49 is a schematic diagram of a control portion in hierarchical power supply arrangement 2 according to the seventh embodiment.

FIG. 49 is a diagram showing a second modification of hierarchical power supply arrangement 1 according to the seventh embodiment. FIG. 49 shows the configuration of a power supply block selecting signal generating portion. In FIG. 49, the power supply block selecting signal generating portion includes a multiplexer 80 which responds to self-refresh mode instruction signal SR to select one of a self-refresh address from refresh address counter 25 and internal row address signal RA from multiplexer 26, an OR circuit 81 which receives array activation signal RACT and count up instruction signal CUP, a spare determining circuit 82 which responds to an activation of the output signal of OR circuit 81 to make a spare determination for an address signal applied from multiplexer 80, a power supply block decode circuit 83 which decodes a power supply block address signal according to an address signal and self-refresh mode instruction signal SR from multiplexer 80 and a spare hit signal HIT from spare hit determining circuit 82, a latch 84 which latches a power supply block selecting signal output from power supply decode circuit 83 according to count up instruction signal CUP, a latch 85 which responds to refresh cycle activation signal QACT to take a latch signal from latch 84, and a multiplexer (MUX) 86 which selects one of the output signals of latch 85 and power supply block decode circuit 83.

The power supply block decode circuit 83 is the same in configuration as those in FIGS. 46A and 47A, and generates power supply block selecting signal φBi according to self-refresh mode instruction signal SR, spare hit signal HIT and row address signal RA or QA. Latch 84 or 85 has the same configuration as that in FIG. 38, latch 84 takes and latches the output signal of power supply block decode circuit 83 when count up instruction signal CUP is active, and latch 85 takes and latches the output signal of latch 84 when refresh cycle activation signal QACT is inactive and then outputs the latched signal.

Multiplexer 86 selects the output signal of latch 85 for output in the self-refresh mode, and selects the output signal of power supply decode circuit 83 in the normal mode. Power supply block selecting signal φBi from multiplexer 86 is applied to the power supply switch circuit.

The power supply block selecting signal generating circuit further includes a latch 87 which latches spare hit signal HIT output by spare hit determining circuit 82 according to count up instruction signal CUP, a latch 88 which takes and transfers the output signal of latch 87 according to refresh cycle activation signal QACT, and a multiplexer (MUX) 89 which selects one of spare hit signal HIT output from spare determining circuit 82 and a signal output from latch 88. Latches 87 and 88 have the same configuration as latches 84 and 85.

Multiplexer 26 selects refresh address signal QA from register 65 in the self-refresh mode, and selects externally applied row address signal RA in the normal mode. Refresh address counter 25 and register 65 have the same configuration as that in FIG. 36.

In the configuration shown in FIG. 49, spare determining operation and power supply block decoding operation to be performed in a next cycle are performed in a refresh cycle preceding by one cycle. The results of determining and decoding are output in the next refresh cycle. Therefore, the decoding operation has been completed in the previous cycle, power supply block selecting signal φBi and spare hit signal HIT can be driven into a selected/non-selected state at a high speed in the next refresh cycle. Thus, the configuration of the word line driving control portion can be simplified because of no need to delay the word line selecting timing in the refresh cycle.

In the normal mode, multiplexer 80 selects internal address signal Ad from multiplexer 26 for application to power supply block decode circuit 83 in spare determining circuit 82. Spare hit signal HIT output from spare determining circuit 82 is selected by multiplexer 89 for output, and a power supply block selecting signal output from power supply block decode circuit 83 is selected by multiplexer 86 for output. Latches 84, 85, 87 and 88 are bypassed in this normal mode. If an array activation signal is activated, spare determining circuit 82 performs a determining operation and spare hit signal HIT is generated according to the result of determination. In the normal mode, power supply block decode circuit 83 decodes an address signal from multiplexer 80 regardless of this spare hit signal HIT, and drives a power supply block selecting signal to memory block MAB1 including a spare block and a addressed memory block into a selected state.

By using the configuration shown in FIG. 49, the power consumption in the self-refresh mode can be reduced without increasing the accessing time in the normal mode.

As described above, by the hierarchical power supply arrangement according to the seventh embodiment of the present invention, in the normal mode, a memory block including a spare block and an addressed memory block are driven into a selected state regardless of the spare determination result, while in the refresh mode, the power supply switch circuit to an addressed memory block is driven into a selected state, so that in the normal mode, a voltage from the power supply switch circuit can be stably supplied before the spare determination result is defined to enable high-speed accessing, while in the refresh mode, a prescribed voltage is supplied only to minimum necessary memory blocks, resulting in reduced power consumption.

Hierarchical Power Supply Arrangement 2

Figure 50A:
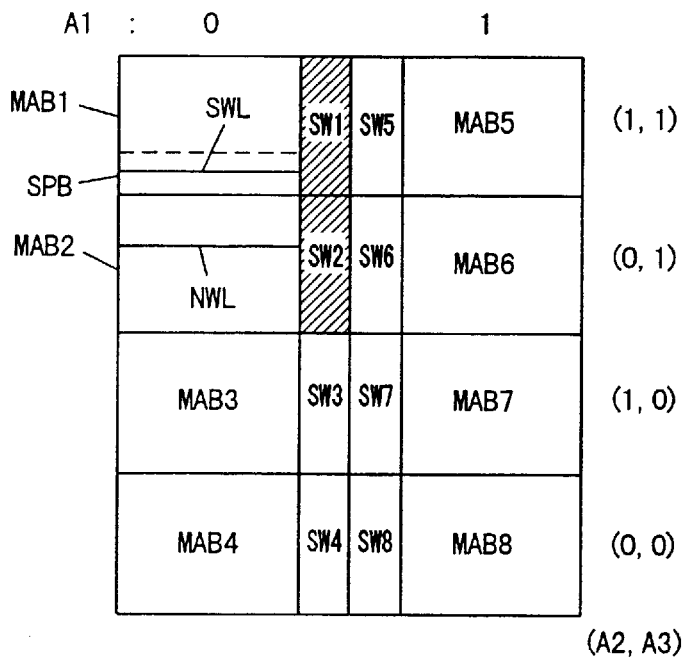
FIGS. 50A and 50B are schematic diagrams showing the selected state of power supply switch circuits in hierarchical power supply arrangement 2 according to the seventh embodiment.
Figure 50B:
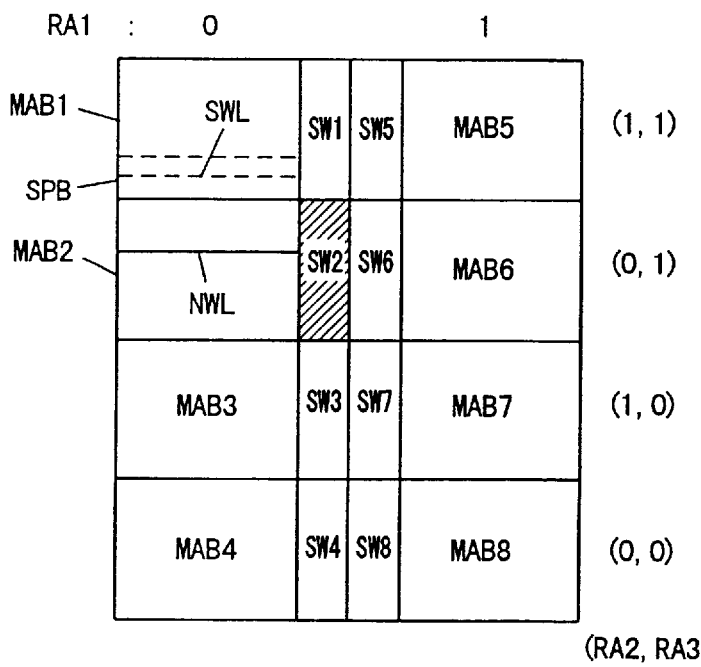

FIGS. 50A and 50B illustrate the operation of a hierarchical power supply arrangement 2 according to the seventh embodiment of the present invention. In FIG. 50A, in the normal mode, power supply switch circuits for both memory block MAB1 including spare block SPB and an addressed memory block are driven into a selected state in response to an activation of an array activation signal. In FIG. 50A, memory block MAB2 is addressed. When array activation signal RACT is activated and an active cycle is started, memory block MAB1 including a spare block and addressed memory block MAB2 are driven into a selected state, so that a prescribed voltage can be supplied at a high speed with no wait for the result of spare determination.

As shown in FIG. 50B, when a spare determination result is defined, according to the defined result, only the power supply switch circuit for the memory block including a memory cell to be selected is driven into a selected state. In FIG. 50B, normal word line NWL in memory block MAB2 is driven into a selected state, and power supply switch circuit SW2 is held in a selected state, while power supply switch circuit SW1 for memory block MAB1 is driven into a non-selected state. After the determination result, normal word line NWL is driven into a selected state. Therefore, when the selected normal word line is driven, a voltage is supplied stably from power supply switch circuit SW2 and the selected normal word line can be driven into a selected state accurately and at a high speed. In addition, since memory block MAB1 is held in a non-selected state, power supply switch circuit SW1 can be driven into a non-selected state, which can reduce the current consumption.

In the refresh mode, as shown in FIG. 44, only the power supply switch circuit for a memory block including a memory cell to be selected is driven into a selected state and the other power supply switch circuits are held in a non-selected state. Thus, the current consumption in the refresh cycle can be reduced.

Figure 51A:
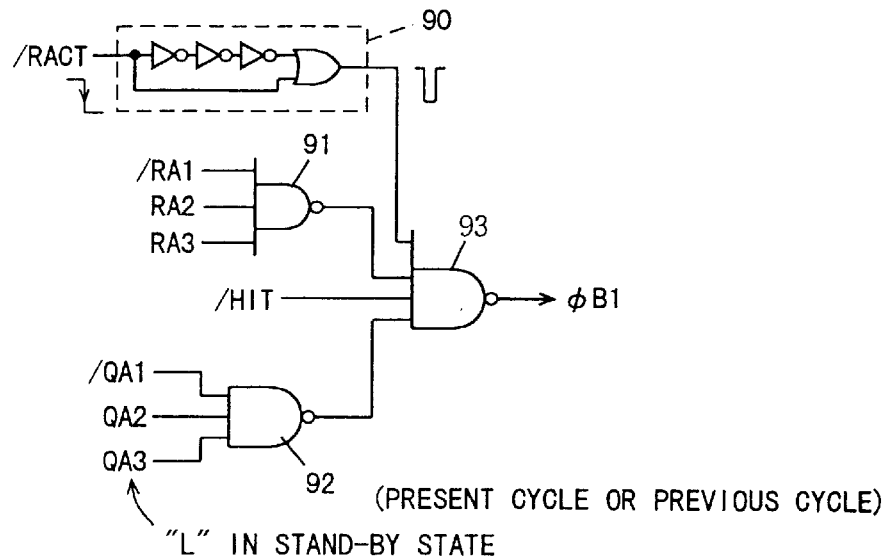
FIG. 51A is a diagram of the power supply block decode circuit in hierarchical power supply arrangement 2 according to the seventh embodiment.

FIG. 51A is a diagram showing a power supply block decode circuit for power supply block selecting signal $\phi B1$. In FIG. 51A, the power supply block decode circuit includes a one-shot pulse generating circuit 90 which generates an L level, one-shot pulse signal in response to a falling of array activation signal /RACT, an NAND circuit 91 which receives row address bits /RA1, RA2 and RA3, an NAND circuit 92 which receives refresh address bits /QA1, QA2 and QA3, and an NAND circuit 93 which receives the output signal of one-shot pulse generating circuit 90, the output signals of NAND circuits 91 and 92 and spare hit signal /HIT to output power supply block selecting signal $\phi B1$.

Figure 51B:
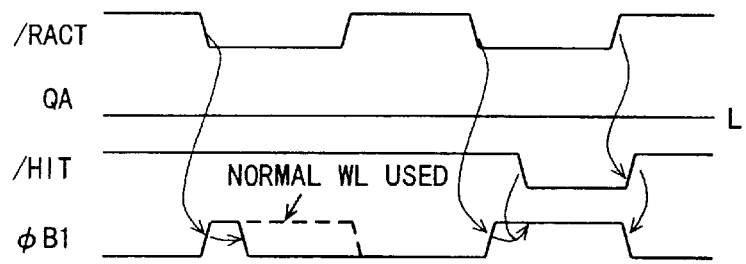
FIG. 51B is a waveform diagram representing the operation of the circuit of FIG. 51A.

Address bits /RA1, RA2, RA3, /QA1, QA2 and QA3 are at an L level in a stand-by state. The operation of the power supply block decode circuit shown in FIG. 51A will be described in conjunction with the signal waveform diagram in FIG. 51B.

When an active cycle is started, array activation signal /RACT falls to an L level. In response to the falling of array activation signal /RACT, one-shot pulse generating circuit 90 generates a one-shot pulse which is at an L level for a prescribed period. Power supply block selecting signal $\phi B1$ output from NAND circuit 93 rises to an H level accordingly. Meanwhile, NAND circuit 91 decodes applied address bits /RA1, RA2 and RA3. When memory block MAB1 is addressed, the output signal of NAND circuit 91 once again attains an L level, power supply block selecting signal $\phi B1$ output from NAND circuit 93 is driven into an H level. In this state, regardless of whether a spare word line is used or not, power supply block selecting signal $\phi B1$ is at an H level during this active cycle period.

Meanwhile, if a memory block different from memory block MAB1 is addressed, the output signal of NAND circuit 91 attains an H level. In this state, spare hit signal HIT is driven into an H or L level according to the result of spare determination before the output signal of one-shot pulse generating circuit 90 rises to an H level. If a normal word line is used, spare hit signal /HIT is maintained at an H level. Therefore, in this state, in response to a rising of the output signal of one-shot pulse generating circuit 90, power supply block selecting signal $\phi B1$ falls to an L level. In this addressed memory block, a row is selected.

If the output signal of NAND circuit 91 is at an H level, and any of the other memory blocks is addressed, power supply block selecting signal $\phi B1$ maintains its H level in response to a falling of spare hit signal /HIT to an L level. The pulse width of a pulse signal output from one-shot pulse generating circuit 90 is set to the time width required for spare hit signal /HIT being defined, so that power supply block selecting signal $\phi B1$ can be driven into a selected/non-selected state based on the use/nonuse of corresponding memory block MAB1.

Figure 52:
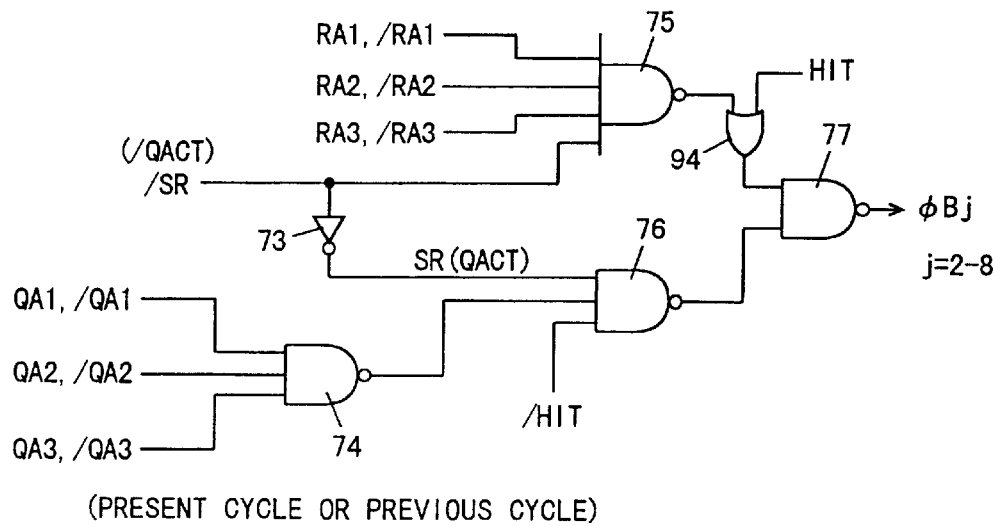
FIG. 52 is a diagram of the power supply block decoder in hierarchical power supply arrangement 2 according to the seventh embodiment.
Figure 53:
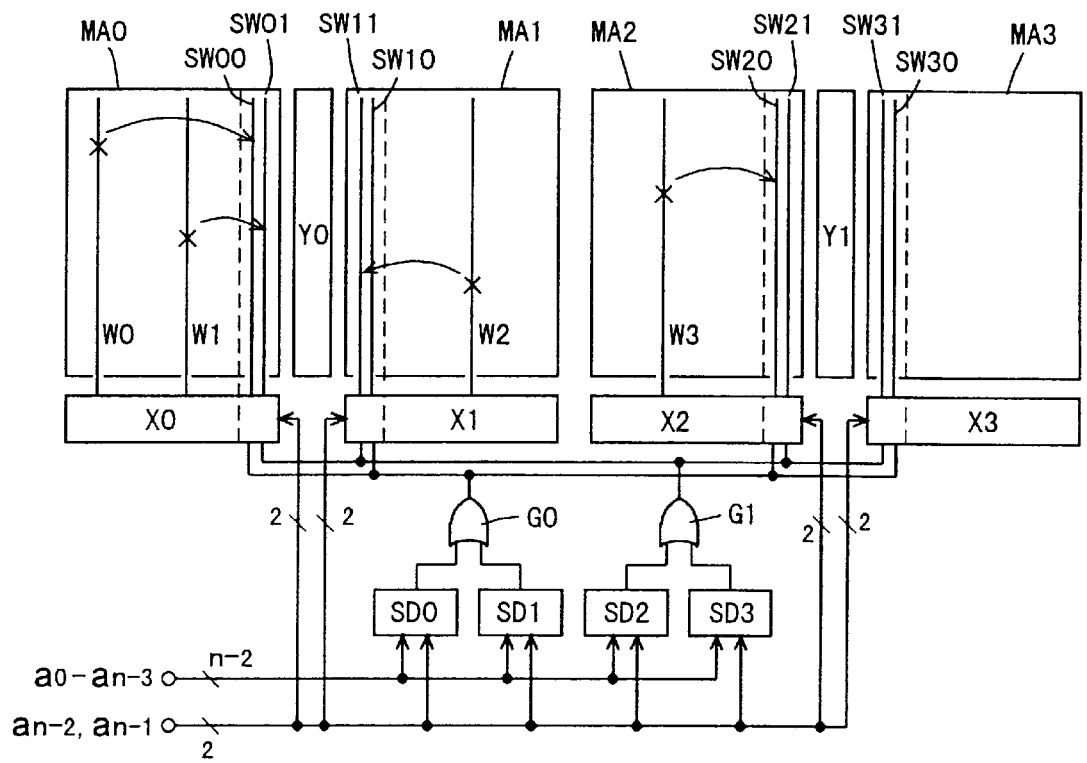
FIG. 53 is a schematic diagram of an array portion in a semiconductor memory device with a conventional flexible row redundancy arrangement.
Figure 54:
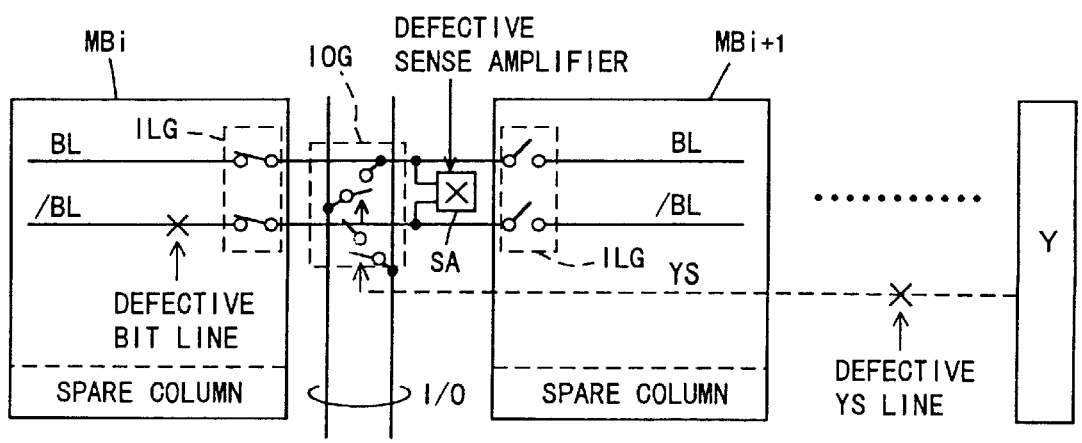
FIG. 54 is a schematic diagram of an array portion in a conventional flexible column redundancy arrangement.
Figure 55:
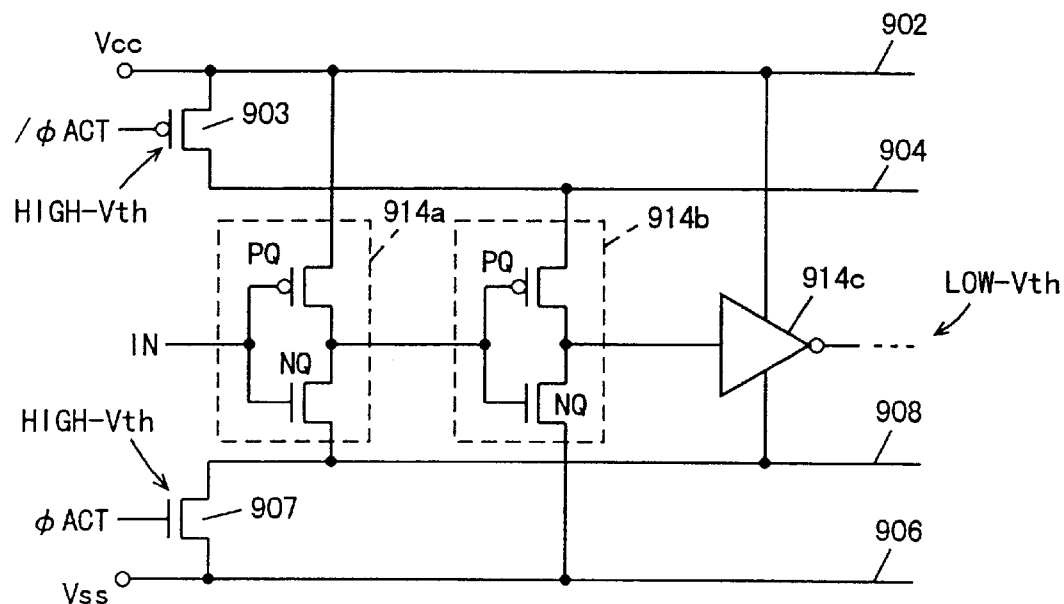
FIG. 55 is a diagram of an example of a conventional hierarchical power supply arrangement.
Figure 56:
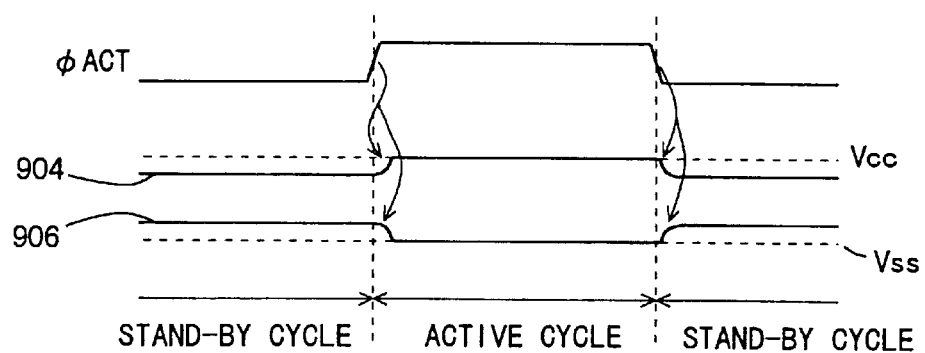
FIG. 56 is a waveform diagram representing the operation of the hierarchical power supply arrangement shown in FIG. 55.

FIG. 52 is a diagram showing a power supply block decode circuit for power supply block selecting signal $\phi Bj$ (j=2 to 8). The power supply block decode circuit shown in FIG. 52 is different from the power supply block decode circuit shown in FIG. 47A in the following point. More specifically, an OR circuit 94 to receive the output signal of NAND circuit 75 and spare hit signal HIT is provided between NAND circuits 75 and 77. The other configuration is the same as that in FIG. 47A and corresponding portions are denoted by the same reference numerals and the description is not provided.

In the configuration of the power supply block decode circuit shown in FIG. 52, when an active cycle is started according to address bits RA1 to RA3 and /RA1 to /RA3, power supply block selecting signal $\phi Bi$ is driven into a selected/non-selected state. When spare hit signal HIT is at an L level, power supply block selecting signal $\phi B1$ is maintained in a state according to address bits RA1 to RA3 and /RA1 to /RA3 during the active cycle period. Meanwhile, when spare hit signal HIT is driven into an H level, the output signal of OR circuit 94 attains an H level. In the normal mode, NAND circuit 76 is at an H level. Therefore, in response to a rising of spare hit signal HIT, power supply block selecting signal $\phi Bj$ falls to an L level. Thus, when a spare word line is used, only the power supply switch circuit for a memory block including a spare block is driven into a selected state, and the power supply switch circuit for the memory block including this addressed defective normal word line is driven into a non-selected state.

Figure 46B:
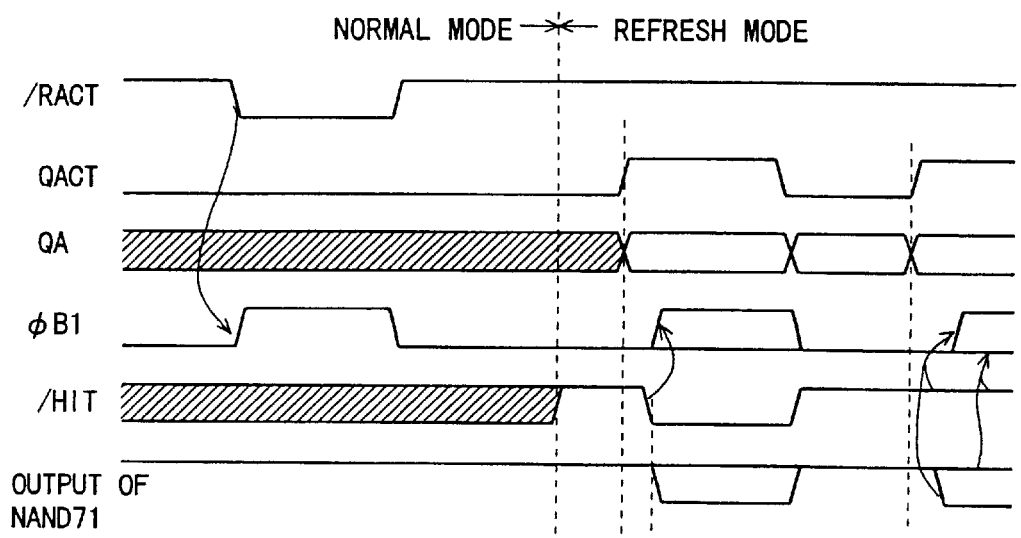
FIG. 46B is a signal waveform diagram representing the operation of the power supply block decode circuit shown in FIG. 46A.
Figure 47B:
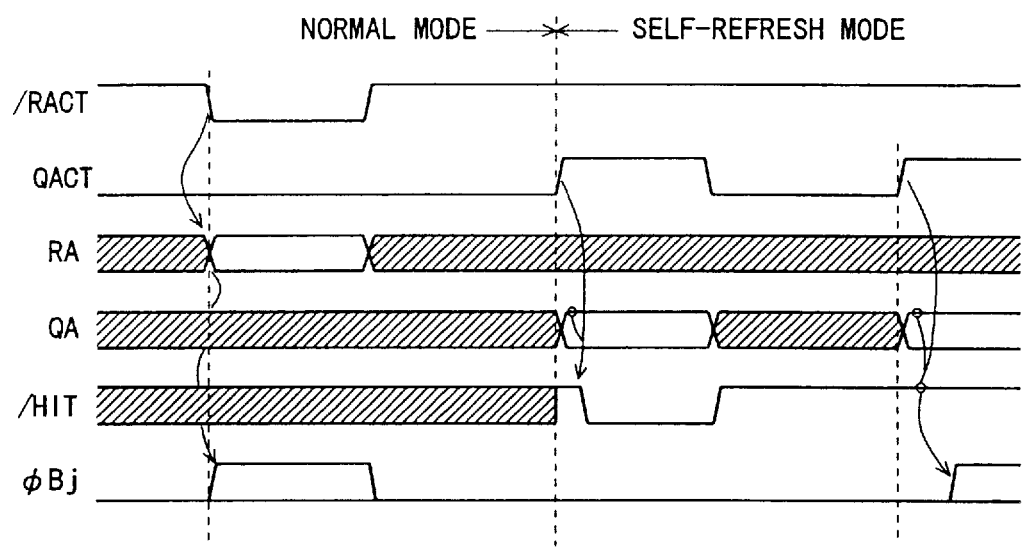
FIG. 47B is a signal waveform diagram representing the operation of the power supply block decoder shown in FIG. 47A.

Note that the operation of the power supply block decode circuit in FIGS. 51A and 52 is the same as the operation of the power supply block decode circuit in FIGS. 46A and 47A, and therefore their operation waveforms are the same as those given in FIGS. 46B and 47B. More specifically, in the refresh cycle, only the power supply switch circuit for a memory block including a memory cell to be driven is driven into a selected state.

Note that the circuit configuration shown in FIG. 49 can be applied to the configuration of the power supply block decode circuit shown in FIGS. 51 and 52. More specifically, in the refresh mode, based on a refresh address signal from the refresh address counter in the previous cycle, the selected/non-selected state of the power supply block selecting signal in the next cycle can be determined.

As in the foregoing, according to the seventh embodiment, in the normal mode, an addressed block is driven into a selected state, then only a power supply switch circuit for the memory block including a memory cell row to be selected is held in a selected state, and therefore the current consumption in the active cycle can be reduced. Furthermore, simultaneously with the start of an active cycle, a power supply switch circuit corresponding to a memory block including an addressed block and a memory block including a spare block are driven into a selected state, so that the accessing time can be prevented from being increased.

In the foregoing, memory blocks including spare word lines have been described. However, this hierarchical power supply arrangement is applicable to the configuration for repairing a spare column.

In the above described seventh embodiment, the memory block including a spare block is one in number, but this hierarchical power supply arrangement according to the seventh embodiment is applicable to the previously described first to fifth embodiments. The repeating circuit may be a sense amplifier to sense and amplify memory cell data.

As in the foregoing, according to the present invention, since spare lines can replace normal lines in a plurality of memory blocks, the spare lines can be efficiently used, and since the flexible redundancy scheme is utilized, the number of spare decoders can be reduced and the array area can be restrained from increasing.

Furthermore, a power supply switch circuit is provided for each of memory blocks, and the number of power supply switch circuits driven into a selected state is changed between the normal mode and refresh mode, the accessing time is not increased, while the current consumption can be reduced. In the arrangement including a spare block, a power supply switch circuit for the memory block including the spare block is always driven into a selected state in response to the start of an active cycle, and therefore a prescribed voltage can be supplied from the power supply switch circuit to the spare block with no wait for a spare determination result, so that the accessing time can be restrained from increasing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of first memory blocks each having a plurality of normal memory cells arranged in a matrix of rows and columns;
   a plurality of second memory blocks provided alternately with said plurality of first memory blocks along a column direction, each having a plurality of normal memory cells arranged in a matrix of rows and columns;
   a plurality of third memory blocks each having a plurality of normal memory cells arranged in a matrix of rows and columns;
   a plurality of fourth memory blocks provided alternately with said plurality of third memory blocks in the column direction each having a plurality of normal memory cells;
   a first spare array having a plurality of spare memory cells arranged in a matrix of rows and columns in a particular one of said plurality of first memory blocks, each row of those spare memory cells being capable of replacing a defective row including a defective memory cell in the third memory blocks;
   a second spare array having a plurality of spare memory cells arranged in a matrix of rows and columns in a particular one of said second memory blocks, each row of those spare memory cells being capable of replacing a defective row including a defective normal memory cell in said plurality of fourth memory blocks;
   a third spare array having a plurality of spare memory cells arranged in a matrix of rows and columns in a particular one of said third memory blocks, each row of those spare memory cells being capable of replacing a defective row including a defective memory cell in said plurality of first memory blocks;
   a fourth spare array having a plurality of spare memory cells arranged in a matrix of rows and columns in a particular one of said plurality of fourth memory block, each row of those spare memory cells being capable of replacing a defective row including a defective memory cell in said plurality of second memory blocks; and
   control circuitry for selectively driving one of the first to fourth memory blocks into a selected state in a normal operation mode, and selecting one of first and second memory blocks and one of the third and fourth memory blocks to drive selected memory blocks into a selected state in a particular operation mode.

2. The semiconductor memory device as recited in claim 1, further comprising a plurality of sense amplifier bands provided one between each of said plurality of first memory blocks and each of said plurality of second memory blocks and one between each of said plurality of third memory blocks and each of said plurality of fourth memory blocks, shared between adjacent memory blocks in the column direction, and activated when a corresponding memory block is driven into a selected state, for sensing and amplifying data in each column of the corresponding memory block.

3. The semiconductor memory device as recited in claim 1, wherein
   said control circuitry selects and drives a memory block of said plurality of third memory blocks when a memory block of said plurality of first memory blocks is selected in said particular operation mode.

* * * * *